United States Patent
Chae et al.

(10) Patent No.: US 9,947,849 B2
(45) Date of Patent: Apr. 17, 2018

(54) LIGHT EMITTING DEVICE

(71) Applicant: Seoul Viosys Co., Ltd., Ansan-si (KR)

(72) Inventors: Jong Hyeon Chae, Ansan-si (KR);
Chang Yeon Kim, Ansan-si (KR);
Sung Su Son, Ansan-si (KR); Dae Woong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/380,982

(22) Filed: Dec. 15, 2016

(65) Prior Publication Data

US 2017/0098747 A1  Apr. 6, 2017

Related U.S. Application Data

(63) Continuation of application No. 14/748,149, filed on Jun. 23, 2015, now Pat. No. 9,543,488.

(30) Foreign Application Priority Data

Jun. 23, 2014 (KR) .................. 10-2014-0076410
Jul. 31, 2014 (KR) .................. 10-2014-0098363
Jan. 27, 2015 (KR) .................. 10-2015-0012864
May 29, 2015 (KR) .................. 10-2015-0076527

(51) Int. Cl.
*H01L 33/62* (2010.01)
*H01L 33/46* (2010.01)
*H01L 33/38* (2010.01)

(52) U.S. Cl.
CPC .............. *H01L 33/62* (2013.01); *H01L 33/38* (2013.01); *H01L 33/46* (2013.01)

(58) Field of Classification Search
None
See application file for complete search history.

(56) References Cited

U.S. PATENT DOCUMENTS

| 2011/0163346 | A1 | 7/2011 | Seo et al. |
| 2012/0241760 | A1 | 9/2012 | Okabe |
| 2012/0326117 | A1* | 12/2012 | Tanaka ............. H01L 33/38 257/13 |
| 2014/0225142 | A1 | 8/2014 | Katsuno et al. |
| 2014/0361243 | A1 | 12/2014 | Choi |

FOREIGN PATENT DOCUMENTS

WO  2015001446  1/2015

* cited by examiner

*Primary Examiner* — Whitney T Moore
(74) *Attorney, Agent, or Firm* — Perkins Coie LLP

(57) ABSTRACT

Disclosed herein is a light emitting device manufactured by separating a growth substrate in a wafer level. The light emitting device includes: a base; a light emitting structure disposed on the base; and a plurality of second contact electrodes disposed between the base and the light emitting structure, wherein the base includes at least two bulk electrodes electrically connected to the light emitting structure and an insulation support disposed between the bulk electrodes and enclosing the bulk electrodes, the insulation support and the bulk electrodes each including concave parts and convex parts engaged with each other on surfaces facing each other, and the convex parts including a section in which a width thereof is changed in a protrusion direction.

20 Claims, 42 Drawing Sheets

(a)

(b)

(a)

(b)

(a)

(b)

(a)

(b)

(a)

(b)

(a)

(b)

(a)

(b)

FIG. 18(a)
FIG. 18(b)
FIG. 18(c)
FIG. 18(d)
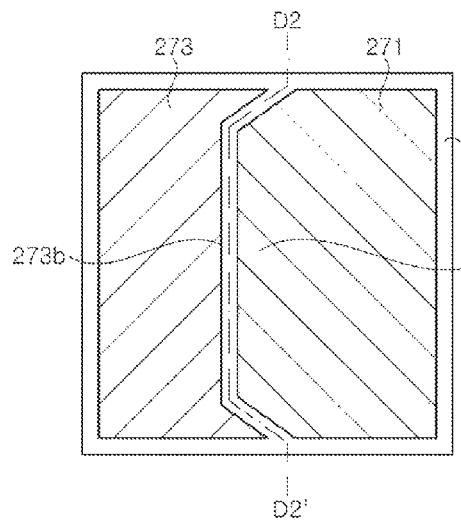
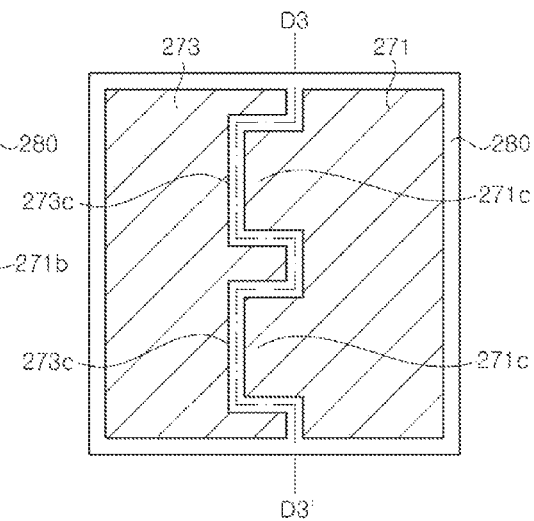
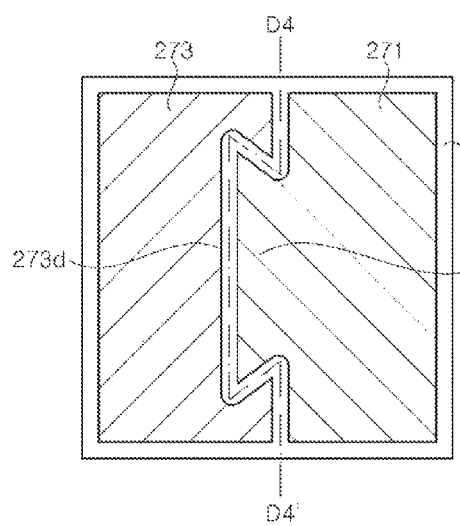
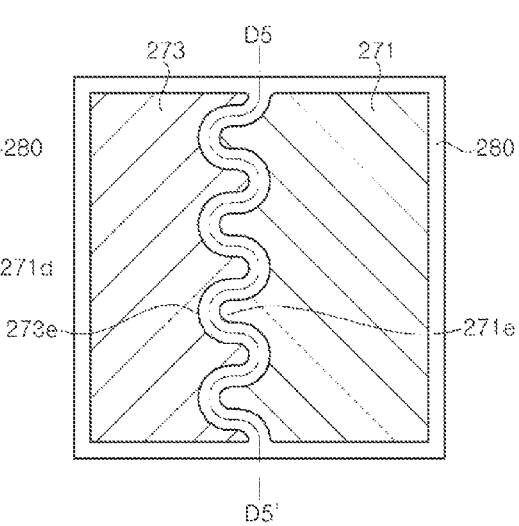

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(c)

LIGHT EMITTING DEVICE

PRIORITY CLAIMS AND CROSS-REFERENCE TO RELATED APPLICATION

This patent document is a continuation of, and claims priority and benefits of U.S. patent application Ser. No. 14/748,149, filed on Jun. 23, 2015, which claims priorities and benefits of Korean Patent Application No. 10-2014-0076410, filed on Jun. 23, 2014, Korean Patent Application No. 10-2014-0098363, filed on Jul. 31, 2014, Korean Patent Application No. 10-2015-0012864, filed on Jan. 27, 2015, and Korean Patent Application No. 10-2015-0076527, filed on May 29, 2015, the contents of which are incorporated by reference herein in its entirety.

TECHNICAL FIELD

The disclosure of this patent document relates to a light emitting device. Some implementations of the disclosed technology relate to the light emitting device manufactured by separating a growth substrate in a wafer level.

BACKGROUND

A light emitting device, which is an inorganic semiconductor device emitting light by recombination between electrons and holes, has been recently used in several fields such as a display, a vehicle lamp, a general illuminating device, and the like.

Recently, in accordance with an increase in a demand for a small high output light emitting device, a demand for a large-area flip-chip type light emitting device having excellent heat radiation efficiency has increased. Electrodes of the flip-chip type light emitting device are directly bonded to a secondary substrate, and a wire for supplying external power to the flip-chip type light emitting device is not used, such that the flip-chip type light emitting device has heat radiation efficiency significantly higher than that of a horizontal type light emitting device. Therefore, even though a high density current is applied, heat can be effectively conducted to the secondary substrate, such that the flip-chip type light emitting device is appropriate for a high output light source.

SUMMARY

Exemplary embodiments of the present disclosure provide a light emitting device capable of having improved light efficiency and heat radiation efficiency by separating a growth substrate.

Exemplary embodiments of the present disclosure provide a light emitting device including a support member on which pads are formed while substituting for a secondary substrate in a wafer level.

Exemplary embodiments of the present disclosure provide a light emitting device capable of improving a heat radiation effect and preventing a short circuit between pads by securing widths of the pads as wide as possible.

Exemplary embodiments of the present disclosure provide a light emitting device capable of being directly mounted on a printed circuit board, or the like, using a solder paste by preventing diffusion of a metallic element in the solder paste.

Exemplary embodiments of the present disclosure provide a light emitting device capable of decreasing the possibility of a failure by having excellent mechanical stability.

According to one aspect of the present disclosure, there is provided a light emitting device including: a light emitting structure including a first conductive type semiconductor layer, a second conductive type semiconductor layer, and an active layer disposed between the first conductive type semiconductor layer and the second conductive type semiconductor layer; first and second contact electrodes disposed on or over the light emitting structure, each ohmic-contacting the first and second conductive type semiconductor layers; an insulating layer insulating the first and second contact electrodes from each other and at least partially covering the first and second contact electrodes; a stress buffering layer disposed on or over the insulating layer; first and second bulk electrodes disposed on or over the light emitting structure and the stress buffering layer, the first and second bulk electrodes electrically connected to the first and second contact electrodes; and an insulation support covering side surfaces of the first and second bulk electrodes and at least partially exposing upper surfaces of the first and second bulk electrodes, wherein the first bulk electrode includes a protrusion part protruding from a side surface of the first bulk electrode toward the second bulk electrode, and the second bulk electrode includes a concave part depressed from a side surface of the second bulk electrode.

In some implementations, the protrusion part can be engaged with the concave part.

In some implementations, the protrusion part has a varying width from the side surface of the first bulk electrode to a surface of the protrusion part.

In some implementations, the concave part has a varying width from the side surface of the second bulk electrode to a surface of the concave part.

In some implementations, the first bulk electrode includes one or more additional protrusion part and the second bulk electrode includes one or more additional concave parts, and the one or more additional protrusion parts are engaged with the one or more additional concave parts.

In some implementations, the insulating layer can include first and second insulating layers, the first insulating layer can partially cover the second contact electrode and include first and second opening parts each partially exposing the first conductive type semiconductor layer and the second contact electrode, the first contact electrode can partially cover the first insulating layer, and the second insulating layer can partially cover the first contact electrode and includes third and fourth opening parts each partially exposing the first and second contact electrodes.

In some implementations, the light emitting device can further include a connecting electrode disposed between the second contact electrode and the second bulk electrode, wherein the connecting electrode includes the same material as that of the first contact electrode.

In some implementations, a portion of the first insulating layer can be interposed between the first and second contact electrodes.

In some implementations, the light emitting device can further include a connecting electrode disposed on or over the second contact electrode, wherein the insulating layer includes first and second opening parts each exposing the first contact electrode and the connecting electrode.

In some implementations, the light emitting structure is disposed to partially expose the first conductive type semiconductor layer, and the first contact electrode can be disposed over the exposed first conductive type semiconductor layer.

In some implementations, the light emitting structure is disposed to form a plurality of holes partially exposing the first conductive type semiconductor layer, and the first contact electrode can be electrically connected to the first conductive type semiconductor layer through the plurality of holes.

In some implementations, the light emitting device can further include first and second pad electrodes disposed on or over the first and second bulk electrodes, respectively, wherein the insulation support covers portions of the upper surfaces of the first and second bulk electrodes and surrounds side surfaces of the first and second pad electrodes.

In some implementations, the first pad electrode cannot be disposed on or over the protrusion part.

In some implementations, the first and second pad electrodes can have substantially the same surface area.

In some implementations, the light emitting device can further include a wavelength converting unit disposed on or over a lower surface of the light emitting structure.

In some implementations, the first and second bulk electrodes are spaced by a substantially constant distance.

In some implementations, the first bulk electrode has an area greater than that of the second bulk electrode.

In some implementations, the first bulk electrode can include additional protrusion part protruding from the protrusion part, and the second bulk electrode can include additional concave part depressed from the concave part.

In some implementations, the additional protrusion part overlaps with a central portion of the light emitting device in a vertical direction.

In some implementations, the additional protrusion part has a shape including at least a portion of a polygon, a circle, or an ellipse having an inscribed circle having center located at a central portion of the light emitting device and diameter of about 50 μm or more.

According to another aspect of the present disclosure, there is provided a light emitting device including: a light emitting structure including a first conductive type semiconductor layer, a second conductive type semiconductor layer, and an active layer disposed between the first conductive type semiconductor layer and the second conductive type semiconductor layer; first and second contact electrodes disposed on or over the light emitting structure, the first and second contact electrodes ohmic-contacting the first and second conductive type semiconductor layers; an insulating layer insulating the first and second contact electrodes from each other and at least partially covering the first and second contact electrodes; first and second bulk electrodes disposed on or over the light emitting structure and the insulating layer, the first and second bulk electrodes electrically connected to the first and second contact electrodes; and an insulation support covering side surfaces of the first and second bulk electrodes and at least partially exposing upper surfaces of the first and second bulk electrodes, wherein the first and the second bluk electrodes are arranged to face each other and form a virtual line along a spaced region between the first and second bulk electrodes, the virtual line having a bending portion, and the first bulk electrode has an area greater than that of the second bulk electrode.

In some implementations, a starting point and an ending point of the virtual line can be disposed on or over the same line.

According to still another aspect of the present disclosure, there is provided a light emitting device including: a light emitting structure including a first conductive type semiconductor layer, a second conductive type semiconductor layer, and an active layer disposed between the first conductive type semiconductor layer and the second conductive type semiconductor layer; first and second contact electrodes disposed on or over the light emitting structure, the first and second contact electrodes ohmic-contacting the first and second conductive type semiconductor layers; an insulating layer insulating the first and second contact electrodes from each other and at least partially covering the first and second contact electrodes; first and second bulk electrodes disposed on or over the insulating layer, the first and second bulk electrodes electrically connected to the first and second contact electrodes, respectively; and an insulation support covering side surfaces of the first and second bulk electrodes and at least partially exposing upper surfaces of the first and second bulk electrodes, wherein the first bulk electrode includes a first protrusion part protruding from a side surface of the first bulk electrode toward the second bulk electrode and a second protrusion part protruding from the first protrusion part, the second bulk electrode includes a first concave part depressed from a side surface of the second bulk electrode and a second concave part further depressed from the first concave part, and the second protrusion part is shaped to include at least a portion of a polygon, a circle, or an ellipse having an inscribed circle with a center located at a central portion of the light emitting device.

BRIEF DESCRIPTION OF DRAWINGS

FIGS. 18(a) to 18(d) are plan views of exemplary light emitting devices according to some embodiments.

DETAILED DESCRIPTION

Figure 1:
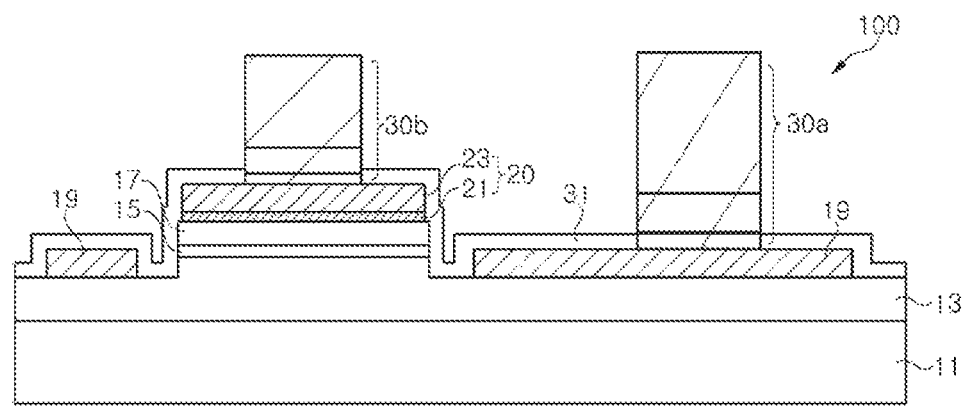
FIG. 1 is a cross-sectional view of a light emitting device according to the related art.

Hereinafter, exemplary embodiments of the disclosed technology will be described in detail with reference to the accompanying drawings. Exemplary embodiments to be provided below are provided by way of example to facilitate the understanding of exemplary implementations of the disclosed technology. Therefore, the disclosed technology is not limited to exemplary embodiments to be described below, but can be implemented in other forms. In addition, in the accompanying drawings, widths, lengths, thicknesses, and the like, of components can be exaggerated for convenience. In addition, it will be understood that when one component is referred to as being "on", "over" or "above" another component, one component can be "directly on", "directly over" or "directly above" another component or can have the other component interposed therebetween. Like reference numerals denote like components throughout the present specification.

FIG. 1 illustrates a flip-chip type light emitting device according to the related art. The flip-chip type light emitting device 100 according to the related art as illustrated in FIG. 1 can include a growth substrate 11, a first conductive type semiconductor layer 13, an active layer 15, a second conductive type semiconductor layer 17, a first electrode 19, a second electrode 20, a first pad 30a, a second pad 30b, and an insulating layer 31. A light emitting cell can be formed to include the first conductive type semiconductor layer 13, the active layer 15, and the second conductive type semiconductor layer 17. The first conductive type semiconductor layer 13 and the second conductive type semiconductor layer 17 can be electrically connected to the first pad 30a and the second pad 30b, respectively.

In the flip-chip type light emitting device according to the related art, the growth substrate 11 is separated from the first conductive type semiconductor layer 13, thereby making it possible to improve heat radiation efficiency and light efficiency of the light emitting diode.

However, in the case in which the growth substrate 11 is removed, the first pad 30a and the second pad 30b of the flip-chip type light emitting device are separated from each other, and a support member supporting the semiconductor layers 13, 15, and 17 is not present. Thus, the semiconductor layers 13, 15, and 17 are fragile.

In the related art, a technology of attaching a secondary substrate to the semiconductor layers and then thinning or separating the growth substrate using a chemical etching technology or a laser lift-off technology has been well known. However, since the secondary substrate should be separately attached to the semiconductor layers, a manufacturing cost is increased. Therefore, a technology capable of preventing cracks of the semiconductor layers generated in the case of thinning or separating the growth substrate has been demanded.

Meanwhile, in the flip-chip type light emitting device, the first bump 30a and the second bump 30b are used as heat radiating paths. Therefore, it is advantageous in radiating heat of the light emitting device to secure widths of the first bump 30a and the second bump 30b as great as possible. However, in the flip-chip type light emitting device, since the electrodes 19 are formed by removing a predetermined region, the first and second bumps 30a and 30b are disposed to be spaced apart from each other by a predetermined distance. In addition, the widths of the first and second bumps 30a and 30b are limited to be constant in order to prevent a short circuit between the bumps, which is disadvantageous in radiating heat of the light emitting device.

Meanwhile, a technology of manufacturing a light emitting device module by allowing the pads of the light emitting device to directly adhere onto a printed circuit board, or the like, using a solder paste has been recently studied. For example, the light emitting device module can be manufactured by directly mounting a light emitting device chip on the printed circuit board without packaging the light emitting device chip or can be manufactured by manufacturing a wafer level light emitting device package and mounting the wafer level light emitting device package on the printed circuit board. In the case of these light emitting device modules, since the pads directly contact the solder paste, a metallic element such as tin (Sn), or the like, in the solder paste is diffused into the light emitting device, such that an electrical short circuit can be generated in the light emitting device to cause a diode defect.

In addition, a demand for a chip scale package in which a process of packaging the light emitting device in a separate housing, or the like, is omitted and the light emitting device itself is used as a package in order to miniaturize the light emitting device and increase an output of the light emitting device has increased. Particularly, the electrode of the flip-chip type light emitting device can perform a function similar to that of a lead of the package, such that the flip-chip type light emitting device can also be usefully used in the chip scale package.

In the case in which a device having a form of the chip scale package is used as a high output light emitting apparatus, a high density current is applied to the chip scale package. When the high density current is applied, heat generated from the light emitting chip is also increased. This heat generates thermal stress in the light emitting device, and generates stress on an interface between materials having different coefficients of thermal expansion to generate residual stress.

Particularly, when a crack is generated between the electrodes by the stress, it is likely that a failure of the light emitting device will be generated, which causes a defect of the light emitting device. Therefore, the light emitting device used in the high output light emitting apparatus requires high heat radiation efficiency and excellent mechanical stability.

FIG. 2 to FIG. 13(b) are plan views and cross-sectional views for describing an exemplary light emitting device and an exemplary method of manufacturing the same according to some embodiments.

Figure 2A:
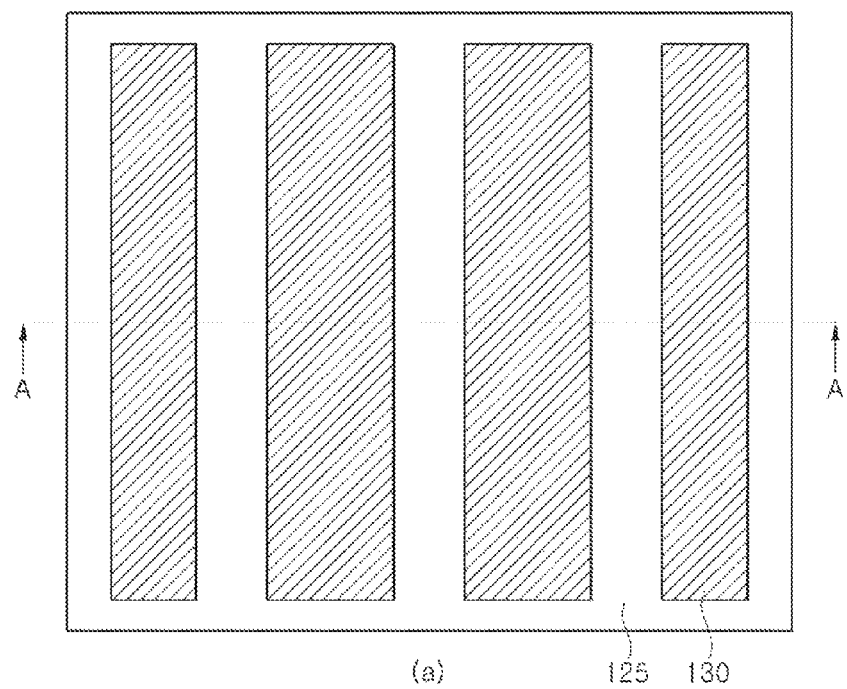
FIG. 2(a) to FIG. 13(b) are plan views and cross-sectional views of an exemplary light emitting device according to some embodiments.
Figure 2B:
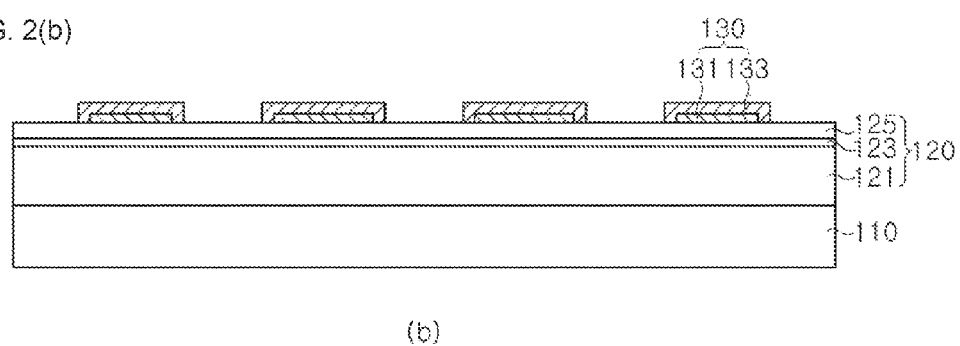

FIG. 2(a) is a plan view of a growth substrate on which second contact electrodes are formed on an epitaxial layer, and FIG. 2(b) is a cross-sectional view taken along line A-A of FIG. 2(a).

Referring to FIG. 2, a growth substrate 110 is first prepared, and a light emitting structure 120 is formed on the growth substrate 110. The growth substrate 110 can be any substrate on which the light emitting structure 120 can be grown, and can include, for example, a sapphire substrate, a silicon substrate, a silicon carbide substrate, a spinel substrate, a nitride substrate, or the like. For example, in the present exemplary embodiment, the growth substrate 110 can be the sapphire substrate.

Meanwhile, in the case in which the growth substrate 110 and the light emitting structure 120 that is to be grown on the growth substrate 110 have heterogeneous characteristics, for example, in the case in which the light emitting structure 120 includes a nitride based semiconductor and the growth substrate 110 is a heterogeneous material substrate such as the sapphire substrate, a buffer layer (not illustrated) can be further formed on the growth substrate 110.

In addition, the growth substrate 110 can have various growth surfaces, for example, a polar growth surface such as a c surface ((0001)), a non-polar growth surface such as an m surface ((1-100)) or an a surface ((11-20)), or a semi-polar growth surface such as a (20-21) surface. In addition, the growth substrate 110 can be a patterned substrate.

A first conductive type semiconductor layer 121, an active layer 123, and a second conductive type semiconductor layer 125 are grown on the growth substrate 110.

The first conductive type semiconductor layer 121 can include, for example, an n-type gallium nitride based semiconductor layer, and the second conductive type semiconductor layer 125 can include a p-type gallium nitride based semiconductor layer. In addition, the active layer 123 can have a single quantum well structure or a multi-quantum well structure and include a well layer and a barrier layer. In addition, the well layer can include a composite element selected depending on a wavelength of required light, for example, InGaN.

The first conductive type semiconductor layer 121 and the second conductive type semiconductor layer 125 can be semiconductor layers having different conductive types, and the semiconductor layers 121, 123, and 125 can be formed by various deposition and growth methods including metal organic chemical vapor deposition (MOCVD), molecular beam epitaxy (MBE), or hydride vapor phase epitaxy (HVPE), and the like.

Hereinafter, a description for the well-known technology for the semiconductor layers will be omitted.

Then, second contact electrodes 130 can be formed using a lift-off technology. The second contact electrode 130 can include a reflecting layer 131 and a cover layer 133. In addition, the second contact electrode 130 can further include a stress relaxing layer (not illustrated) disposed between the reflecting layer 131 and the cover layer 133. The stress relaxing layer relaxes stress due to a difference between coefficients of thermal expansion of the reflecting layer 131 and the cover layer 133.

The reflecting layer 131 can be formed of or include, for example, Ni/Ag/Ni/Au, and can have an entire thickness of about 1600 Å. The reflecting layer 131 can be formed to have a shape in which side surfaces thereof are inclined, for example, a bottom part thereof is relatively greater. The reflecting layer 131 can be formed using e-beam evaporation.

Meanwhile, the cover layer 133 covers an upper surface and the side surfaces of the reflecting layer 131 to protect the reflecting layer 131. The cover layer 133 can be formed using a sputtering technology or using e-beam evaporation (for example, planetary e-beam evaporation) of performing vacuum deposition while rotating the growth substrate 110 in a state in which the growth substrate 110 is inclined. The cover layer 133 can include Ni, Pt, Ti, or Cr, and be formed by depositing, for example, about five pairs of Ni/Pt or about five pairs of Ni/Ti. In some implementations, the cover layer 133 can include TiW, W, or Mo.

The stress relaxing layer can be variously selected depending on metal materials of the reflecting layer 131 and the cover layer 133. For example, in the case in which the reflecting layer 131 is made of or includes Al or an Al alloy and the cover layer 133 is made of or includes W, TiW, or Mo, the stress relaxing layer can be a single layer of Ag, Cu, Ni, Pt, Ti, Rh, Pd, or Cr or a composite layer of Cu, Ni, Pt, Ti, Rh, Pd, or Au. In addition, in the case in which the reflecting layer 131 is made of or includes Al or an Al alloy and the cover layer 32 is made of or includes Cr, Pt, Rh, Pd, or Ni, the stress relaxing layer can be a single layer Ag or Cu or a composite layer of Ni, Au, Cu, or Ag.

In addition, the second contact electrode 130 can further include an oxidation preventing metal part (not illustrated). The oxidation preventing metal part can cover the cover layer 133, include Au in order to prevent oxidation of the cover layer 133, and can be formed of or include, for example, Au/Ni or Au/Ti. In some implementations, Ti is preferred since adhesion of an oxidized layer such as $SiO_2$ is good. The oxidation preventing metal part can also be formed using a sputtering technology or using e-beam evaporation (for example, planetary e-beam evaporation) of performing vacuum deposition while rotating the growth substrate 110 in a state in which the growth substrate 110 is inclined.

After the second contact electrodes 130 are formed, a photo-resist pattern is removed, such that the second contact electrodes 130 are formed on the second conductive type semiconductor layer 125, as illustrated in FIG. 2(a) or 2(b).

FIGS. 2(a) and 2(b) illustrate partial regions of a wafer before the wafer is divided. The partial regions of the wafer can be or include individual device regions in which the light emitting device according to the present disclosure is to be manufactured. In this case, regions in which the second contact electrodes 130 are not formed in both distal ends of the growth substrate 110 and the light emitting structure 120 can be division scheduled regions for dividing the wafer. Drawings for describing the present exemplary embodiment to be described below can be drawings for describing the individual device regions unless separately described.

Figure 3A:
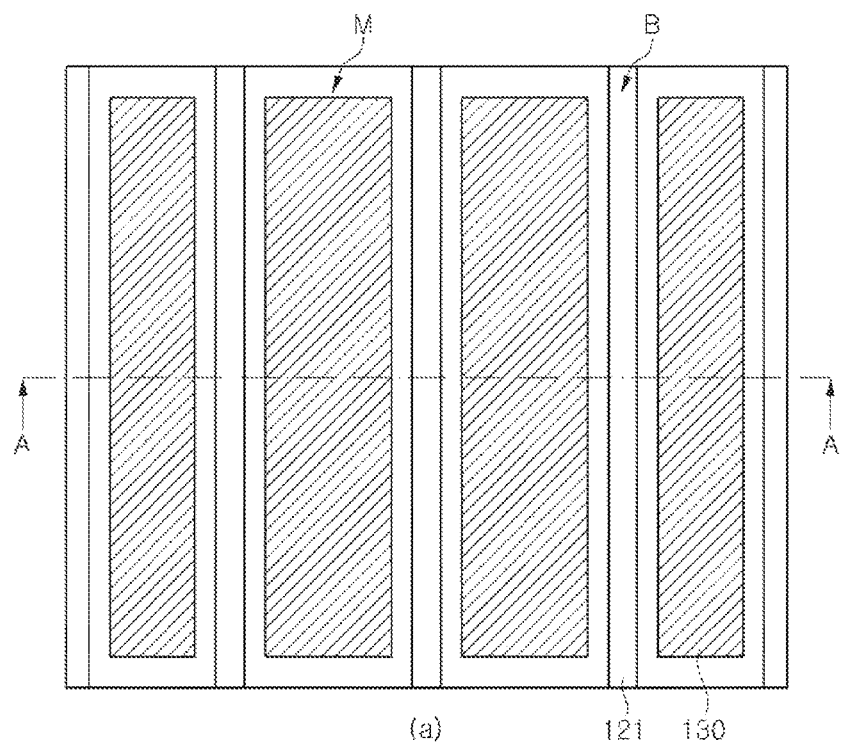
Figure 3B:
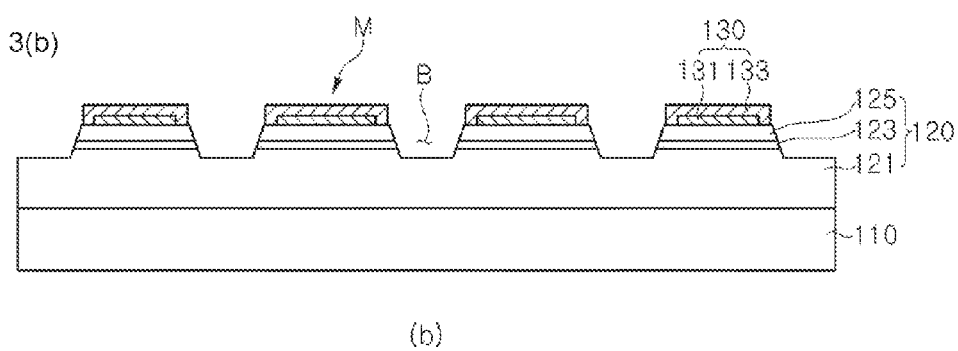

FIG. 3(a) is a plan view of the growth substrate on which mesas are formed, and FIG. 3(b) is a cross-sectional view taken along line A-A of FIG. 3(a).

Referring to FIG. 3, mesas M are formed on a first conductive type semiconductor layer 121. The mesa M includes an active layer 123 and a second conductive type semiconductor layer 125. The active layer 123 is disposed between the first conductive type semiconductor layer 121 and the second conductive type semiconductor layer 125. Meanwhile, second contact electrodes 130 are disposed on the mesas M.

The mesa M can be formed by patterning the second conductive type semiconductor layer 125 and the active layer 123 so that the first conductive type semiconductor layer 121 is exposed. Side surfaces of the mesa M can be formed to be inclined using a technology such as a photo-resist reflow technology. Profiles of the inclined side surfaces of the mesa M can improve extracting efficiency of light generated in the active layer 123.

A plurality of mesas M can have a long shape in which they are extended in parallel with each other in one side direction, as illustrated. In addition, due to the plurality of mesas M, basin part regions B can be formed between the mesas M. The basin part regions B can be regions defined by mesas M disposed at both sides thereof and exposing the first conductive type semiconductor layer 121.

Meanwhile, the second contact electrodes 130 cover most of the upper surfaces of each of the mesas M, and have substantially the same shape as a plane shape of the mesa M. An entire area of upper surfaces of the second contact electrodes 130 can be 70%, 80%, or 90% or more of an area of an upper surface of the growth substrate 110 or an area of a lower surface of the first conductive type semiconductor layer 121.

Figure 4A:
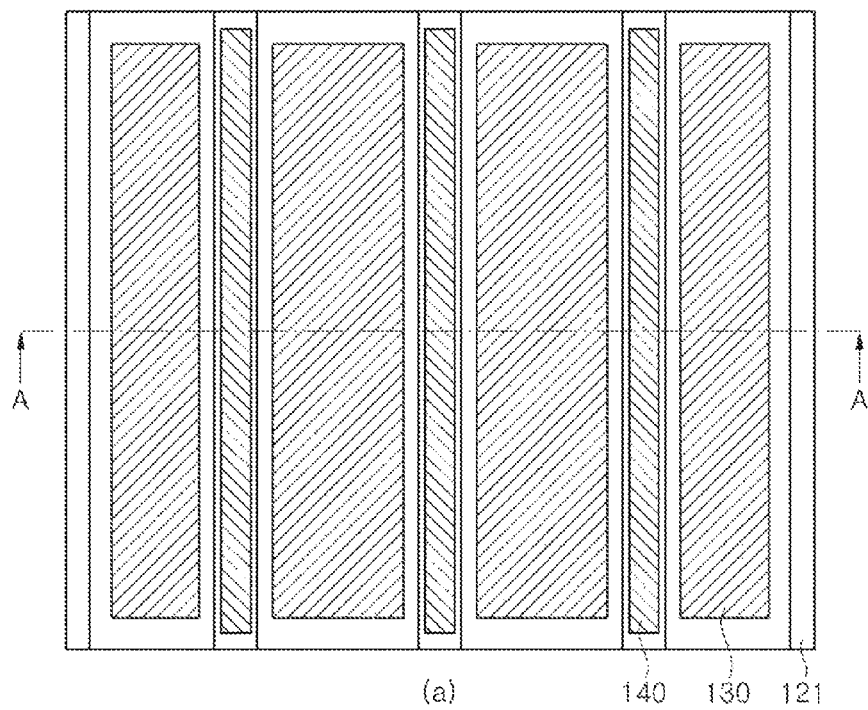
Figure 4B:
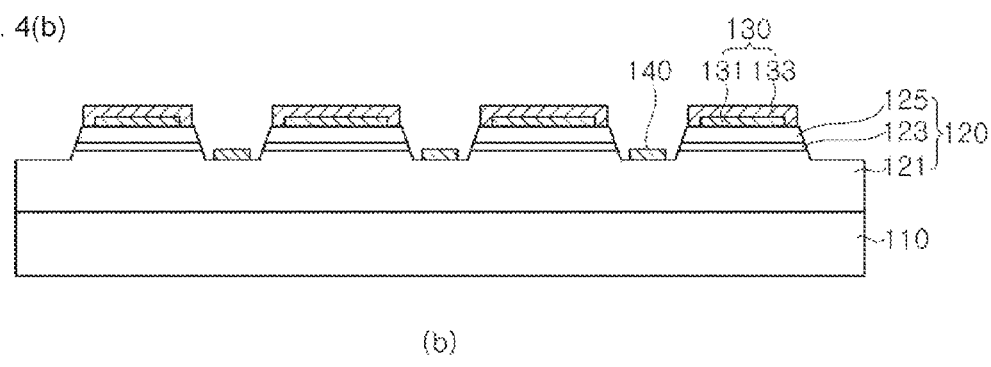

FIG. 4(a) is a plan view of the growth substrate on which first contact electrodes are disposed in the basin part regions, and FIG. 4(b) is a cross-sectional view taken along line A-A of FIG. 4(a).

Referring to FIGS. 4(a) and 4(b), the first contact electrodes 140 can be formed in the basin part regions, which are regions between the mesas M. The first contact electrodes 140 can be formed using deposition and lift-off technologies. The first contact electrode 140 can include a metal, for example, at least one of Ni, Pt, Pd, Rh, W, Ti, Cr, Al, Ag, or Au. The first contact electrode 140 can ohmic-contact the first conductive type semiconductor layer 121, and can include a reflecting layer made of or including a metal having high reflectivity, similar to the second contact electrode 130 described above.

The first contact electrodes 140 can have a long shape in which they are extended in parallel with each other in one side direction, as illustrated. In addition, the first contact electrodes 140 can have a shape in which they are extended in parallel with each other while being spaced apart from the second contact electrodes 130 by a predetermined interval.

Figure 5A:
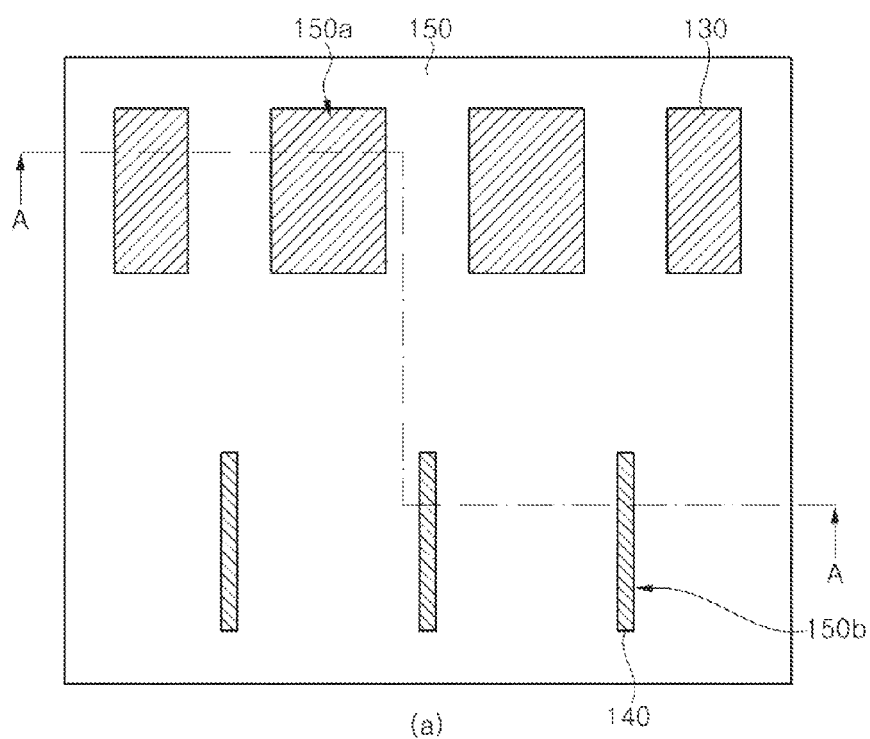
Figure 5B:
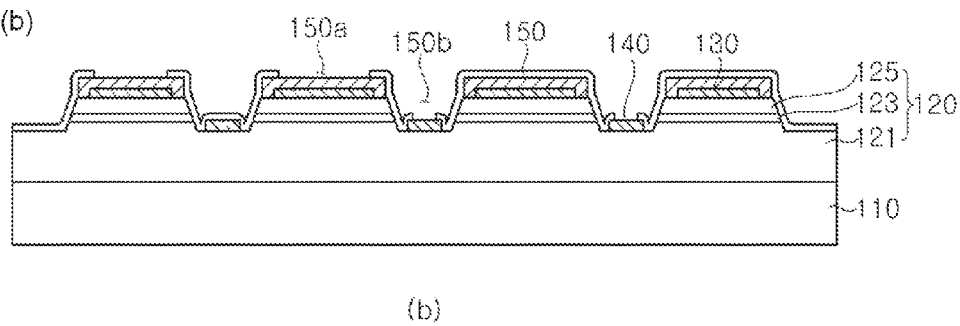

FIG. 5(a) is a plan view of the growth substrate on which a first insulating layer is formed on the second contact electrodes and the first contact electrodes, and FIG. 5(b) is a cross-sectional view taken along line A-A of FIG. 5(a).

Referring to FIG. 5, the second contact electrodes 130 and the first contact electrodes 140 are covered with the first insulating layer 150. Then, portions of the first insulating layer 140 are removed to expose a lower region. The first insulating layer 150 can include a plurality of first opening regions 150a exposing portions of the second contact electrodes 130 and a plurality of second opening regions 150b exposing portions of the first contact electrodes 140. The plurality of first opening regions 150a can be disposed to be spaced apart from each other by a predetermined distance, respectively. The plurality of second opening regions 150b can be disposed to be spaced apart from each other by a predetermined distance, respectively. Each of the plurality of first opening regions 150a and each of the plurality of second opening regions 150b can be disposed to be spaced apart from each other by a predetermined distance. The above-mentioned predetermined distances can be determined in consideration of current diffusion of the light emitting device according to the exemplary embodiment of the present disclosure. In addition, the first opening regions 150a can be positioned to be biased toward the same end portions of the mesas.

Predetermined areas of each of the first opening regions 150a and each of the second opening regions 150b can be opened or exposed in consideration of areas of the second contact electrodes 130 and the first contact electrodes 140 disposed below the first opening regions 150a and the second opening regions 150b. The first insulating layer 150 can be formed with a uniform thickness or be formed with different thicknesses depending on regions in which it is disposed.

The first insulating layer 150 can include an insulating material and can be formed of or include, for example, an oxide layer of $SiO_2$, or the like, a nitride layer of $SiN_x$ or the like, or an insulating layer of $MgF_2$. Further, the first insulating layer 150 can include multiple layers, and include a distributed Bragg reflector in which materials having different refractive indices are alternately stacked. For example, layers made of or including $SiO_2/TiO_2$, or $SiO_2/Nb_2O_5$, or the like, are stacked, thereby making it possible to form an insulating reflecting layer having high reflectivity.

The first insulating layer 150 can be formed using a technology such as chemical vapor deposition (CVD), or the like, and be then patterned to form the first opening regions 150a and the second opening regions 150b.

Figure 6A:
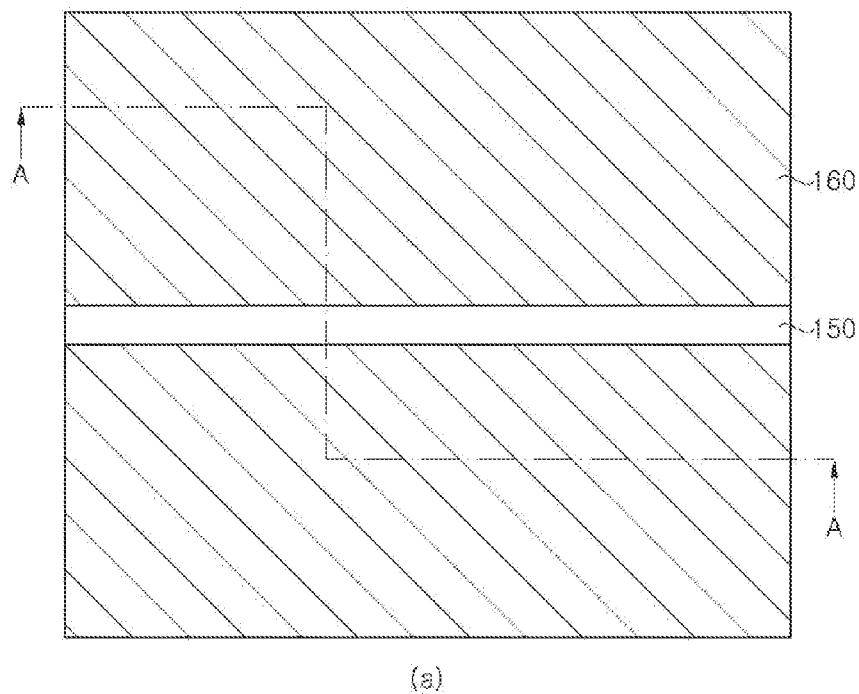
Figure 6B:
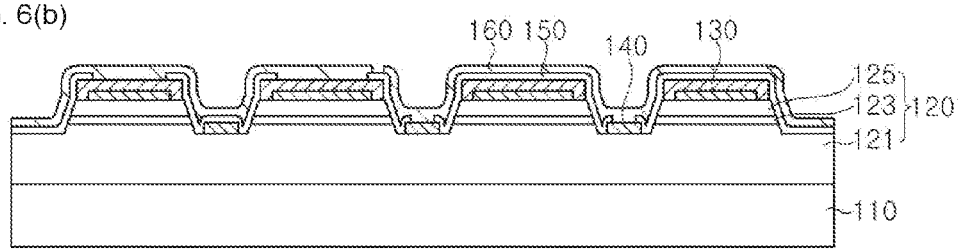

FIG. 6(a) is a plan view of the first insulating layer on which pad metal layers are formed, and FIG. 6(b) is a cross-sectional view taken along line A-A of FIG. 6(a).

Referring to FIG. 6(a), a plurality of pad metal layers 160 are formed on the first insulating layer 150. The pad metal layers 160 can be disposed in the first and second opening regions 150a and 150b exposing portions of the second contact electrodes 130 and the first contact electrodes 140. The pad metal layers 160 are formed over substantially the entire region of the growth substrate 110 except for spaces therebetween. Therefore, a current can be easily dispersed through the pad metal layers 160. The pad metal layers 160 can ohmic-contact the second contact electrodes 130 and the first contact electrodes 140 through the first and second opening regions 150a and 150b.

The pad metal layer 160 can include an adhering layer, a metal reflecting layer, a diffusion preventing layer, and a seed layer. The adhering layer can include Ti, Cr, Ni, or Ta, or a combination thereof, and can be used in order to improve adhesion between the pad metal layer 160 and the first insulating layer 150. The metal reflecting layer can include Al, or Ag, or a combination thereof, and reflects light incident to the pad metal layer 160 to increase reflectivity of the light emitting device. The diffusion preventing layer can include Cr, Ti, Ni, Mo, TiW, or W, or a combination thereof, and prevents diffusion of metal atoms to protect the metal reflecting layer. The seed layer, which is a layer formed in order deposit and plate a bulk electrode (not illustrated) formed in a subsequent process, can be formed of or include Au or Cu. Therefore, the seed layer can be disposed at the uppermost portion of the pad metal layer 160. The pad metal layer 160 can be formed through a depositing process or an electroplating process. The pad metal layer 160 can be formed at a uniform thickness or be formed at different thicknesses depending on regions in which it is disposed. An entire area of the pad metal layers 160 can be 70%, 80%, or 90% or more of the area of the upper surface of the growth substrate 110 or the area of the lower surface of the first conductive type semiconductor layer 121.

Figure 7:
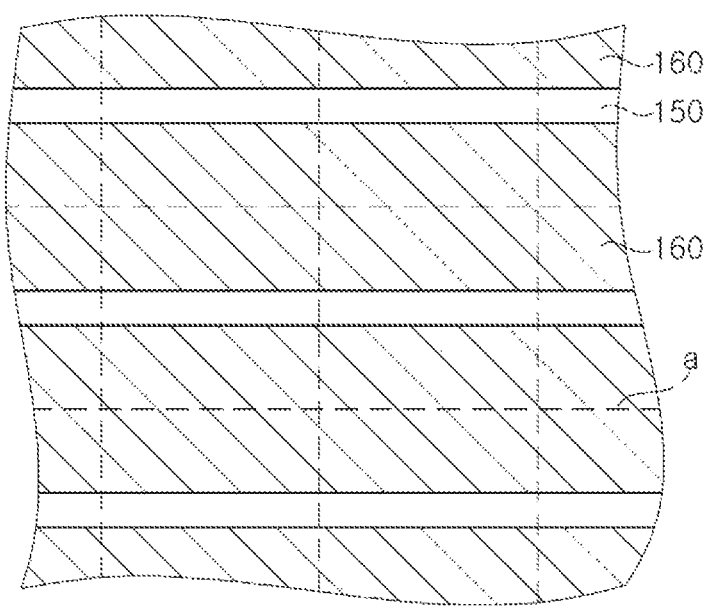

FIG. 7 is a plan view of a partial region of a wafer before the light emitting device according to the exemplary embodiment of the present disclosure is divided into individual diodes.

Referring to FIG. 7, the pad metal layers 160 and the first insulating layer 150 form stripe patterns. In FIG. 7, the first insulating layer 150 is exposed between the pad metal layers 160 disposed in parallel with each other. Here, dotted lines a can indicate division scheduled lines for dividing the wafer into the individual diodes. The division scheduled lines can be formed in the division scheduled regions described with reference to FIG. 2.

The pad metal layers 160 are divided into first and second metal layers along the dotted lines a through a subsequent process, but are connected to each other in the wafer, such that a current can flow therein in an electroplating process.

Figure 8A:
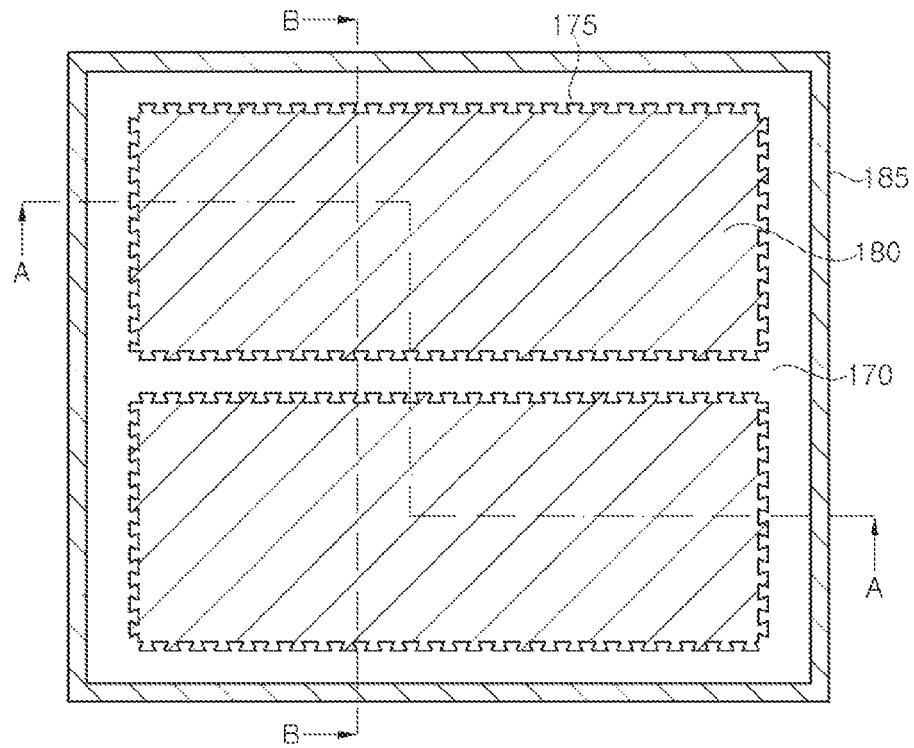
Figure 8B:
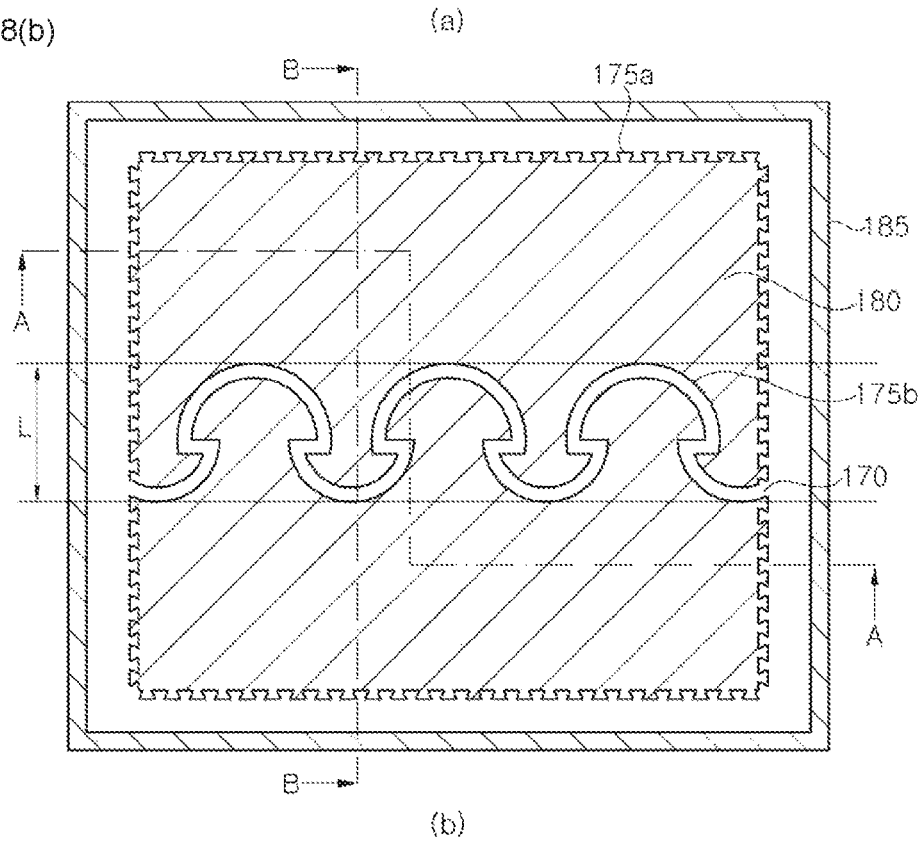
Figure 9A:
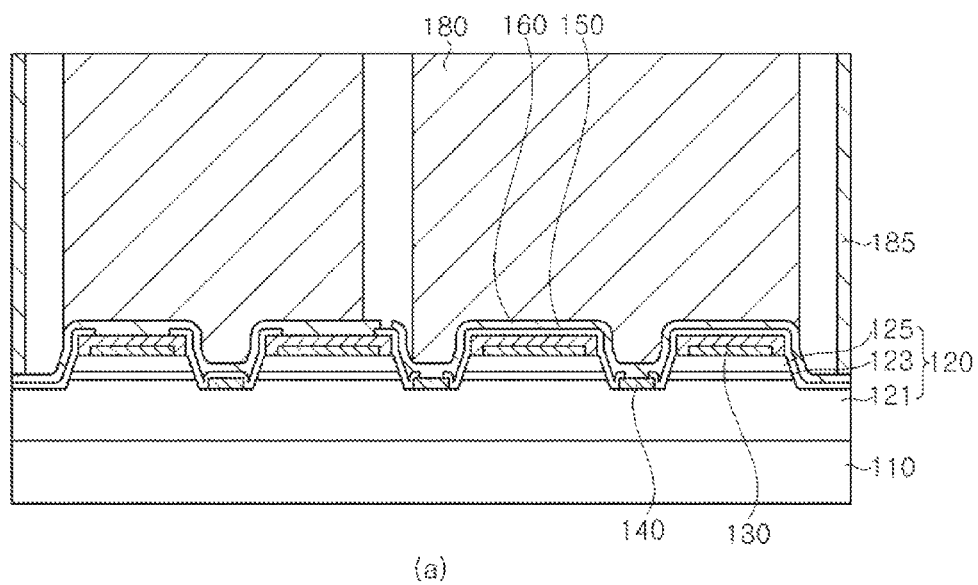
Figure 9B:
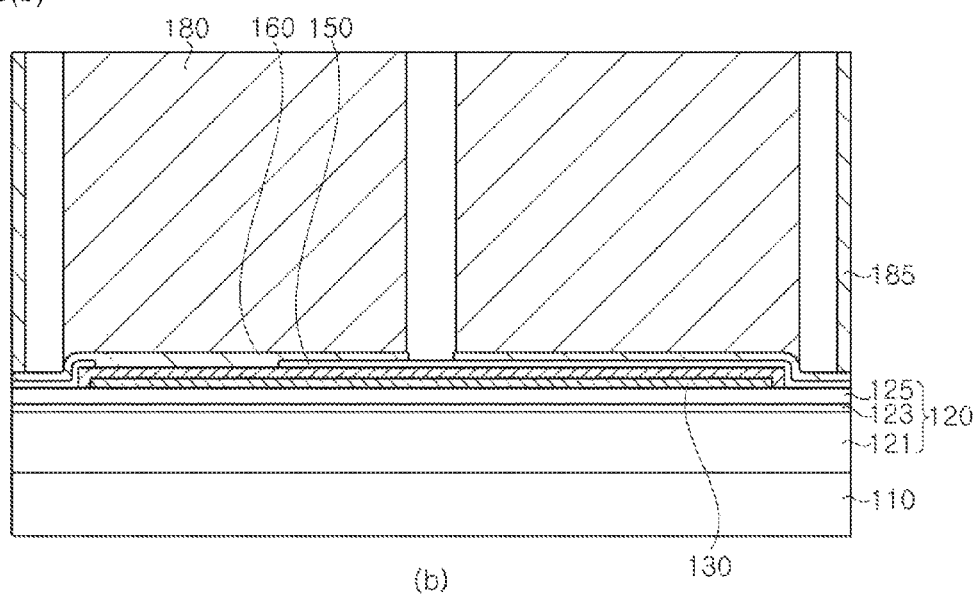

FIGS. 8(a) and 8(b) are plan views of the pad metal layers on which insulation supports are formed, FIG. 9(a) is a cross-sectional view taken along line A-A of FIGS. 8(a) and 8(b), and FIG. 9(b) is a cross-sectional view taken along line B-B of FIGS. 8(a) and 8(b).

Referring to FIGS. 8(a), 8(b) and 9, the insulation supports 170 and bulk electrodes 180 are disposed on the pad metal layer 160. The insulation supports 170 include the bulk electrodes 180 formed in internal regions thereof, and are coupled to the bulk electrodes 180 through coupling regions 175, 175*a*, and 175*b*. In addition, support parts 185 enclosing the insulation supports 170 can be further included.

A spaced distance between the bulk electrodes 175 can be 30 to 300 µm. Therefore, since the bulk electrodes 175 can be formed at widths relatively wider as compared with the related art, heat radiation efficiency of the light emitting device can be improved.

The insulation support 170 includes a coupling pattern formed in the internal region thereof and enclosing the bulk electrode 180, and the bulk electrode 180 also includes a coupling pattern formed at an edge thereof and coupled to the coupling pattern of the insulation support 170. The coupling pattern of the insulation support 170 and the coupling pattern of the bulk electrode 180 are coupled to each other, such that coupling regions 175, 175*a*, and 175*b* are formed. The coupling regions 175 and 175*a* can be formed in a reverse trapezoidal sawtooth pattern, as illustrated. In addition, although not illustrated, the coupling regions 175 and 175*a* can be formed in a triangular sawtooth pattern, a trapezoidal sawtooth pattern, a rectangular sawtooth pattern, or the like, in addition to the reverse trapezoidal sawtooth pattern.

When comparing FIG. 8(*a*) and FIG. 8(*b*) with each other, FIG. 8(*a*) includes a first coupling region 175*a* and a second coupling region 175*b*. The first coupling region 175*a* corresponds to the coupling region 175 of FIG. 8(*a*). The second coupling region 175*b* is disposed in a region in which the bulk electrodes 180 face each other. The second coupling region 175*b* includes patterns entering the bulk electrodes 180 facing each other at a depth deeper as compared with the first coupling region 175*a*. In this case, each of the pad metal layers 160 disposed below the second coupling region 175*b* is disposed so as not to be overlapped with the second coupling region 175*b*. That is, in the case of an exemplary embodiment of FIG. 8(*b*), the second coupling region 175*b* is disposed on the first insulating layer 150 in order to prevent a short circuit between the bulk electrodes 180 due to the second coupling region 175*b*. In an exemplary embodiment of FIG. 8(*b*), coupling force between the bulk electrodes 180 facing each other and the insulation supports 170 disposed between the bulk electrodes 180 can be enhanced.

Again referring to FIG. 8(*b*), the bulk electrodes 180 are engaged with each other through convex parts and concave parts each included therein. The convex parts and the concave parts are disposed on surfaces on which the bulk electrodes 180 face each other. The convex parts include sections in which a width thereof becomes wide in a protrusion direction, and although the case in which the width discontinuously becomes wide has been illustrated in the present exemplary embodiment, the present disclosure is not limited thereto, and other implementations are also possible. Therefore, the width of the convex parts can also continuously become wide in the protrusion direction. In the present exemplary embodiment, in the case in which the width of the convex parts discontinuously becomes wide, the width of the convex parts can become wide by 1.5 to 2 times.

A length L of FIG. 8(*b*) indicates a length of the convex parts in the protrusion direction. A ratio of the entire area of the convex parts to the entire area of the bulk electrodes 180 can be calculated through the length L, and in the present exemplary embodiment, the entire area of the convex parts can be ¼ or more of the entire area of the bulk electrodes 180. That is, since a ratio of an area in which the bulk electrodes 180 according to the present exemplary embodiment are coupled to each other is significantly greater than that of FIG. 8(*a*), strong coupling force between the bulk electrodes 180 can be secured. Meanwhile, the insulation supports 170 and the bulk electrodes 180 are coupled to each other in the coupling region 175, thereby making it possible to form a base included in the light emitting device according to the present disclosure.

Each of the coupling pattern of the insulation support 170 and the coupling pattern of the bulk electrode 180 can include a plurality of concave parts and a plurality of convex parts, and the insulation support 170 and the bulk electrode 180 are engaged with each other like a saw-toothed wheel in the coupling region 175, as illustrated.

In the present disclosure, since the insulation support 170 and the bulk electrode 180 are engaged with each other like the saw-toothed wheel, the bulk electrode 180 and the insulation support 170 can contact each other while having a wider surface area, as compared with the case in which the coupling patterns are not present. Therefore, since a decrease in coupling force due to different coefficients of thermal expansion between the insulation support 170 and the bulk electrode 180 can be prevented, reliability of the light emitting device can be improved.

The convex parts of the coupling pattern of the insulation support 170 and the convex parts of the coupling pattern of the bulk electrode 180 adjacent to each other can be point-symmetrical to each other. That is, when the convex parts of the insulation support 170 and the convex parts of the bulk electrode 180 are rotated around one point between the convex parts by 180 degrees, they can be overlapped with each other.

In addition, in order to enhance the coupling force between the insulation support 170 and the bulk electrode 180, each of a protrusion part of the coupling pattern of the insulation support 170 and a protrusion part of the coupling pattern of the bulk electrode 180 can include regions in which a width thereof becomes wide in the protrusion direction. Further, the width of each of the protrusion parts can continuously or discontinuously become wide in the protrusion direction. A form of each of the convex parts of the coupling pattern of the insulation support 170 and the convex parts of the coupling pattern of the bulk electrode 180 can be used as a form of each of the protrusion parts without being limited as along as it is a form in which the insulation support 170 and the bulk electrode 180 can be mechanically coupled to each other.

Meanwhile, the insulation support 170 is enclosed by the support part 185. Through the support parts 185, structural stability of the light emitting device during a process can be enhanced, and warpage, failure, and the like, of the light emitting structure 120 after the growth substrate 110 is removed can be prevented.

The insulation support 170 can include at least one of photosensitive polyimide, Su-8, a photo-resist for plating, parylene, an epoxy molding compound (EMC), or a ceramic powder. The insulation supports 170 and the bulk electrodes 180 can have a height of 20 to 200 µm. In addition, upper surfaces of the insulation supports 170 and upper surfaces of the bulk electrodes 180 can be disposed to be flush with each other.

Since the base according to the present disclosure is provided by forming the bulk electrodes 180 and the insulation supports 170, the base can have various thicknesses, if necessary. Therefore, since the thickness of the base according to the present disclosure can be substantially similar to that of a metal substrate according to the related art, the light emitting device manufactured according to the present disclosure can be similarly applied to applications according to the related art.

In order to form the bulk electrodes 180 in the internal regions of the insulation supports 170, the insulation supports 170 covering the pad metal layers 160 and the first insulating layer 150 are first formed through application and hardening. Then, portions of the insulation supports 170, for example, portions of the internal regions of the insulation supports 170 are removed to form internal opening regions exposing portions of the pad metal layers 160. At the time of forming the internal opening regions, the insulation supports 170 can be patterned through exposure and development processes, and the coupling patterns can be formed in the internal region of the insulation support 170 through the patterning.

Next, the bulk electrodes 180 buried in the internal opening regions are formed. The bulk electrodes 180 can be formed through a method such as a depositing method, or a plating method, or the like. The bulk electrodes 180 are formed to be filled in the internal opening regions to contact the pad metal layer 160, such that the bulk electrodes 180 and the light emitting structure 120 can be electrically connected to each other.

Since the insulation supports 170 included in the light emitting device according to the present disclosure include the coupling pattern before the bulk electrodes 180 are formed, the bulk electrodes 180 formed in the internal opening regions by the method such as the plating method, or the like, can have the coupling pattern naturally engaged with the coupling pattern of the insulation supports 170.

The bulk electrode 180 can sequentially include a conduction layer, a barrier layer, and an oxidation preventing layer. The conduction layer, which is a layer for diffusing a current, can include Cu, or Ag, or the like. The barrier layer, which is a layer for preventing diffusion of metal atoms included in the bulk electrode 180, can include Ni, or Pd, or the like. The oxidation preventing layer, which is a layer for preventing oxidation of the bulk electrode 180, can be formed of or include Au, or the like, and be replaced by an oxidation sacrificial layer including Ag and/or Al. The oxidation preventing layer or the oxidation sacrificial layer can be disposed on an upper surface on which the bulk electrode 180 is exposed to the outside.

The entire area of a lower surface of the bulk electrode 180 can be 70%, 80, or 90% or more of an area of an upper surface of the second conductive type semiconductor layer. In the present exemplary embodiment, since the bulk electrodes 180 are formed to have a wide area, heat radiation efficiency of the light emitting device is high.

Figure 10:
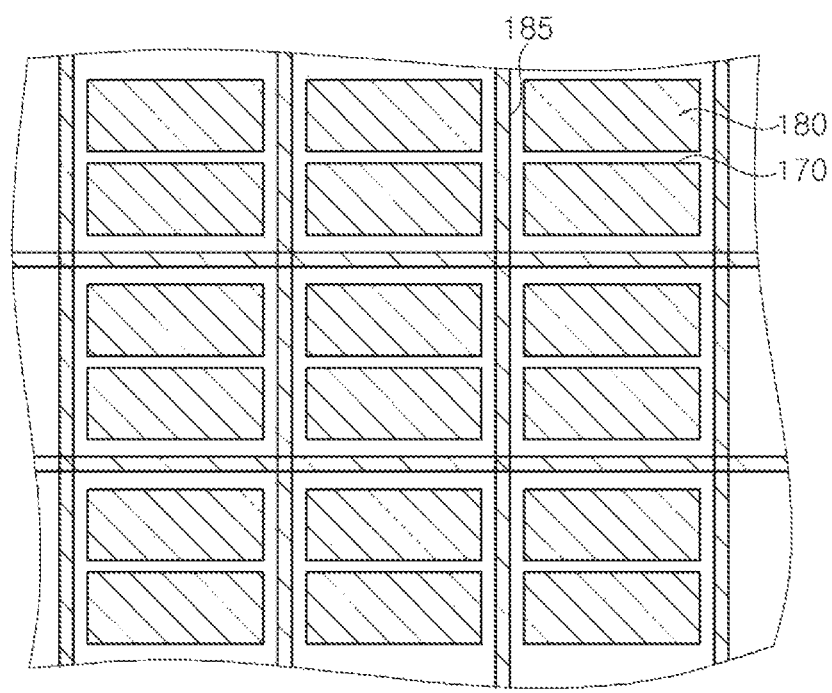

FIG. 10 is a plan view of a partial region of a wafer before the light emitting device according to the exemplary embodiment of the present disclosure is divided into individual diodes.

Referring to FIG. 10, the support parts 185 can be disposed to correspond to the division scheduled lines as illustrated in FIG. 7. The bulk electrodes 180 can be formed in consideration of positions and areas of the pad metal layers 160 disposed therebelow. The bulk electrodes 180 and the support parts 185 can be formed through the same process. In some implementations, the insulation supports 170 are formed on the pad metal layers 160, and partial regions of the insulation supports 170 are patterned to expose portions of the pad metal layers 160 and the first insulating layer 150. The patterned regions can be the division scheduled regions corresponding to the division scheduled lines. The region opened through the patterning process is applied with a material for forming the abovementioned bulk electrodes 180 or is buried by a plating process, and the material is hardened, thereby making it possible to form the bulk electrodes 180 and the support parts 185. Therefore, the bulk electrodes 180 and the support parts 185 can be formed in the same process using the same material.

Figure 11:
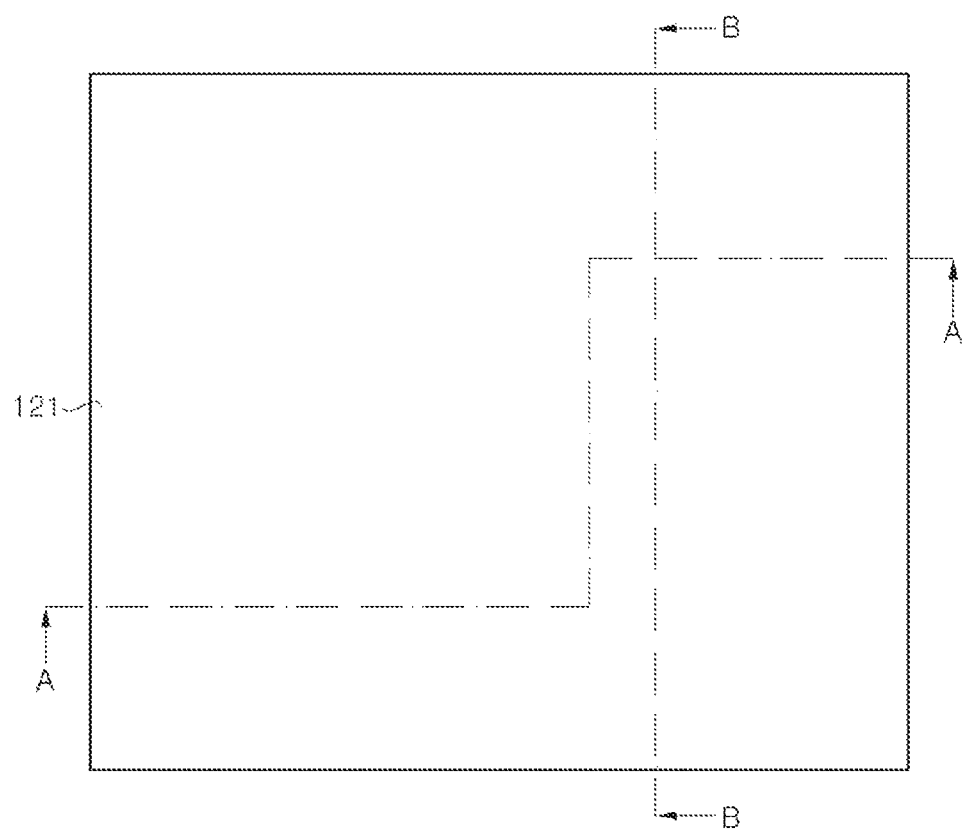

FIG. 11 is a plan view illustrated so that the first conductive type semiconductor layer 121 is directed upwardly after the growth substrate 110 is removed. Therefore, in the present exemplary embodiment, the insulation supports 170 and the bulk electrodes 180 are positioned below the light emitting structure 120.

Figure 12A:
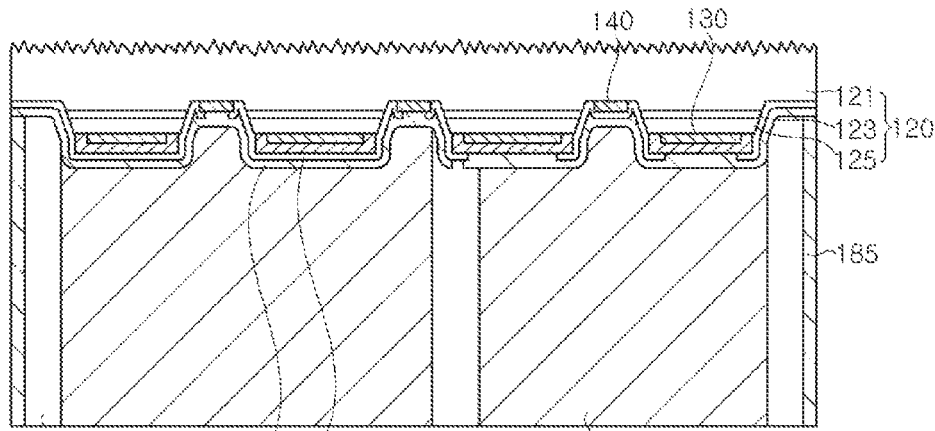
Figure 12B:
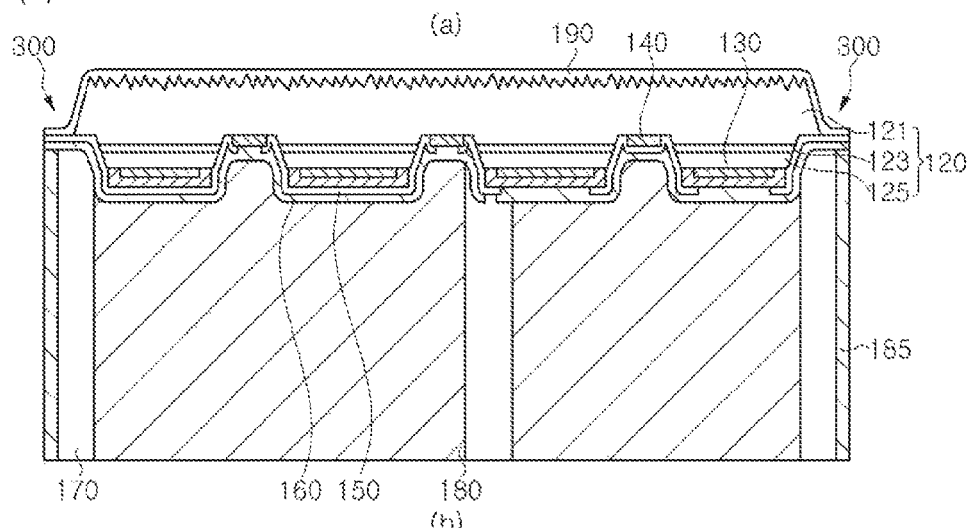
Figure 12C:
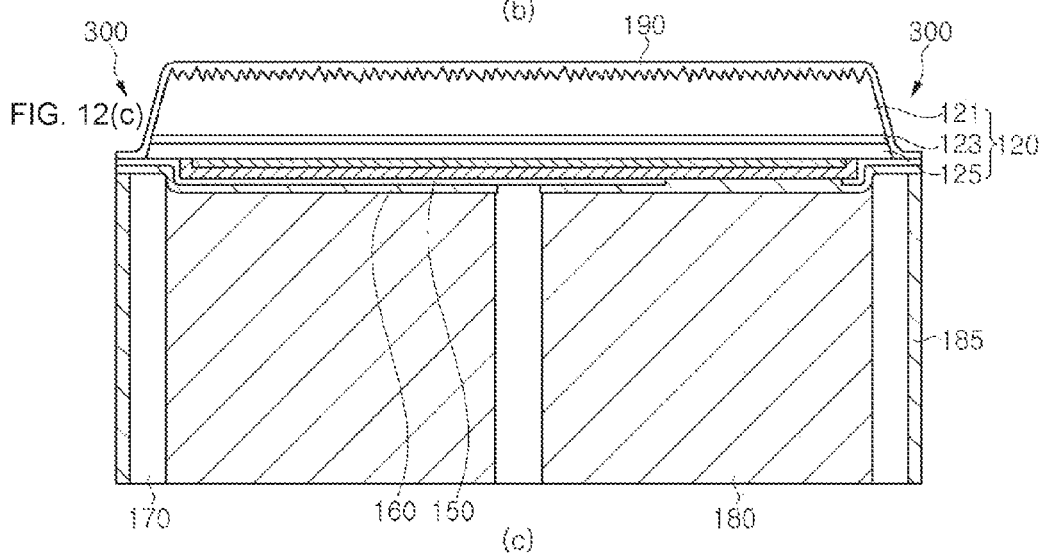

FIG. 12(a) is a cross-sectional view of an epitaxial layer having a roughness formed on a surface thereof in a state in which the growth substrate is separated. FIGS. 12(b) and 12(c) are cross-sectional views of the light emitting structure on which a second insulating layer is formed.

FIG. 12(a) is a cross-sectional view taken along line A-A illustrated in FIG. 11, and FIG. 12(b) is a cross-sectional view taken along line A-A after the second insulating layer is disposed on an exemplary embodiment illustrated in FIG. 11. FIG. 12(c) is a cross-sectional view taken along line B-B after the second insulating layer is disposed on the exemplary embodiment illustrated in FIG. 11.

Next, referring to FIG. 12(a), the growth substrate 110 is separated from the light emitting structure 120. The growth substrate 110 can be separated from the light emitting structure 120 by a method such as a laser lift-off method, a chemical lift-off method, a stress lift-off method, or a thermal lift-off method, or the like. Since the growth substrate 110 is removed, heat radiation efficiency and light efficiency of the light emitting device according to the present disclosure can be improved.

Exposed surfaces of the bulk electrodes 180 can be planarized through chemical mechanical polishing. The roughness can be formed on a surface of the first conductive type semiconductor layer 121 exposed due to the separation of the growth substrate 110. In addition, before the roughness is formed, residuals on the surface of the first conductive type semiconductor layer 121 can be chemically or physically removed, and the first conductive type semiconductor layer 121 can be removed at a predetermined thickness from the surface thereof. In a process of separating the growth substrate 110, a defect or damage can be generated in the vicinity of the first conductive type semiconductor layer 121. Therefore, the surface of the first conductive type semiconductor layer 121 is removed at a predetermined thickness, thereby making it possible to make an average crystalline of the entirety of the first conductive type semiconductor layer 121 excellent.

The roughness can be formed by wet etching using KOH and/or NaOH solutions, or a sulfur phosphoric acid, be formed by photo-enhanced chemical (PEC) etching, or be formed by other wet etching, dry etching, or electrolysis. The roughness is formed on the surface of the first conductive type semiconductor layer 121, such that light extracting efficiency can be improved.

According to various embodiments of the present disclosure, since the base including the insulation supports 170 and the bulk electrodes 180 mechanically coupled to each other serves as a support substrate, even though the growth substrate 110 is separated, structural stability of the light emitting device can be secured.

Then, referring to FIGS. 12(b) and 12(c), the light emitting structures 120 can be patterned to form the light emitting structure 120 and the division scheduled regions 300. The patterning can be performed using dry etching, or the like. The division scheduled region 300 are formed, such that the light emitting structure 120 can be divided into one or more light emitting devices.

Then, a second insulating layer 190 can be formed on the light emitting structure 120 and the exposed support parts 185. The second insulating layer 190 is not limited as long as it is a transparent insulating layer, and can be formed through a depositing process, or the like. The second insulating layer 190 can protect the light emitting structure 120 from an external environment.

Then, a process of dividing the wafer into individual devices in consideration of the division scheduled regions 300 formed by the patterning is performed. This process can include a cutting process using a dicing blade such as a diamond blade. The support parts 185 disposed in the division scheduled regions 300 can be removed by the cutting process.

In some implementations, the support parts 185 are not completely removed and at least a portion of the support parts 185 can remain. In this case, a portion of the insulation support 170 can be disposed between the support part 185 and the pad metal layer 160, thereby making it possible to prevent generation of an electric short circuit due to a contact between the support part 185 and the pad metal layer 160.

Figure 13A:
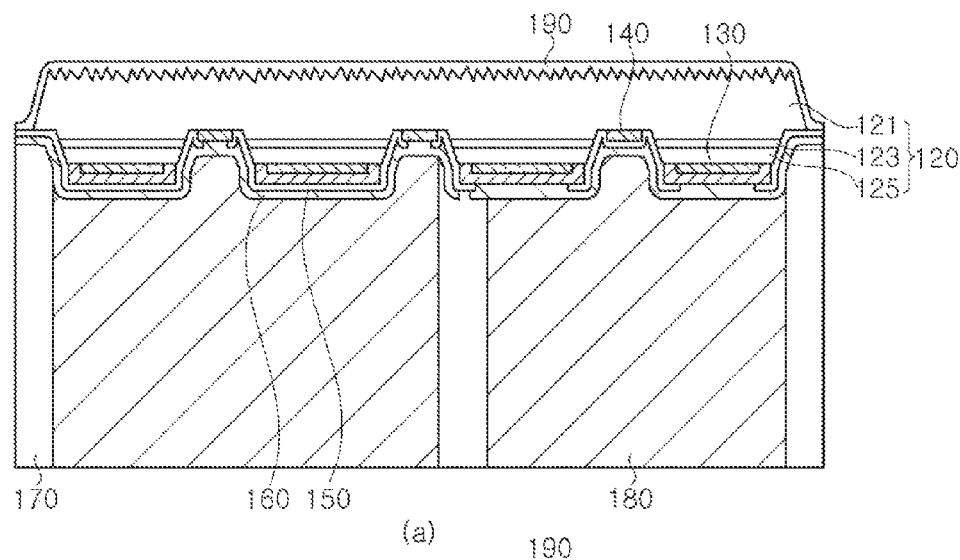
Figure 13B:
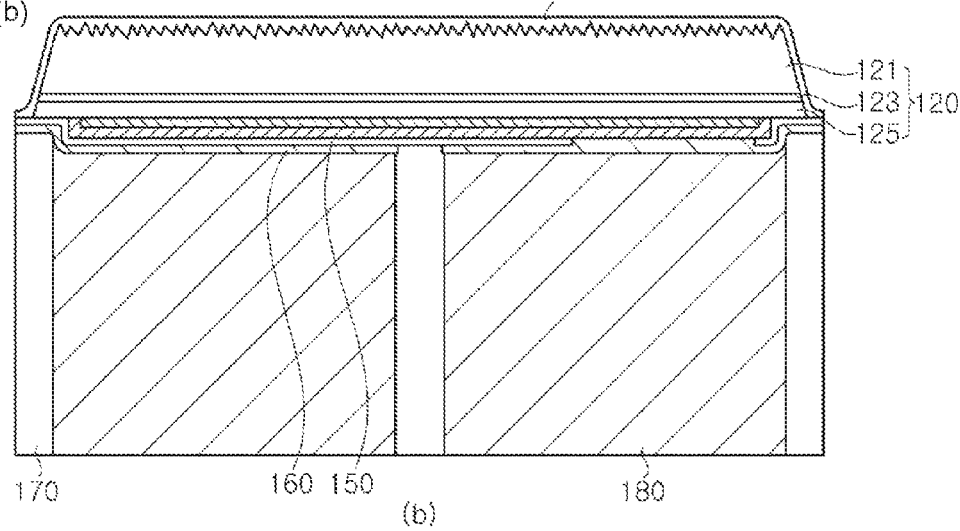

As a result, the light emitting device according to the exemplary embodiment of the present disclosure illustrated in FIGS. 13(a) and 13(b) is formed. A cross-sectional view of FIG. 13(a) is a cross-sectional view of the light emitting device viewed in the same direction as that of the cross-sectional view of FIG. 12(b), and a cross-sectional view of FIG. 13(b) is a cross-sectional view of the light emitting device viewed in the same direction as that of the cross-sectional view of FIG. 12(c).

Figure 14A:
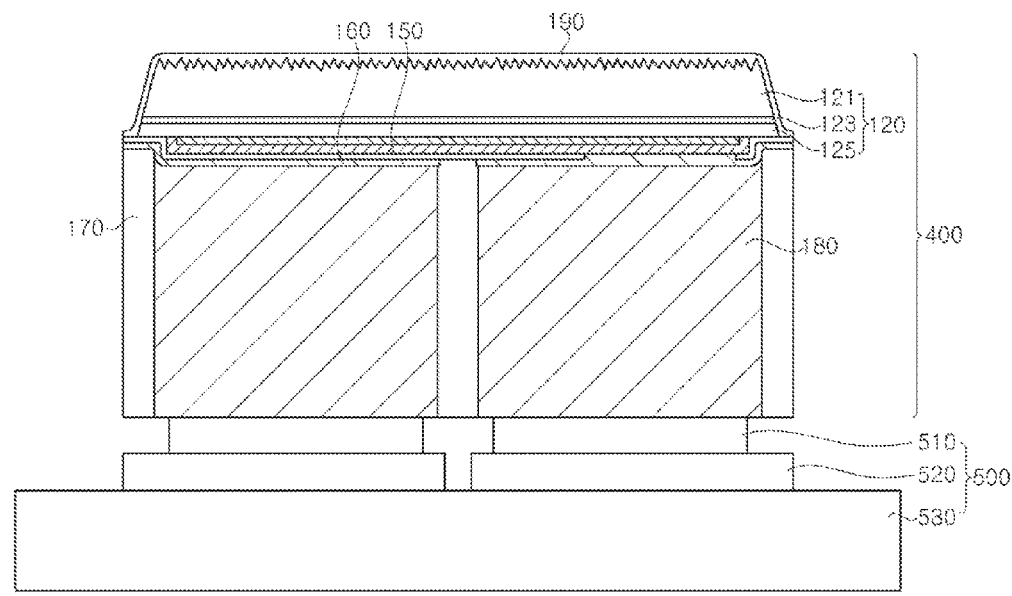
FIG. 14(a) is a cross-sectional view of an exemplary light emitting device according to some embodiments.

FIG. 14(a) is a cross-sectional view for describing an exemplary light emitting device according to some embodiments of the present disclosure.

Referring to FIG. 14(a), a light emitting device 400 is the light emitting device according to the exemplary embodiment of the present disclosure described above, and is mounted on a sub-mount substrate 500.

The sub-mount substrate 500 includes a substrate 530 and electrode patterns 520 disposed on the substrate 530. The substrate 530 can be any one of BeO, SiC, Si, Ge, SiGe, or AlN, or ceramic substrates having excellent thermal conductivity. However, the substrate 530 is not limited thereto, and other implementations are also possible, but can be a substrate including a metal material having high thermal conductivity and excellent electrical conductivity as well as an insulating material having high thermal conductivity.

When the electrode patterns 520 are formed to have a shape corresponding to that of the bulk electrodes 180, the bulk electrodes 180 are bonded to the electrode patterns 520, respectively. Here, the bulk electrodes 180 can be bonded to the electrode patterns 520 using heat or an ultrasonic wave or both of the heat and the ultrasonic wave. Alternatively, the bulk electrodes 180 can be bonded to the electrode patterns 520 using a solder paste.

The bulk electrodes 180 and the electrode patterns 520 can be bonded to each other by various bonding methods as described above through bonding regions 510.

Figure 14B:
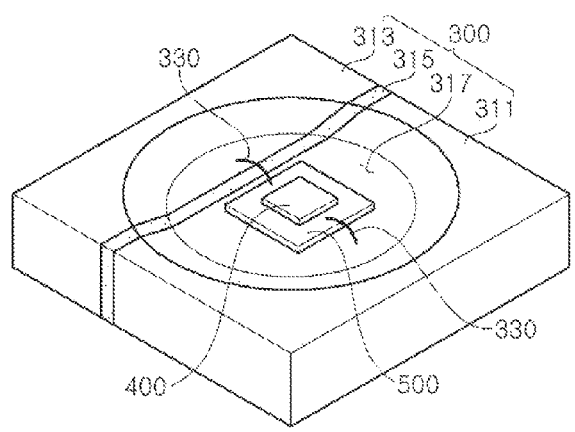
FIG. 14(b) is a perspective view of an exemplary light emitting device package according to some embodiments.

FIG. 14(b) is a perspective view for describing an exemplary light emitting device package according to some embodiments of the present disclosure.

Referring to FIG. 14(b), the light emitting device package includes a substrate 300 including a first frame 311, a second frame 313, and an insulating layer 315 disposed between the first and second frames 311 and 313, and a light emitting device 400, a sub-mount substrate 500, and wires 330 mounted in a cavity 317 formed in an upper surface of the substrate 300.

The light emitting device 400 can include the light emitting device according to the exemplary embodiments described above.

The first and second frames 311 and 313 can be or include metal frames or ceramic frames. In the case in which the first and second frames 311 and 313 are the metal frames, they can include a single metal including Al, Ag, Cu, or Ni, or the like, having excellent electrical characteristics and heat radiation characteristics, or an alloy thereof.

The insulating layer 315 can include an adhering part, and serves to fix the first and second frames 311 and 313 to both sides thereof. Power can be supplied to the light emitting device 400 by connecting pads and a power supply to each other through the wires 330.

FIGS. 15(a) to 15(f) are cross-sectional views and a plan view for describing exemplary light emitting devices and exemplary methods of manufacturing the same according to some embodiments. Exemplary embodiments of FIGS. 15(a) to 15(f) are the same as that of FIG. 13(b) except for forms of bulk electrodes 180 and insulation supports 170. Therefore, an overlapped description will be omitted.

Referring to FIGS. 15(a) to 15(f), the bulk electrodes 180 and/or the insulation supports 170 can have a multi-stage structure. For example, upper and lower portions of the bulk electrodes 180 and/or the insulation supports 170 can have different widths. In addition, the bulk electrodes 180 and/or the insulation supports 170 can be formed in a process before the wafer according to the present exemplary embodiments is divided into individual diodes.

Again referring to FIG. 15(a), the insulation supports 170 can cover portions of lower surfaces of the bulk electrodes 180. That is, the insulation supports 170 can cover the bulk electrodes 180 except for lower opening regions of the bulk electrodes 180. In the present disclosure, the bulk electrodes 180 can be disposed more adjacently to each other as compared with the related art. Therefore, at the time of mounting the light emitting device on a printed circuit board, or the like, through a solder paste, or the like, a short circuit between the bulk electrodes 180 due to the solder paste can be problematic. However, in the present exemplary embodiment, portions of the lower surfaces of the bulk electrodes 180 except for the lower opening regions of the lower surfaces of the bulk electrodes 180 are covered with the insulation supports 170, thereby making it possible to prevent the short circuit between the bulk electrodes 180 due to the solder paste. That is, concave parts exposing the lower surfaces of the bulk electrodes 180 are formed, and side walls of the concave parts are formed of the insulation supports 170, thereby making it possible to prevent the short circuit between the bulk electrodes 180.

Figure 15A:
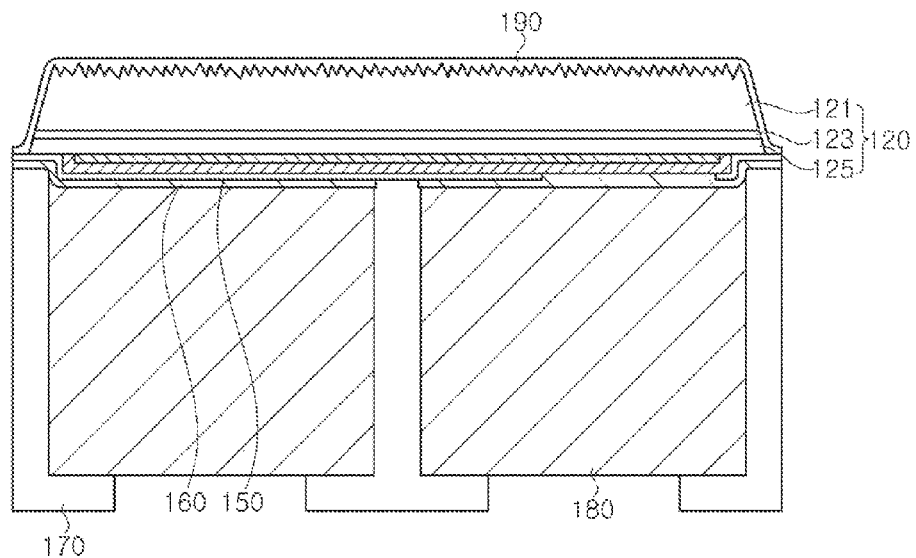
FIGS. 15(a) to 15(f) are cross-sectional views and a plan view of an exemplary light emitting devices according to some embodiments.

According to an exemplary embodiment of FIG. 15(a), the insulation supports 170 covering outer side regions of the bulk electrodes 180 can be formed by an additional process after the bulk electrodes 180 are disposed in internal regions of the insulation supports 170 by a plating technology, or the like.

Again referring to FIG. 15(b), an exemplary embodiment of FIG. 15(b) is different from that of FIG. 15(a) in that an insulation support 170 disposed between the bulk electrodes 180 is formed in a multi-stage structure in the bulk electrodes 180. In the present exemplary embodiment, both of the bulk electrodes 180 and the insulation support 170 have a multi-stage structure in which upper and lower ends thereof have different widths. According to the exemplary embodiment of FIG. 15(b), the bulk electrodes 180 are formed until before a width of the insulation support 170 disposed between the bulk electrodes 180 is changed. Then, partial regions of the bulk electrodes 180 are covered with the insulation support 170 disposed between the bulk electrodes 180. Again, the bulk electrodes 180 are formed, and outer side regions of the bulk electrodes 180 of which formation is completed are covered with the insulation supports 170, thereby making it possible to form a shape of the insulation supports 170.

Figure 15B:
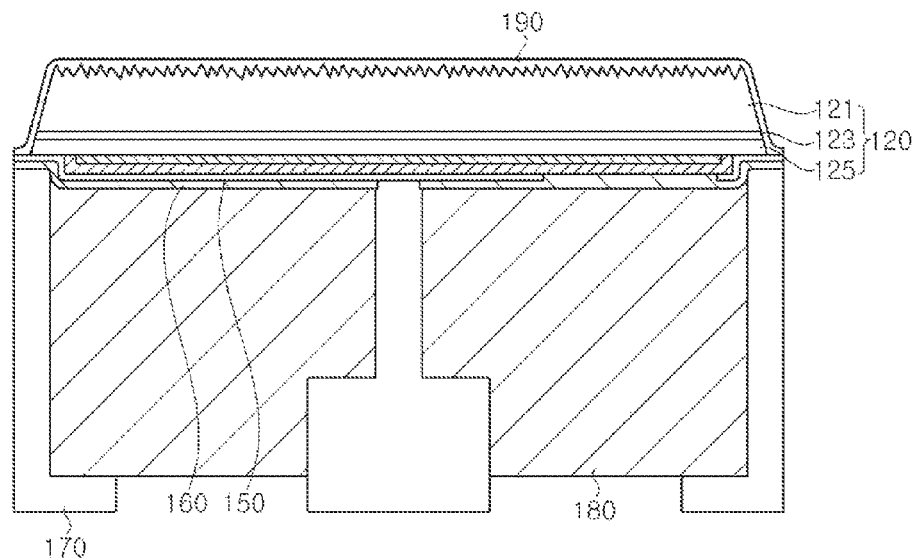

Again referring to FIG. 15(c), an exemplary embodiment of FIG. 15(c) is the same as that of FIG. 15(b) except that lower surfaces of the bulk electrodes 180 and lower surfaces of the insulation supports 170 are flat in parallel with each other. In the present exemplary embodiment, an insulation support 170 disposed in facing regions of the bulk electrodes 180 has a multi-stage structure, and bulk electrodes 180 facing each other also have a multi-stage structure.

Therefore, the short circuit between the bulk electrodes 180 due to the solder paste can be prevented without disposing the insulation supports 170 covering outer side regions of the lower surfaces of the bulk electrodes 180.

Figure 15C:
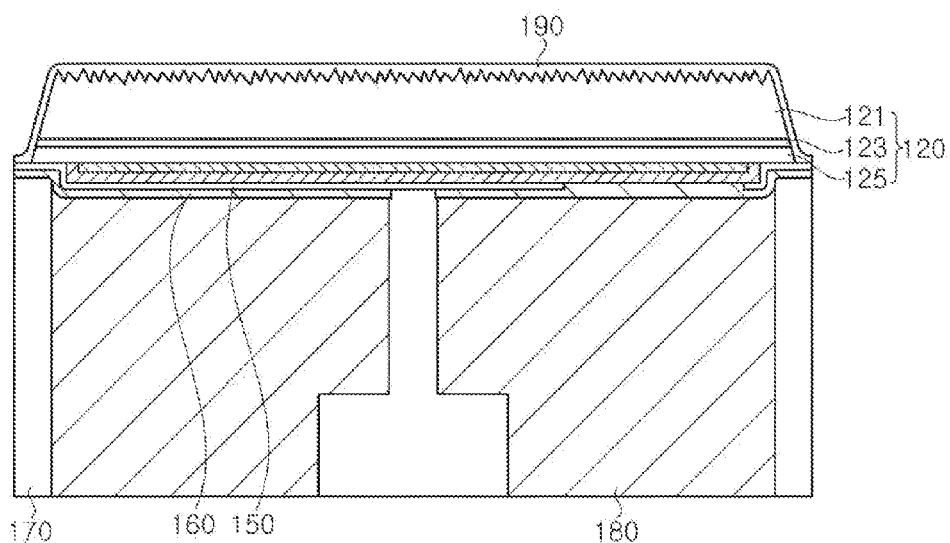

Again referring to FIG. 15(d), an exemplary embodiment of FIG. 15(d) is the same as that of FIG. 15(c) except that a width of the insulation support 170 in the bulk electrodes 180 has a gradient that is continuously increased from an upper end of the insulation support 170 toward a lower end thereof. In addition, widths of the bulk electrodes 180 can have a gradient that is continuously increased from lower ends of the bulk electrodes 180 toward upper ends thereof.

In the present exemplary embodiment, the width of the insulation support 170 disposed between the bulk electrodes 180 can be continuously increased. In order to form a shape of the insulation supports 170 according to the present exemplary embodiment, in the light emitting device according to the exemplary embodiment of the present disclosure described above, an etching process, or the like, is performed so that a groove having a gradient is formed in a region between the bulk electrodes 180 after the formation of the insulation supports 170 and the bulk electrodes 180 of which the lower surfaces are flat is completed. Then, the groove is filled with the insulation support 170, thereby making it possible to form the shape of the insulation supports 170 according to the exemplary embodiment of FIG. 15(d). Alternatively, after the bulk electrodes 180 are formed through plating, or the like, so that a groove having a gradient is formed between the bulk electrodes 180 at the time of forming the bulk electrodes 180, the groove is filled with the insulation support 170, thereby making it possible to form the shape of the insulation support 170 according to the present exemplary embodiment.

Figure 15D:
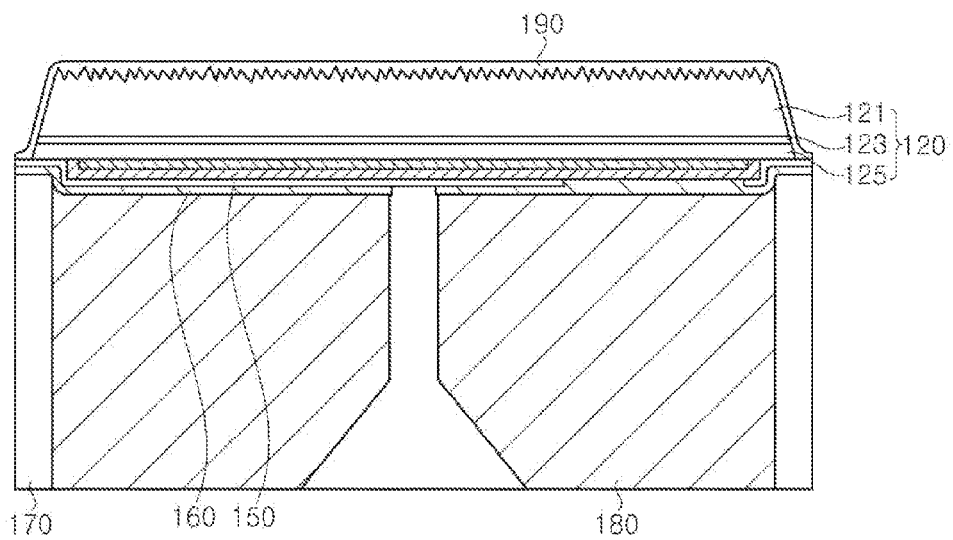

Again referring to FIG. 15(e), an exemplary embodiment of FIG. 15(e) is the same as that of FIG. 15(d) except that the insulation supports 170 cover outer side regions of the lower surfaces of the bulk electrodes 180. A shape of the insulation supports 170 according to the present exemplary embodiment can be formed through an additional process of covering the outer side regions of the lower surfaces of the bulk electrodes 180 after the shape of the insulation supports 170 according to the exemplary embodiment of FIG. 15(d) is formed.

Figure 15E:
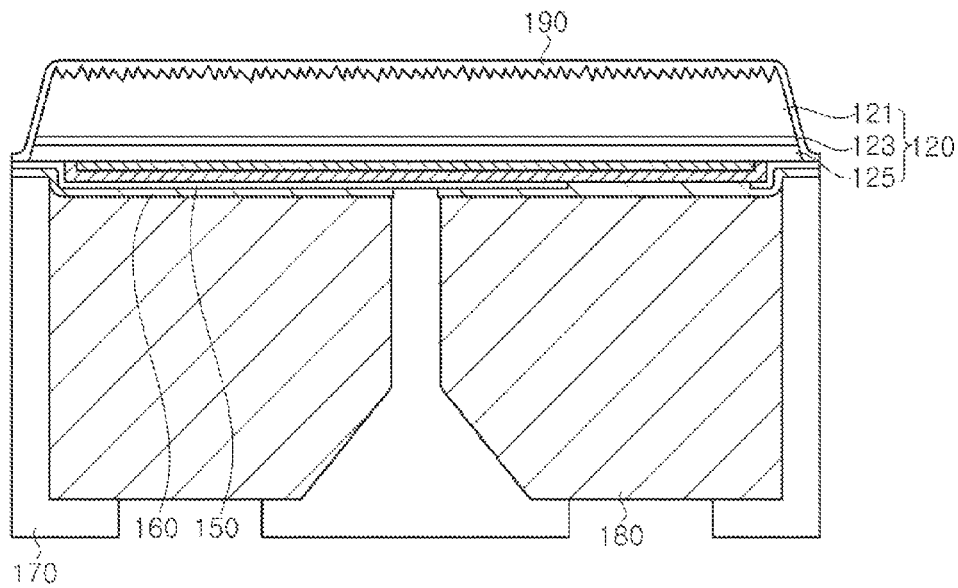

In the present disclosure, the exemplary embodiments of FIGS. 15(a), 15(b) and 15(e) have a common point in that the lower surfaces of the bulk electrodes 180 and the insulation supports 170 are not in parallel with each other, the concave parts exposing the lower surfaces of the bulk electrodes 180 are formed, and the sidewalls of the concave parts are formed of the insulation supports 170. In the present exemplary embodiments, since the solder paste can be accommodated through the concave parts to fix the light emitting device, alignment can be easily made in a surface mounting process.

Figure 15F:
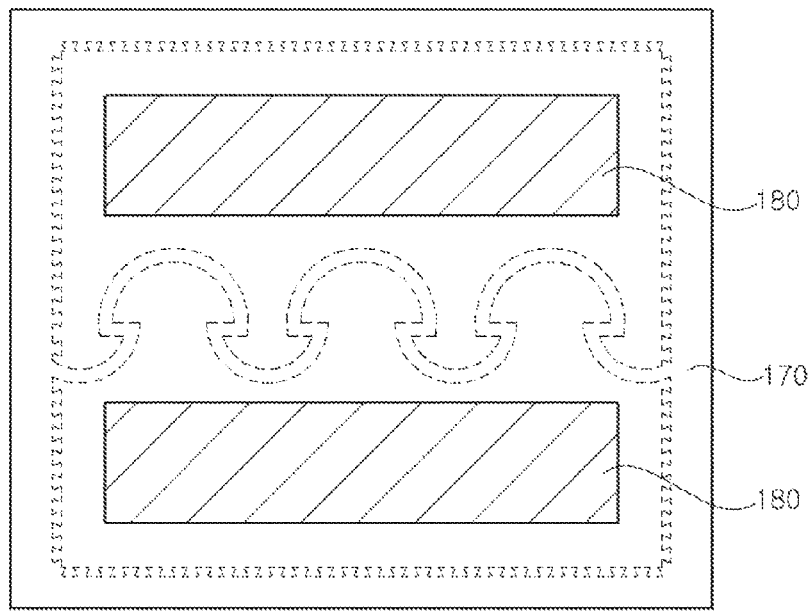

FIG. 15(f) is a plan view in which the bulk electrodes 180 are disposed to be viewed in the exemplary embodiments of FIGS. 15(a), 15(b), and 15(e). A coupling pattern below the insulation support 170 is denoted by a dotted line.

Referring to FIG. 15(f), a portion of each of the bulk electrodes 180 is exposed through the concave part of the lower surface of the insulation support 170. Each of the exposed bulk electrodes 180 can be electrically connected to electrode patterns having a positive electrode and a negative electrode.

In the present disclosure, although not illustrated, before or after the wafer is divided into unit diodes, a wavelength converting layer can be deposited or coated on the light emitting device, which is the wafer or the unit diode on which the second insulating layer 190 is formed. The wavelength converting layer can have a uniform thickness. The wavelength converting layer can contain a phosphor converting a wavelength of the light generated in the active layer 123 and a resin. The phosphor can be mixed with the resin and be randomly or uniformly disposed.

The resin can include a polymer resin such as an epoxy resin or an acryl resin, or a silicon resin, and serve as a matrix dispersing the phosphor. The phosphor can include various phosphors known in the art, and can include at least one of, for example, a garnet phosphor, an aluminate phosphor, a sulfide phosphor, an oxynitride phosphor, a nitride phosphor, a fluoride-based phosphor, or a silicate phosphor. However, the present disclosure is not limited thereto, and other implementations are also possible.

The wavelength converting layer can be deposited or coated using various methods such as aerosol, pulsed laser deposition (PLD), printing, or spin coating using spin-on-glass (SOG), and the like.

In addition, in the present disclosure, although not illustrated, an optical glass lens can be disposed on the light emitting device, which is a wafer or a unit device on which the second insulating layer 190 is formed, before or after the waver is divided into individual devices. The optical glass lens can control a beam angle of the light generated in the active layer 123. In addition, a secondary optical lens can be formed on the light emitting device using an optical glass lens having a micro lens or Fresnel lens form. The optical glass lens can adhere to the light emitting device using SOG or a transparent organic material as an adhesive. The optically transparent SOG or the transparent organic material is used, thereby making it possible to decrease light loss. Further, the optical glass lens can be formed after the above-mentioned wavelength converting layer is formed on the light emitting device.

In the present disclosure, the light emitting device can be directly mounted on the printed circuit board through the bulk electrodes 180 enclosed or surrounded by the insulation supports 170, and the side surfaces of the bulk electrodes 180 are not exposed, such that diffusion of a metal element such as tin (Sn), or the like, in the solder paste to the light emitting device can be prevented. In addition, since the insulation supports 170 and the bulk electrodes 180 included in the light emitting device according to the present disclosure can be mechanically coupled to each other in the coupling regions 175, reliability of the light emitting device can be improved. In addition, since the bulk electrodes 180 can be disposed adjacently to each other, heat radiation efficiency of the light emitting device can be improved.

Figure 16:
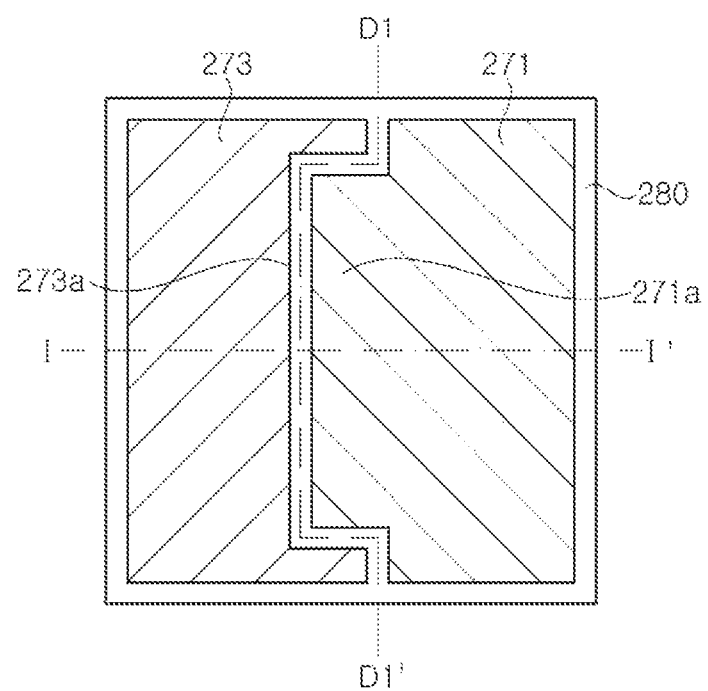
FIGS. 16 and 17 are, respectively, a plan view and a cross-sectional view for describing an exemplary light emitting device according to some embodiments.
Figure 17:
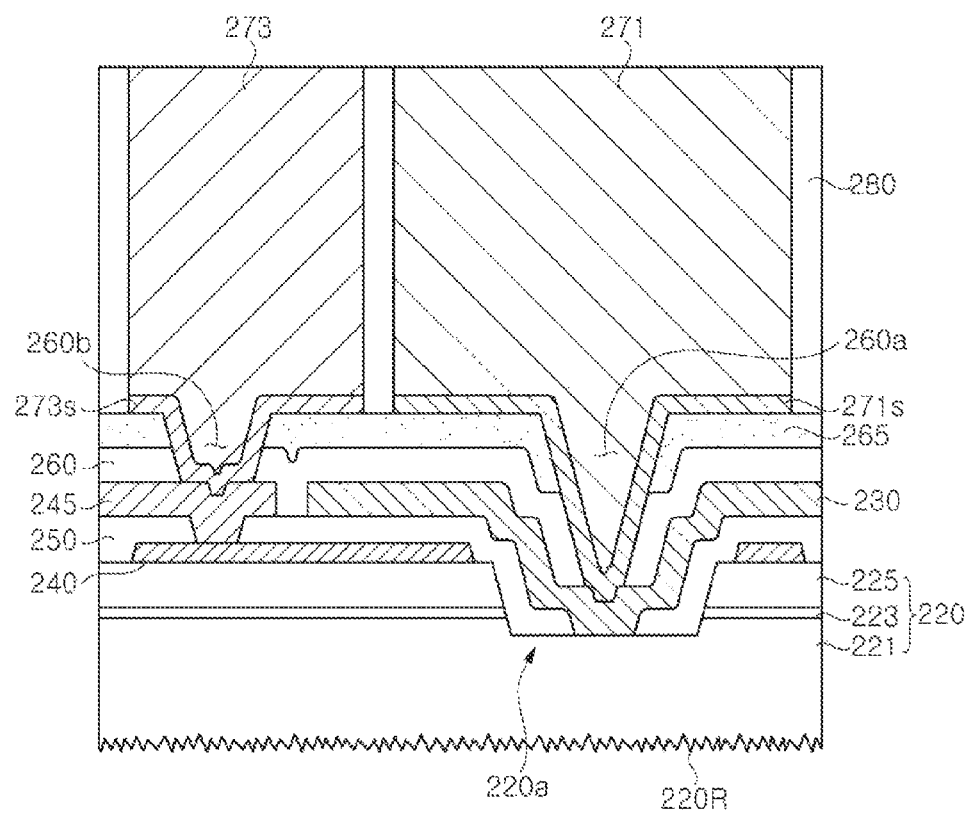

FIGS. 16 and 17 respectively show a plan view and a cross-sectional view of an exemplary light emitting device according to some embodiments of the present disclosure. FIG. 17 illustrates a cross section taken by line I-I' of FIG. 16 FIGS. 18(a) to 18(d) are plan views of light emitting devices according to some embodiments of the present disclosure.

Referring to FIGS. 16 and 17, the light emitting device includes a light emitting structure 220, a first contact electrode 230, a second contact electrode 240, insulating layers 250 and 260, first and second bulk electrodes 271 and 273, and an insulation support 280. Further, the light emitting device can further include a growth substrate (not illustrated), a connecting electrode 245, and a stress buffering layer 265.

The light emitting structure 220 includes a first conductive type semiconductor layer 221, an active layer 223 disposed on the first conductive type semiconductor layer 221, and a second conductive type semiconductor layer 225 disposed on the active layer 223. The first conductive type semiconductor layer 221, the active layer 223, and the second conductive type semiconductor layer 225 can include a III-V based compound semiconductor, for example, a nitride based semiconductor such as (Al, Ga, In)N. The first conductive type semiconductor layer 221 can include n-type impurities (for example, Si), and the second conductive type semiconductor layer 225 can include p-type impurities (for example, Mg), and vice versa. The active layer 223 can include a multi-quantum well (MQW) structure, and a composition ratio of the active layer 223 can be determined so that light having a desired peak wavelength is emitted.

In addition, the light emitting structure 220 can include a region in which the first conductive type semiconductor layer 221 is partially exposed by partially removing the second conductive type semiconductor layer 225 and the active layer 223. For example, as illustrated in FIG. 17, the light emitting structure 220 can include at least one hole 220a penetrating through the second conductive type semiconductor layer 225 and the active layer 223 to expose the first conductive type semiconductor layer 221. The number of holes 220a can also be plural, and a form and a layout of the hole 220a are not limited to those illustrated in FIG. 17. In addition, the region in which the first conductive type semiconductor layer 221 is partially exposed can also be provided by partially removing the second conductive type semiconductor layer 225 and the active layer 223 to form a mesa including the second conductive type semiconductor layer 225 and the active layer 223.

In some implementations, the light emitting structure 220 can further include a rough surface 220R formed by increasing a roughness of a lower surface thereof. The rough surface 220R can be formed by at least one of a wet etching method, a dry etching method, or an electrochemical etching method, and can be formed using, for example, a photo-electrochemical (PEC) etching method, an etching method using an etching solution including KOH and NaOH, or the like. Therefore, the light emitting structure 220 can include protrusion parts and/or concave parts formed on a surface of the first conductive type semiconductor layer 221 and having a scale of μm to nm. Light extracting efficiency of light emitted by the light emitting structure 220 can be improved by the rough surface 220R.

In some implementations, the light emitting structure 220 can further include the growth substrate (not illustrated) positioned below the first conductive type semiconductor layer 221. The growth substrate is not limited as long as the light emitting structure 220 can be grown on the growth substrate. For example, the growth substrate can be or include a sapphire substrate, a silicon carbide substrate, a silicon substrate, a gallium nitride substrate, or an aluminum nitride substrate, or the like. The growth substrate can be separated and removed from the light emitting structure 220 using various technologies.

The second contact electrode 240 can be disposed on the second conductive type semiconductor layer 225, and can form ohmic-contact the second conductive type semiconductor layer 225. In some implementations, the second contact electrode 240 can at least partially cover an upper surface of the second conductive type semiconductor layer 225, and can be disposed to generally cover the upper surface of the second conductive type semiconductor layer 225. Further, the second contact electrode 240 can be formed to cover the upper surface of the second conductive type semiconductor layer 225 as a single body in remaining regions except for a position in which the first conductive type semiconductor layer 221 of the light emitting structure 220 is exposed. Therefore, a current is uniformly supplied to the entire light emitting structure 220, such that current dispersion efficiency can be improved. However, the present disclosure is not limited thereto, and other implementations are also possible. For example, the second contact electrode 240 can also include a plurality of unit electrodes.

The second contact electrode 240 can be formed of or include a material that can form ohmic-contact with the second conductive type semiconductor layer 225, and can include, for example, a metal material and/or a conductive oxide.

When the second contact electrode 240 includes the metal material, the second contact electrode 240 can include a reflecting layer and a cover layer covering the reflecting layer. As described above, the second contact electrode 240 can serve to reflect the light while forming ohmic-contact with the second conductive type semiconductor layer 225. Therefore, the reflecting layer can include a metal that has high reflectivity and can form an ohmic-contact with the second conductive type semiconductor layer 225. For example, the reflecting layer can include Ni, Pt, Pd, Rh, W, Ti, Al, Mg, Ag, or Au or combination of thereof. In addition, the reflecting layer can include a single layer or multiple layers.

The cover layer can prevent mutual diffusion between the reflecting layer and other materials, and prevent damage to the reflecting layer due to diffusion of external other materials to the reflecting layer. Therefore, the cover layer can be formed to cover a lower surface and side surfaces of the reflecting layer. The cover layer can be electrically connected together with the reflecting layer to the second conductive type semiconductor layer 225 to serve as an electrode together with the reflecting layer. The cover layer can include, for example, Au, Ni, Ti, Cr, or the like, and include a single layer or multiple layers.

The reflecting layer and the cover layer can be formed using e-beam evaporation, or a plating scheme, or the like.

Meanwhile, in the case in which the second contact electrode 240 includes the conductive oxide, the conductive oxide can be or include ITO, ZnO, AZO, or IZO, or the like. When the second contact electrode 240 includes the conductive oxide, it is possible to increase region of the upper surface of the second conductive type semiconductor layer 225 covered by the second contact electrode 240 as compared to when the second contact electrode 240 includes the metal. A spaced distance from an edge of the region in which the first conductive type semiconductor layer 221 is exposed to the second contact electrode 240 can be relatively shorter when the second contact electrode 240 is made of or includes the conductive oxide. In this case, since the shortest distance from a portion at which the second contact electrode 240 and the second conductive type semiconductor layer 225 contact each other to a portion at which the first contact electrode 230 and the first conductive type semiconductor layer 221 contact each other can become relatively shorter, a forward voltage Vf of the light emitting device can be decreased.

This is due to a difference between manufacturing methods in the case in which the second contact electrode 240 is made of or includes the metal material and in the case in which the second contact electrode 240 is made of or includes the conductive oxide. For example, since the metal material is formed in a depositing or plating scheme, it is formed at a portion spaced apart from an outer edge of the second conductive type semiconductor layer 225 by a predetermined distance by a process margin of a mask. On the other hand, the conductive oxide is generally formed on the second conductive type semiconductor layer 225 and is then removed by the same process in an etching process of exposing the first conductive type semiconductor layer 221. Therefore, the conductive oxide can be formed to be relatively closer to the outer edge of the second conductive type semiconductor layer 225. However, the present disclosure is not limited thereto, and other implementations are also possible.

In addition, in the case in which the second contact electrode 240 includes ITO, a first insulating layer 250 includes $SiO_2$, and the first contact electrode 230 includes Ag, an omni-reflector including a stack structure of ITO/$SiO_2$/Ag can be formed.

The insulating layers 250 and 260 partially cover the first and second contact electrodes 230 and 240, and insulate the first and second contact electrodes 230 and 240 from each other. The insulating layers 250 and 260 can include the first insulating layer 250 and a second insulating layer 260. Next, the first insulating layer 250 will be first described, and a content associated with the second insulating layer 260 will be subsequently described.

The first insulating layer 250 can partially cover an upper surface of the light emitting structure 220 and the second contact electrode 240. In addition, the first insulating layer 250 can cover side surfaces of the hole 220a and partially expose the first conductive type semiconductor layer 221 exposed in the hole 220a. The first insulating layer 250 can include an opening part disposed at a portion corresponding to the hole 220a and an opening part exposing a portion of the second contact electrode 240. The first conductive type semiconductor layer 221 and the second contact electrode 240 can be partially exposed through the above-mentioned opening parts.

The first insulating layer 250 can include an insulating material, for example, $SiO_2$, $SiN_x$, or $MgF_2$, or the like. Further, the first insulating layer 250 can include multiple layers, and include a distributed Bragg reflector in which materials having different refractive indices are alternately stacked.

In the case in which the second contact electrode 240 includes a conductive oxide, the first insulating layer 250 includes the distributed Bragg reflector, thereby making it possible to improve light emitting efficiency of the light emitting device. In addition, unlike this, the second contact electrode 240 includes a conductive oxide, and the first insulating layer 250 is made of or includes a transparent insulating oxide (for example, $SiO_2$), thereby making it possible to form an omni-reflector by a stack structure of the second contact electrode 240, the first insulating layer 250, and the first contact electrode 230. In some implementations, the first contact electrode 230 is formed to substantially generally cover a surface of the first insulating layer 250 except for a region in which a portion of the second contact electrode 240 is exposed. Therefore, a portion of the first insulating layer 250 can be interposed between the first and second contact electrodes 230 and 240.

In some implementations, the first insulating layer 250 can further cover at least a portion of a side surface of the light emitting structure 220. A degree in which the first insulating layer 250 covers the side surface of the light emitting structure 220 can be changed depending on isolation in a chip unit in a process of manufacturing the light emitting device. In some implementations, the first insulating layer 250 can be formed to cover only the upper surface of the light emitting structure 220. Alternatively, in the case in which the first insulating layer 250 is formed after the wafer is isolated in a chip unit in the process of manufacturing the light emitting device, the side surface of the light emitting structure 220 can also be covered by the first insulating layer 250.

The first contact electrode 230 can partially cover the light emitting structure 220. In addition, the first contact electrode 230 ohmic-contacts the first conductive type semiconductor layer 221 through the hole 220a and the opening part of the first insulating layer 250 disposed at the portion corresponding to the hole 220a. In the present exemplary embodiment, the first contact electrode 230 can be formed to generally cover other portions except for a partial region of the first insulating layer 250. Therefore, the light can be reflected through the first contact electrode 230. In addition, the first contact electrode 230 can be electrically insulated from the second contact electrode 240 by the first insulating layer 250.

The first contact electrode 230 is formed to generally cover the upper surface of the light emitting structure 220 except for a partial region, thereby making it possible to further improve the current dispersion efficiency. In addition, since the first contact electrode 230 can cover a portion that is not covered by the second contact electrode 240, it more effectively reflects the light, thereby making it possible to improve the light emitting efficiency of the light emitting device.

As described above, the first contact electrode 230 can serve to reflect the light simultaneously with ohmic-contacting the first conductive type semiconductor layer 221. Therefore, the first contact electrode 230 can include a high reflective metal layer such as an Al layer. Here, the first contact electrode 230 can be formed of or include a single layer or multiple layers. The high reflective metal layer can be formed on an adhesion layer made of or including Ti, Cr, Ni, or the like. However, the present disclosure is not limited thereto, and other implementations are also possible. That is, the first contact electrode 230 can also include at least one of Ni, Pt, Pd, Rh, W, Ti, Al, Mg, Ag, or Au.

In some implementations, the first contact electrode 230 can also be formed to cover side surfaces of the light emitting structure 220. In the case in which the first contact electrode 230 is also formed on the side surface of the light emitting structure 220, it reflects light emitted from the active layer 223 to the side surface upwardly to increase a ratio of the light emitted to an upper surface of the light emitting device. In the case in which the first contact electrode 230 is formed to cover the side surface of the light emitting structure 220, the first insulating layer 250 can be interposed between the side surface of the light emitting structure 220 and the first contact electrode 230.

Meanwhile, the light emitting device can further include a connecting electrode 245. The connecting electrode 245 can be disposed on the second contact electrode 240, and can be electrically connected to the second contact electrode 240 through the opening part of the first insulating layer 250. Further, the connecting electrode 245 can electrically connect the second contact electrode 240 and the second bulk electrode 273 to each other. In addition, the connecting electrode 245 can be formed to partially cover the first insulating layer 250, and can be spaced apart and be insulated from the first contact electrode 230.

An upper surface of the connecting electrode 245 can be formed at a height that is substantially the same as that of an upper surface of the first contact electrode 230. In addition, the connecting electrode 245 can be formed by the same process as that of the first contact electrode 230, and the connecting electrode 245 and the first contact electrode 230 can include the same material. However, the present disclosure is not limited thereto, and other implementations are also possible. For example, the connecting electrode 245 and the first contact electrode 230 can include different materials.

The second insulating layer 260 can partially cover the first contact electrode 230, and can include a first opening part 260a partially exposing the first contact electrode 230 and a second opening part 260b partially exposing the second contact electrode 240. The number of each of the first and second opening parts 260a and 260b can be one or more.

The second insulating layer 260 can include an insulating material, for example, $SiO_2$, $SiN_x$, or $MgF_2$, or the like. Further, the second insulating layer 260 can include multiple layers, and include a distributed Bragg reflector in which materials having different refractive indices are alternately stacked. In the case in which the second insulating layer 260 is formed of or includes the multiple layers, the uppermost layer of the second insulating layer 260 can be formed of or include $SiN_x$. The uppermost layer of the second insulating layer 260 is made of $SiN_x$, thereby making it possible to more effectively prevent moisture from permeating into the light emitting structure 220.

The stress buffering layer 265 is disposed on the insulating layers 250 and 260. In some implementations, the stress buffering layer 265 can be disposed on the second insulating layer 260. The stress buffering layer 265 can at least partially cover an upper surface of the second insulating layer 260, as illustrated. In some implementations, the stress buffering layer 265 can further cover portions of side surfaces of the second insulating layer 260. In this case, the stress buffering layer 265 can contact the first contact electrode 230 and the connecting electrode 245. For example, the stress buffering layer 265 can further cover side surfaces of the first and second opening parts 260a and 260b.

The stress buffering layer 265 serves to relax stress generated at the time of driving the light emitting device. The stress buffering layer 265 can have a relatively large Young's modulus. Therefore, the stress buffering layer shows low strain behavior even at high stress. Therefore, an effect that energy is absorbed by the stress buffering layer 265 is generated, thereby making it possible to decrease stress applied to the light emitting structure 220, the first and second contact electrodes 230 and 240, the insulating layers 250 and 260, the first and second bulk electrodes 271 and 273, and the insulation support 280. The stress applied to the above-mentioned other components is relaxed by the stress buffering layer 265, such that mechanical stability of the light emitting device is improved and the possibility that a crack and a failure will be generated is decreased, thereby improving reliability of the light emitting device.

In addition, the stress buffering layer 265 can have residual stress (generated by predetermined stress) lower than that of the insulating layers 250 and 260 and/or the insulation support 280. Therefore, the stress buffering layer 265 can relax the stress applied to the above-mentioned other components by the residual stress in a process of repeatedly turning on or off the light emitting device. In addition, the stress buffering layer 265 can have a relatively excellent moisture absorbing feature. For example, a moisture absorbing feature of the stress buffering layer 265 can be lower than that of the insulation support 280. The stress buffering layer 265 has a relatively low moisture absorbing feature, thereby making it possible to prevent crack and delamination phenomenon generated by moisture permeating into the light emitting device.

Furthermore, adhesion between the stress buffering layer 265 and the insulation support 280 can be higher than that between the insulating layers 250 and 260 and the insulation support 280. Therefore, the possibility that separation or delamination will be generated on an interface can be significantly decreased in the case in which the insulation support 280 is formed on the stress buffering layer 265 as compared with in the case in which the insulation support 280 is formed on the second insulating layer 260.

The stress buffering layer 265 having the above-mentioned effect can include an insulating material showing stress relaxing behavior and having a moisture permeation preventing effect and adhesion improving effect. For example, the stress buffering layer can include at least one of polyimide, Teflon, benzocyclobutene (BCB), or parylene. In some implementations, the stress buffering layer 265 can include a photosensitive material (for example, polyimide), and in the case in which the stress buffering layer 265 includes the photosensitive material, the stress buffering layer 265 can be formed by only a process of developing the photosensitive material. Therefore, a separate additional patterning process can be omitted, such that a process of manufacturing the light emitting device can be simplified. The stress buffering layer 265 can contact the first bulk electrode 271, the second bulk electrode 273, and the insulation support 280.

A thickness of the stress buffering layer 265 is not limited as long as the stress buffering layer 265 can obtain effective stress relaxing behavior and permeation preventing effects, and can be about 2 to 30 μm. However, the present disclosure is not limited thereto, and other implementations are also possible.

The stress buffering layer 265 can be formed through depositing and patterning processes. Further, the stress buffering layer 265 and the second insulating layer 260 can be simultaneously patterned. For example, the second insulating layer 260 covering the first contact electrode 230 is formed, the stress buffering layer 265 is formed on the second insulating layer 260, and the second insulating layer 260 and the stress buffering layer 265 are simultaneously patterned, thereby making it possible to provide the stress buffering layer 265 as illustrated. However, the present disclosure is not limited thereto, and other implementations are also possible.

Meanwhile, the stress buffering layer 265 can also be omitted.

The first bulk electrode 271 and the second bulk electrode 273 can be disposed on the light emitting structure 220, and be electrically connected to the first contact electrode 230 and the second contact electrode 240, respectively. In some implementations, the first and second bulk electrodes 271 and 273 can directly or electrically connected to the first and second contact electrodes 230 and 240, respectively. Here, the first and second bulk electrodes 271 and 273 can be electrically connected to the first and second contact electrodes 230 and 240 through the first and second opening parts 260a and 260b, respectively.

The first bulk electrode 271 can include a protrusion 271a protruding from a side surface of the first bulk electrode 271 facing the second bulk electrode 273. The second bulk electrode 273 includes a concave part 273a depressed from a side surface of the second bulk electrode 273 facing the first bulk electrode 271. The protrusion part 271a and the concave part 273a are included in the first bulk electrode 271 and the second bulk electrode 273, respectively, such that a horizontal cross-sectional area of the first bulk electrode 271 can be relatively increased and a horizontal cross-sectional area of the second bulk electrode 273 can be relatively decreased. Therefore, the horizontal cross-sectional area of the first bulk electrode 271 is greater than that of the second bulk electrode 273.

In addition, a virtual line D1-D1' formed along a spaced region where the first and second bulk electrodes 271 and 273 face each other can have one or more bending portion. Although the virtual line D1-D1' having the one or more bending portions. can have corresponding shapes and layouts to those of the protrusion part 271a and the concave part 273a, the present disclosure is not limited thereto, and other implementations are also possible. A starting point and an ending point of the virtual line D1-D1' can be disposed on the same line. As illustrated, the starting point and the ending point of the virtual line D1-D1' can be substantially disposed on a line uniformly bisecting the light emitting device, and the virtual line D1-D1' is bent such that the virtual line D1-D1' can be positioned so that a portion thereof is located closer to the second bulk electrode 273.

The protrusion part 271a and the concave part 273a can be provided in a form in which they are engaged with each other. For example, as illustrated in FIG. 16, a degree in which the concave part 273a is concavely depressed and a position of the concave part 273a can substantially correspond to a degree in which the protrusion part 271a protrudes and a position of the protrusion part 271a, respectively. Therefore, a spaced distance between the first and second bulk electrodes 271 and 273 can be substantially constant.

Meanwhile, shapes of the protrusion part 271a and the concave part 273a are not limited to shapes illustrated in FIG. 16. For example, as illustrated in FIG. 18(a), a protrusion part 271a can have a varying width in a protrusion direction from the side surface of the first bulk electrode to a surface of the protrusion part 271a. In some implementations, a width of the protrusion part 271a can be decreased in the protrusion direction. The concave part 273b can also have a varying width in a depression direction from the side surface of the second bulk electrode to a surface of the concave part 273b. In some implementations, a width of the concave part 273b can be decreased in the depression direction, so as to correspond to the protrusion part 271b. Here, a virtual line D2-D2' extended along a spaced region between the first and second bulk electrodes 271 and 273 that face each other can have one or more bending portion. In addition, as illustrated in FIG. 18(b), multiple protrusion parts 271c can be formed, and one or more concave parts 273c having a shape corresponding to a protrusion shape of at least some of the plurality of protrusion parts 271c can be formed. Here, a virtual line D3-D3' extended along a spaced region between the first and second bulk electrodes 271 and 273 that face each other can have one or more bending portion, and can have bending portions more than that of an exemplary embodiment of FIG. 18(a). In addition, as illustrated in FIG. 18(c), a protrusion part 271d can have a varying width in a protrusion direction, for example, a width increased in the protrusion direction. The concave part 273d can also have a varying width in a depression direction, for example, a width decreased in the depression direction, so as to correspond to the protrusion part 271d. Here, a virtual line D4-D4' extended along a spaced region between the first and second bulk electrodes 271 and 273 that face each other can have one or more bending portions. In addition, as illustrated in FIG. 18(d), multiple protrusion parts 271e can be formed, and one or more concave parts 273e having a shape corresponding to a protrusion shape of at least some of the plurality of protrusion parts 271e can be formed. Outer sides of the protrusion part 271e and the concave part 273e can be formed in a curved shape. Here, a virtual line D5-D5' extended along a spaced region between the first and second bulk electrodes 271 and 273 that face each other can have one or more bending portions.

However, the present disclosure is not limited thereto, and other implementations are also possible. For example, shapes of the protrusion part 271a and the concave part 273a can be variously modified.

Heat is generated at the time of driving the light emitting device. However, since the insulation support 280 and the bulk electrodes 271 and 273 have different coefficients of thermal expansion, when the heat is generated, stress is applied to the insulation support 280 and the bulk electrodes 271 and 273. In some implementations, relatively greater stress is applied to a region between the first and second bulk electrodes 271 and 273, and thus, a crack can be generated in the insulation support 280, and a phenomenon that the insulation support 280 and the bulk electrodes 271 and 273 are delaminated from each other can be generated. In the case in which the region between the bulk electrodes 271 and 273 is formed in a straight line shape, the crack generated in the insulation support 280 easily propagates in a straight line direction to cause damage to the light emitting device. For example, in a virtual line defined to intersect between the bulk electrodes 271 and 273 and having a straight line shape, in the case in which the virtual line is formed to be overlapped with only the insulation support 280 without being overlapped with the bulk electrodes 271 and 273, the crack generated between the bulk electrodes 271 and 273 easily propagates along the virtual line, such that a problem that the insulation support 280 is separated is generated.

According to the present exemplary embodiment, the first bulk electrode 271 includes the protrusion part 271a, the second bulk electrode 273 includes the concave part 273a, and the virtual line D1-D1' extended along the spaced region between the first and second bulk electrodes 271 and 273 that face each other has the at least one bending portion, thereby increasing resistance to stress of the insulation support 280 of a portion between the bulk electrodes 271 and 273. In addition, even though a crack is generated in the insulation support 280 of the portion between the bulk electrodes 271 and 273, the at least one bending portion is formed between the region between the bulk electrodes 271 and 273, such that propagation of the crack can be suppressed. In some implementations, at least portions of the bulk electrodes 271 and 273 are overlapped with another virtual line connecting the starting point and the ending point of the virtual line D1-D1' to each other and having a straight line shape, thereby blocking the crack from propagating while traversing the insulation support 280 by the portions of the bulk electrodes 271 and 273 overlapped with another virtual line having the straight line shape. Therefore, even though the crack is generated in the insulation support 280, a phenomenon that the insulation support 280 is separated can be effectively prevented.

Furthermore, mechanical stability of the insulation support 280 and the bulk electrodes 271 and 273 is increased, and resistance to the stress is improved, thereby making it possible to suppress the crack or the damage from being generated in the insulation support 280 or suppress the insulation support 280 and the bulk electrodes 271 and 273 from being delaminated from each other in a process of separating the growth substrate in a process of manufacturing the light emitting device.

Therefore, the light emitting device according to the present exemplary embodiment has excellent mechanical stability. For example, the light emitting device having excellent reliability by preventing the crack and the damage of the insulation support 280 can be provided. Further, since the possibility that a defect of the light emitting device will be generated in a manufacturing process according to a structure of the light emitting device according to the present exemplary embodiment is decreased, a process yield of the light emitting device can be improved.

Furthermore, the first bulk electrode 271 includes the protrusion part 271a, such that the horizontal cross-sectional area of the first bulk electrode 271 is greater than that of the second bulk electrode 273, thereby improving the heat radiation efficiency of the light emitting device. In the case in which the first conductive type semiconductor layer 221 is an N-type semiconductor layer, the first bulk electrode 271 can also serve as an N-type electrode, and light emission and heat generation at the time of driving the light emitting device are relatively concentrated in a region in which the first bulk electrode 271 is positioned. Therefore, the horizontal cross-sectional area of the first bulk electrode 271 is formed to be greater than that of the second bulk electrode 273 like the present exemplary embodiment to make the light emission in the entire light emitting region of the light emitting device uniform, thereby making it possible to improve light emitting characteristics, and the heat is effectively radiated through the first bulk electrodes 271, thereby making it possible to improve the heat radiation efficiency of the light emitting device. Therefore, a temperature difference depending on a position of the light emitting structure 220 is minimized, thereby making it possible to improve temperature uniformity. An excessive rise in a bonding temperature Tj at a specific portion of the light emitting structure 220 is also prevented, such that a decrease in efficiency of the light emitting device can be prevented, thereby making it possible to improve reliability of the light emitting device.

Further, the spaced distance between the first and second bulk electrodes 271 and 273 is substantially constant, such that a phenomenon that a ratio of an area occupied by surfaces of the first and second bulk electrodes 271 and 273 to an upper surface of the light emitting device is decreased by the protrusion part 271a and/or the concave part 273a can be minimized. Therefore, even though the protrusion part 271a and/or the concave part 273a are formed, a decrease in the heat radiation efficiency due to a decrease in the horizontal cross-sectional areas of the first and second bulk electrodes 271 and 273 is prevented.

The first and second bulk electrodes 271 and 273 can have a thickness of several tens of micrometers or more, for example, about 70 to 80 μm. The bulk electrodes 271 and 273 have the thickness in the above-mentioned range, such that the light emitting device itself can be used in a chip scale package.

The first and second bulk electrodes 271 and 273 can be formed of or include a single layer or multiple layers, and can include a material having electrical conductivity. For example, each of the first and second bulk electrodes 271 and 273 can include Cu, Pt, Au, Ti, Ni, Al, or Ag, or the like. In some implementations, the first and second bulk electrodes 271 and 273 can also include metal particles having a sintered form and a non-metal material interposed between the metal particles. The first and second bulk electrodes 271 and 273 can be formed using a plating method, a depositing method, a dotting method, or a screen printing method, or the like. Meanwhile, the first and second bulk electrodes 271 and 273 can include first and second metal layers 271s and 273s, respectively. The first and second metal layers 271s and 273s can be positioned below the first and second bulk electrodes 271 and 273, respectively, to contact the contact electrodes 230 and 240, the insulating layers 250 and 260, and the stress buffering layer 265. The first and second metal layers 271s and 273s can be changed depending on a method of forming the bulk electrodes 271 and 273, which will be described in detail below.

The case in which the first and second bulk electrodes 271 and 273 are formed using the plating method will be first described. A seed metal is formed on an entire surface of the stress buffering layer 265, the first opening part 260a, and the second opening part 260b by a method such as a sputtering method. The seed metal can include Ti, Cu, Au, or Cr, or the like, and serve as an under bump metallization (UBM) layer. For example, the seed metal can have a stack structure of Ti/Cu. Then, a mask is formed on the seed metal. The mask masks a portion corresponding to a region in which the insulation support 280 is formed and opens regions in which the first and second bulk electrodes 271 and 273 are formed. Next, the first and second bulk electrodes 271 and 273 are formed in the open regions of the mask through a plating process. Then, the mask and the seed metal are removed through an etching process, such that first and second bulk electrodes 271 and 273 can be provided. Here, the seed metals remaining below the first and second bulk electrodes 271 and 273 without being removed become the first and second metal layers 271s and 273s.

The case in which the first and second bulk electrodes 271 and 273 are formed using the screen printing method will be described. A UBM layer is formed on at least portions of the stress buffering layer 265, the first opening part 260a, and the second opening part 260b through a depositing and patterning method such as a sputtering method or a depositing and lift-off method. The UBM layer can be formed on regions in which the first and second bulk electrodes 271 and 273 are to be formed, and can include a (Ti or TiW) layer and a single layer including Cu, Ni, or Au or a combination layer thereof. For example, the UBM layer can have a stack structure of Ti/Cu. The UBM layer corresponds to the first and second metal layers 271s and 273s. Then, a mask is formed. The mask masks a portion corresponding to a region in which the insulation support 280 is formed and opens regions in which the first and second bulk electrodes 271 and 273 are formed. Then, a material such as an Ag paste, an Au paste, or a Cu paste is formed in the open regions through a screen printing process and is hardened. Next, the mask is removed through an etching process, such that the first and second bulk electrodes 271 and 273 can be provided.

The insulation support 280 is disposed on the light emitting structure 220, and at least partially covers side surfaces of the bulk electrodes 271 and 273. The insulation support 280 has an electrical insulating property, and covers the side surfaces of the first and second bulk electrodes 271 and 273 to effectively insulate the first and second bulk electrodes 271 and 273 from each other. At the same time, the insulation support 280 can serve to support the first and second bulk electrodes 271 and 273. The insulation support 280 can include a material such as an epoxy molding compound or a Si resin. In addition, the insulation support 280 can include light-reflective or light scattering particles such as $TiO_2$ particles. For example, in the case in which the insulation support 280 includes the EMC, the stress buffering layer 265 can prevent the insulation support 280 from being separated and prevent the moisture from permeating into the insulation support 280, as described above.

In some exemplary embodiments, unlike a form illustrated, the insulation support 280 can also cover the side surface of the light emitting structure 220. In this case, an angle of the light emitted from the light emitting structure 220 can be changed. For example, in the case in which the insulation support 280 further covers at least a portion of the side surface of the light emitting structure 220, some of the light emitted to the side surface of the light emitting structure 220 can be reflected toward the lower surface of the light emitting structure 220. As described above, a region in which the insulation support 280 is disposed is adjusted, thereby making it possible to adjust an angle of the light emitted by the light emitting device.

Figure 19:
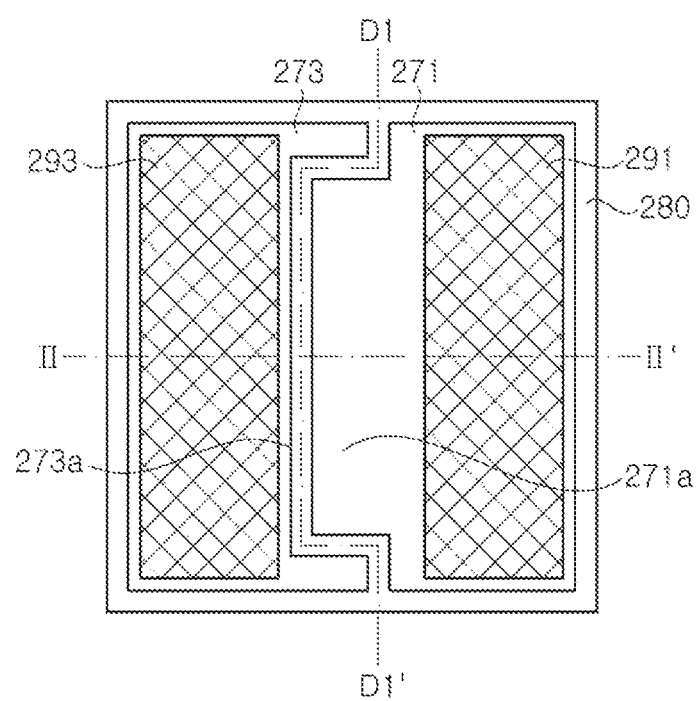
FIGS. 19 and 20 are, respectively, a plan view and a cross-sectional view of an exemplary light emitting device according to some embodiments.
Figure 20:
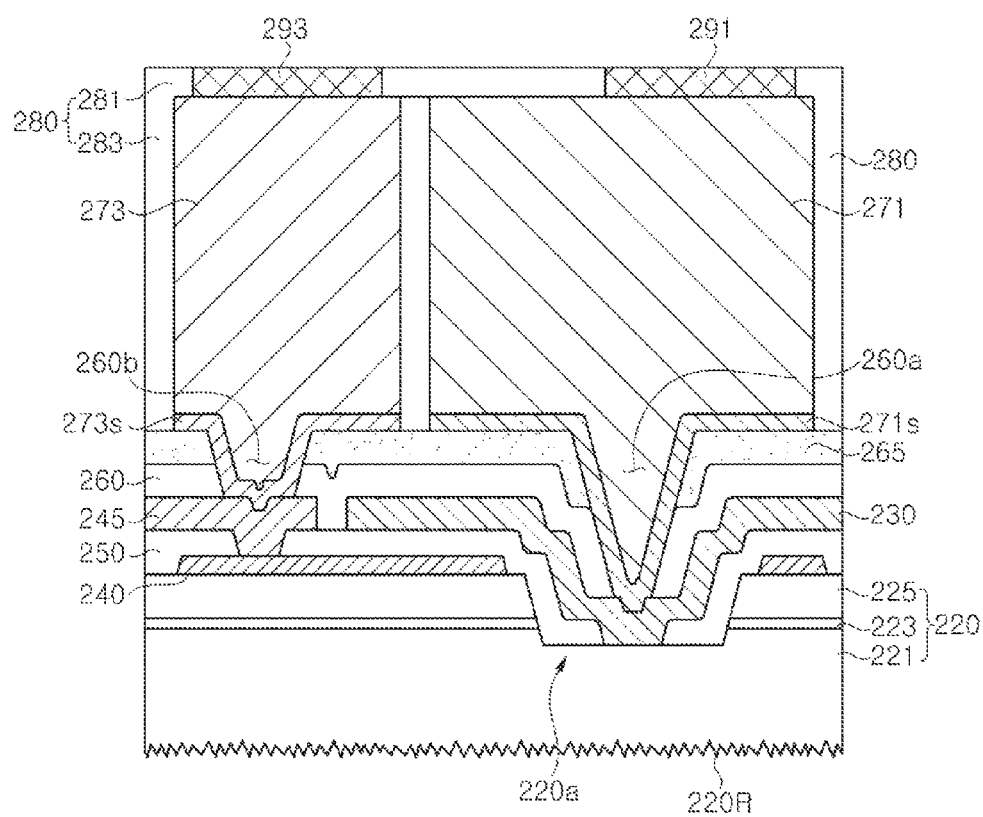

FIGS. 19 and 20 are, respectively, a plan view and a cross-sectional view for describing an exemplary light emitting device according to some embodiments of the present disclosure. FIG. 20 illustrates a cross section of a portion corresponding to line II-II' of FIG. 19.

The light emitting device of FIGS. 19 and 20 is different from the light emitting device of FIGS. 16 and 17 in that an insulation support 280 includes an upper insulation support 281 and a lower insulation support 283 and the light emitting device further includes pad electrodes 291 and 293. Hereinafter, the light emitting device according to the present exemplary embodiment will be described based on this difference, and a detailed description for overlapped configurations will be omitted.

Referring to FIGS. 19 and 20, the light emitting device includes a light emitting structure 220, a first contact electrode 230, a second contact electrode 240, insulating layers 250 and 260, first and second bulk electrodes 271 and 273, the insulation support 280, and first and second pad electrodes 291 and 293. Further, the light emitting device can further include a growth substrate (not illustrated), a connecting electrode 245, and a stress buffering layer 265.

The insulation support 280 is disposed on the light emitting structure 220, and at least partially covers side surfaces of the bulk electrodes 271 and 273 and upper surfaces of the bulk electrodes 271 and 273. In addition, the insulation support 280 can include opening parts partially exposing the upper surfaces of the first and second bulk electrodes 271 and 273. The insulation support 280 can include the upper insulation support 281 and the lower insulation support 283. The lower insulation support 283 can enclose the side surfaces of the bulk electrodes 271 and 273, and the upper insulation support 281 can partially cover the upper surfaces of the bulk electrodes 271 and 273. In addition, the upper insulation support 281 can cover an interface between the lower insulation support 283 and the bulk electrodes 271 and 273.

The insulation support 280 has an electrical insulating property, and covers the side surfaces of the first and second bulk electrodes 271 and 273 to effectively insulate the first and second bulk electrodes 271 and 273 from each other. At the same time, the insulation support 280 can serve to support the first and second bulk electrodes 271 and 273.

The upper surfaces of the bulk electrodes 271 and 273 are partially covered by the upper insulation support 281, such that areas of exposed portions in the upper surfaces of the first and second bulk electrodes 271 and 273 can be smaller than a horizontal cross-sectional area of the first bulk electrode 271 and a horizontal cross-sectional area of the second bulk electrode 273, respectively. Particularly, the upper insulation support 281 can be disposed on the upper surfaces of the bulk electrodes 271 and 273 in the vicinity of side surfaces of the first and second bulk electrodes 271 and 273 facing each other. Therefore, a spaced distance between the upper surface of the first bulk electrode 271 and the upper surface of the second bulk electrode 273 exposed by the opening part of the upper insulation support 281 is greater than that between the first and second bulk electrodes 271 and 273.

In more detail, a conductive material (for example, a solder, a conductive adhesive, or an eutectic material, or the like) is formed between the exposed upper surfaces 271a and 273a and a separate substrate to allow the light emitting device and the separate substrate to adhere to each other, thereby making it possible to mount the light emitting device on the separate substrate. In order to prevent an electrical short circuit from being generated between the bulk electrodes 271 and 273 due to the conductive material formed for adhesion, it is required for the spaced distance between the exposed upper surfaces to become a predetermined numerical value or more, as described above. According to the present disclosure, the insulation support 280 is formed to partially cover the upper surfaces of the bulk electrodes 271 and 273, such that the spaced distance between the exposed upper surface of the first bulk electrode 271 and the exposed upper surface of the second bulk electrode 273 can be formed to be greater than that between the first and the second bulk electrodes 271 and 273. Therefore, the spaced distance between the exposed upper surfaces can be formed to be a predetermined numerical value or more enough to prevent the generation of the electrical short circuit between the bulk electrodes 271 and 273, and the spaced distance between the bulk electrodes 271 and 273 can be formed to be the predetermined numerical value or less enough to prevent the generation of the electrical short circuit between the bulk electrodes 271 and 273. Therefore, the heat radiation efficiency of the light emitting device can be improved, and the generation of the electrical short circuit in a process of mounting the light emitting device can be effectively prevented.

The spaced distance between the exposed upper surface of the first bulk electrode 271 and the exposed upper surface of the second bulk electrode 273 is not limited, but can be about 250 µm or more in the case of mounting the light emitting device on the separate substrate through soldering and can be about 80 µm or more in the case of mounting the light emitting device on the separate substrate through a eutectic bonding process. However, the present disclosure is not limited thereto, and other implementations are also possible.

In addition, it is sufficient that the upper insulation support 281 is disposed in upper peripheral regions of the side surfaces of the bulk electrodes 271 and 273 facing each other so that the spaced distance between the exposed upper surface of the first bulk electrode 271 and the exposed upper surface of the second bulk electrode 273 is formed to be the predetermined numerical value or more, and a form in which the upper insulation support 281 is disposed in other regions is not limited. For example, as illustrated in FIGS. 19 and 20, the insulation support 280 disposed between the first and second bulk electrodes 271 and 273 can have a 'T' shaped cross section, and the insulation support 280 covering outer side surfaces of the first and second bulk electrodes 271 and 273 can have a '⌐' shaped cross section.

In addition, the insulation support 280 and the bulk electrodes 271 and 273 can be formed of or include different materials. In some implementations, the insulation support 280 can include an insulating polymer and/or an insulating ceramic, and the bulk electrodes 271 and 273 can include a metal material. Therefore, delamination or a crack can be generated on an interface between the insulation support 280 and the bulk electrodes 271 and 273, and damage due to stress and strain that can be caused by bonding different materials to each other can be generated. When the insulation support 280 and/or the bulk electrodes 271 and 273 are damaged, the light emitting structure 220 can be polluted, and the crack, or the like, can be generated in the light emitting structure 220, such that reliability of the light emitting device can be decreased. According to the exemplary embodiments of the present disclosure, the insulation support 280 is formed to partially cover the side surfaces of the bulk electrodes 271 and 273 and the upper surfaces of the bulk electrodes 271 and 273, mechanical stability between the insulation support 280 and the bulk electrodes 271 and 273 can be improved. Therefore, reliability of the light emitting device can be improved.

In addition, mechanical stability of the light emitting device is improved, thereby making it possible to prevent the light emitting structure 220 from being damaged in the process of separating the growth substrate (not illustrated) from the light emitting structure 220.

Further, the lower insulation support 283 and the upper insulation support 281 can be formed of or include the same material or different materials. In the case in which the lower insulation support 283 and the upper insulation support 281 are made of or include the same material, the insulation support 280 can include a material such as an epoxy molding compound (EMC) or a Si resin. In addition, the insulation support 280 can include light-reflective and light scattering particles such as $TiO_2$ particles. In the case in which the lower insulation support 283 and the upper insulation support 281 are made of or include different materials, the upper insulation support 281 can be formed of or include a material having brittleness and/or a moisture absorbing feature lower than those of a material of the lower insulation support 283. For example, the lower insulation support 283 can include a material such as an epoxy molding compound (EMC) or a Si resin, and the upper insulation support 281 can include a material such as a photo-resist PR and/or a photo-solder-resist (PSR).

The upper insulation support 281 is made of or includes the material having the relatively lower brittleness, such that the possibility that a failure or a crack will be generated is lower as compared with the lower insulation support 283, thereby making it possible to prevent an external pollutant from permeating through an interface between the lower insulation support 283 and the bulk electrodes 271 and 273.

In addition, the upper insulation support 281 is made of or includes the material having the relatively lower moisture absorbing feature, thereby making it possible to prevent an external pollutant from permeating through the interface between the lower insulation support 283 and the bulk electrodes 271 and 273. For example, in the case in which the lower insulation support 283 is made of or includes a material having a high moisture absorbing feature, such as an EMC, the light emitting device can be more effectively protected from moisture by the upper insulation support 281 made of or including the material such as the PSR. In some implementations, in the case in which the upper insulation support 281 is formed to cover the interface between the lower insulation support 283 and the bulk electrodes 271 and 273, the light emitting device protecting function described above can be more effectively fulfilled.

Meanwhile, an area of the exposed upper surface 271a of the bulk electrode 271 can be smaller than that of a region in which the first bulk electrode 271 and the first contact electrode 230 contact each other, and an area of the exposed upper surface 273a of the second bulk electrode 273 can be greater than that of a region in which the second bulk electrode 273 and the second contact electrode 240 contact each other. In this case, the horizontal cross-sectional area of the first bulk electrode 271 can be greater than that of the second bulk electrode 273.

The first and second pad electrodes 291 and 293 can be disposed on the first and second bulk electrodes 271 and 273, respectively, and be filled in the opening parts of the insulation support 280 partially exposing the upper surfaces of the first and second bulk electrodes 271 and 273. Therefore, the first and second pad electrodes 291 and 293 can cover the exposed surfaces of the first and second bulk electrodes 271 and 273, respectively. Therefore, a spaced distance between the first and second pad electrodes 291 and 293 can correspond to those of the exposed upper surfaces of the first and second bulk electrodes 271 and 273.

In addition, as illustrated, upper surfaces of the first and second pad electrodes 291 and 293 can be positioned to be substantially flush with the upper surface of the insulation support 280. In this case, the upper surface of the light emitting device can be formed to be substantially flat. In addition, the upper surfaces of the first and second pad electrodes 291 and 293 can have substantially the same area. Therefore, electrical connection portions exposed on a mounting surface of the light emitting device can be formed to have the same area, such that a mounting process can become easy.

The first and second pad electrodes 291 and 293 can be formed using a method such as a plating method, or the like, so as to be filled in the opening parts of the insulation support 280. Then, the first and second pad electrodes 291 and 293 and the insulation support 280 are partially removed using physical and/or chemical methods, for example, a lapping method, or a chemical mechanical polishing (CMP) method, or the like, such that the upper surfaces of the first and second pad electrodes 291 and 293 can be formed to be flush with the upper surface of the insulation support 280.

The first and second pad electrodes 291 and 293 can include a conductive material, for example, a metal material, for example, Ni, Pt, Pd, Rh, W, Ti, Al, Au, Sn, Cu, Ag, Bi, In, Zn, Sb, Mg, or Pb, or the like. The first and second pad electrodes 291 and 293 can include a material that is substantially the same as that of the bulk electrodes 271 and 273, and can be formed of or include different materials. The first and second pad electrodes 291 and 293 can be formed using a depositing method or a plating method, for example, an electroless plating method.

The light emitting device further includes the first and second pad electrodes 291 and 293, such that the upper surface (that can be a surface of the light emitting device mounted on the separate substrate) of the light emitting device can be formed to be substantially flat. Therefore, a process of mounting the light emitting device on the separate substrate can become easy.

Figure 21:
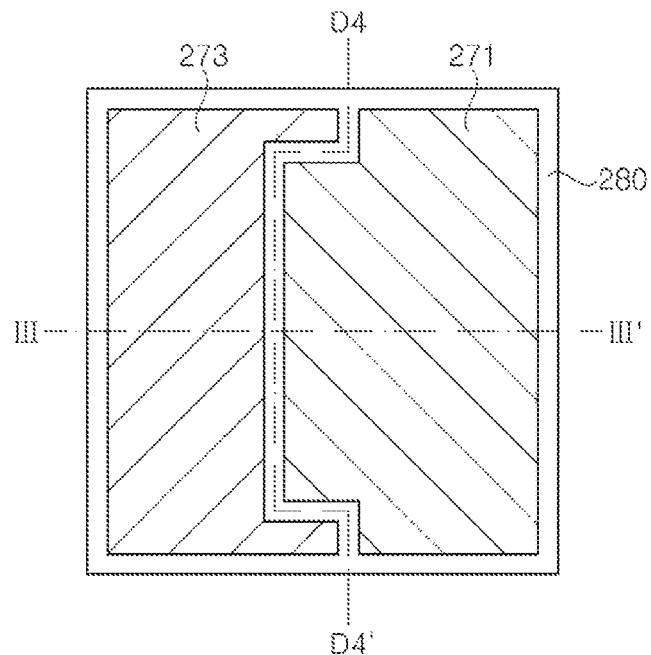
FIGS. 21 and 22 are, respectively, a plan view and a cross-sectional view for describing an exemplary light emitting device according to some embodiments.
Figure 22:
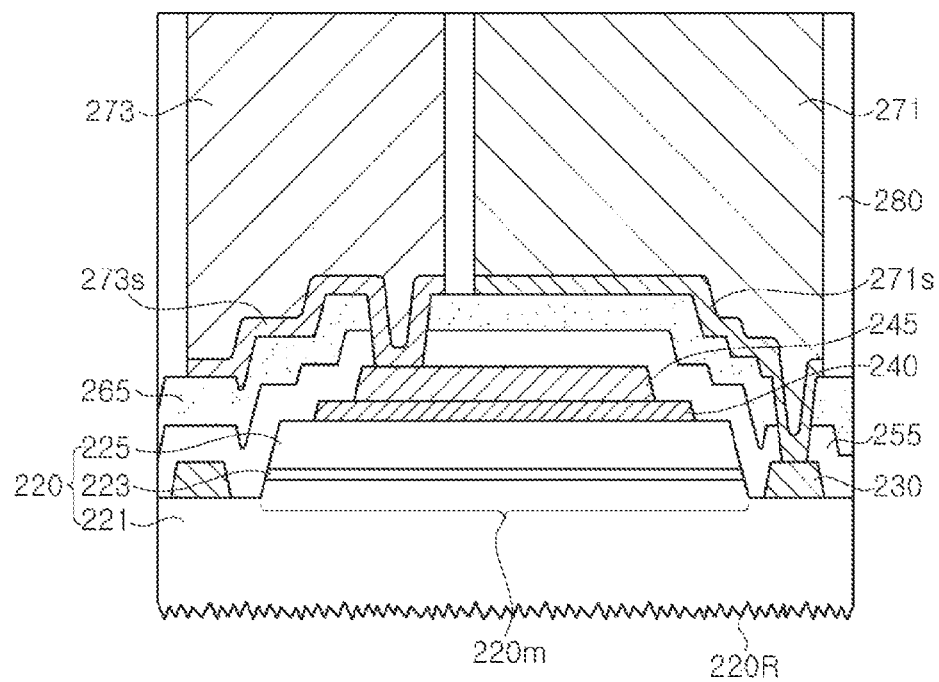

FIGS. 21 and 22 are, respectively, a plan view and a cross-sectional view for describing an exemplary light emitting device according to some embodiments of the present disclosure. FIG. 22 illustrates a cross section of a portion corresponding to line III-III' of FIG. 21.

The light emitting device of FIGS. 21 and 22 is different in structures of a first contact electrode 230 and an insulating layer 255 from the light emitting device of FIGS. 16 and 17. Hereinafter, the light emitting device according to the present exemplary embodiment will be described based on this difference, and a detailed description for overlapped configurations will be omitted.

Referring to FIGS. 21 and 22, the light emitting device includes a light emitting structure 220, a first contact electrode 230, a second contact electrode 240, insulating layers 250 and 260, first and second bulk electrodes 271 and 273, and an insulation support 280. Further, the light emitting device can further include a growth substrate (not illustrated), a connecting electrode 245, and a stress buffering layer 265.

The light emitting device includes a light emitting structure 220. The light emitting structure 220 includes a region in which a first conductive type semiconductor layer 221 is exposed by partially removing a second conductive type semiconductor layer 225 and an active layer 223. The first conductive type semiconductor layer 221 is exposed, such that the light emitting structure 220 can have a mesa 220m including the second conductive type semiconductor layer 225 and the active layer 223. A position of the mesa 220m is not limited. For example, as illustrated, the mesa 220m can be at least partially enclosed by a region in which the first conductive type semiconductor layer 221 is exposed.

The first contact electrode 230 can be disposed on a region in which the first conductive type semiconductor layer 221 is exposed, and can ohmic-contact the first conductive type semiconductor layer 221. In some implementations, unlike the exemplary embodiment of FIGS. 11 and 12, the first contact electrode 230 is disposed in a region in which the first conductive type semiconductor layer 221 is exposed. Therefore, the first and second contact electrodes 230 and 240 can be spaced apart from each other.

The insulating layer 225 partially covers the first and second contact electrodes 230 and 240, and includes first and second opening parts 255a and 255b partially exposing the first and second contact electrodes 230 and 240, respectively. According to the present exemplary embodiment, since the first contact electrode 230 is disposed in the region in which the first conductive type semiconductor layer 221 is exposed, the insulating layer 255 cannot be formed in a form in which it is interposed between the first and second contact electrodes 230 and 240. In addition, since the insulating layer 255 can be formed by performing a process once without being separated into the first and second insulating layers, a process of manufacturing the light emitting device can be further simplified. In some implementations, in the case in which the insulating layer is divided into the first and second insulating layers, it is required to perform a mask pattern forming process for patterning the respective insulating layers at least twice or more. On the other hand, in the case of the present exemplary embodiment, the insulating layer 255 is formed of or includes a single insulating layer 255, such that the mask pattern forming process can be omitted at least once or more.

Meanwhile, the connecting electrode 245 can be disposed on the second contact electrode 240. In addition, side surfaces of the connecting electrode 245 can be covered by the insulating layer 255. According to the present exemplary embodiment, since the insulating layer 255 is formed of or includes the single insulating layer 255, the connecting electrode 245 can be positioned below the insulating layer 255.

However, in the present exemplary embodiment, the meaning that the insulating layer 255 is formed of the single insulating layer 255 is not limited to that the insulating layer 255 is formed of a single layer. Thus, the insulating layer 255 can be formed of or include multiple layers.

Figure 23A:
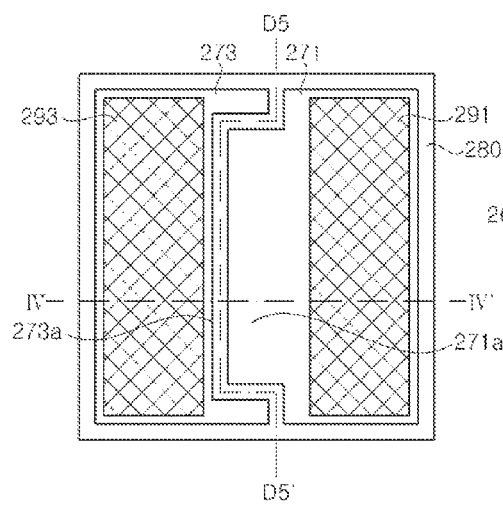
FIGS. 23(a), 23(b) and FIG. 24 show plan views and a cross-sectional view for describing an exemplary light emitting device according to some embodiments.
Figure 23B:
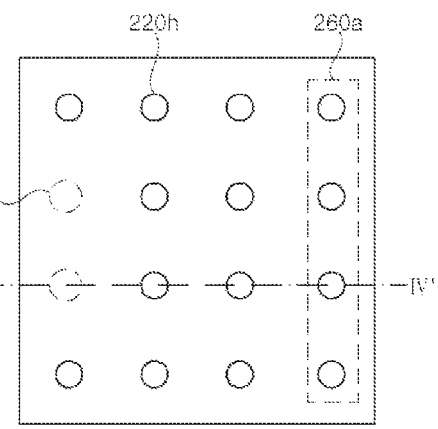
Figure 24:
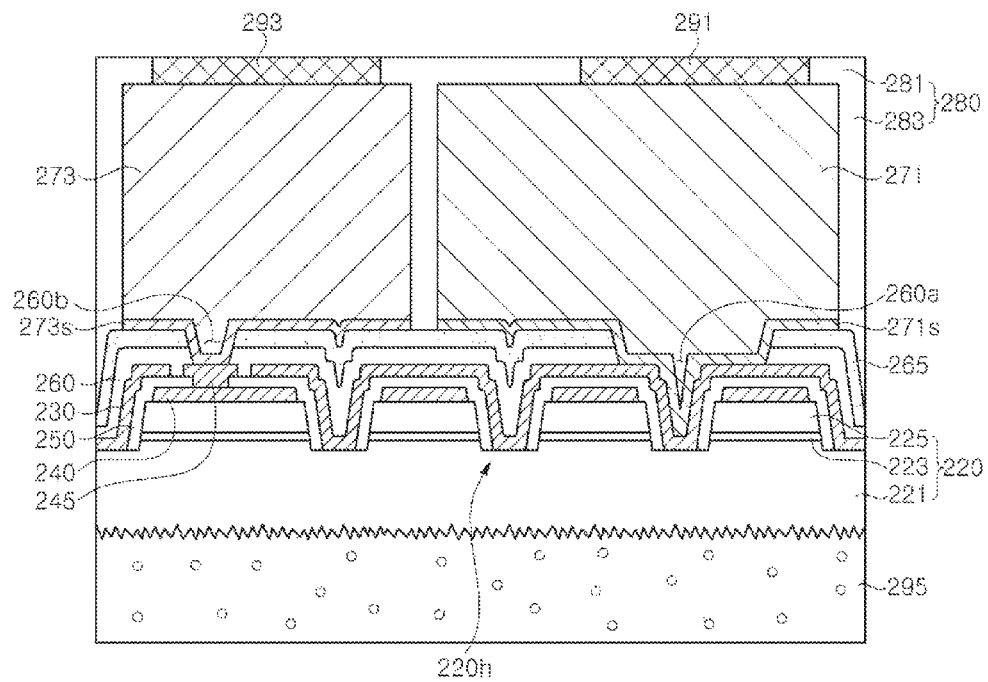

FIGS. 23(a) and 23(b) and FIG. 24 are, respectively, plan views and a cross-sectional view for describing an exemplary light emitting device according to some embodiments of the present disclosure.

The light emitting device according to the present exemplary embodiment is different in a structure of the light emitting structure 220 from the light emitting device of FIGS. 11 and 12, and is also different from the light emitting device of FIGS. 16 and 17 in that it further includes a wavelength converting unit 295 and first and second pad electrodes 291 and 293. Therefore, the light emitting device according to the present exemplary embodiment is different in mutual structure relationships between other configurations, or the like, from the light emitting device of FIGS. 16 and 17. Next, these differences will be mainly described in detail. A detailed description for the same configuration will be omitted.

FIG. 23(a) is a plan view of the light emitting device according to the present exemplary embodiment, FIG. 23(b) is a plan view for describing positions of holes 220h, and positions of first and second opening parts 260a and 260b, and FIG. 24 is a cross-sectional view illustrating a cross section of a region corresponding to line IV-IV' of FIGS. 23(a) and 23(b).

Referring to FIGS. 23(a), 23(b) and 24, the light emitting device includes a light emitting structure 220, a first contact electrode 230, a second contact electrode 240, insulating layers 250 and 260, a stress buffering layer 265, first and second bulk electrodes 271 and 273, and an insulation support 280. Further, the light emitting device can further include a growth substrate (not illustrated), a wavelength converting unit 295, first and second pad electrodes 291 and 293, and a stress buffering layer 265.

The light emitting structure 220 can include a region in which a first conductive type semiconductor layer 221 is partially exposed by partially removing a second conductive type semiconductor layer 225 and an active layer 223. For example, as illustrated, the light emitting structure 220 can include a plurality of holes 220h penetrating through the second conductive type semiconductor layer 225 and the active layer 223 to expose the first conductive type semiconductor layer 221. The holes 220h can be substantially regularly positioned over the entire light emitting structure 220. However, the present disclosure is not limited thereto, and other implementations are also possible. That is, a form of the holes 220h and the number of holes 220h can be variously modified.

In addition, a form in which the first conductive type semiconductor layer 221 is exposed is not limited to a form such as the hole 220h. For example, the region in which the first conductive type semiconductor layer 221 is exposed can be formed in a form such as lines, a combined holes and lines, or the like.

The second contact electrode 240 can be disposed on the second conductive type semiconductor layer 225 and ohmic-contact the second conductive type semiconductor layer 225. The second contact electrode 240 can be disposed to generally cover an upper surface of the second conductive type semiconductor layer 225, and can be disposed to almost completely cover the upper surface of the second conductive type semiconductor layer 225. The second contact electrode 240 can be formed of or include a single body over the entire light emitting structure 220. In this case, the second contact electrode 240 can include opening regions corresponding to positions of the plurality of holes 220h. Therefore, a current is uniformly supplied to the entire light emitting structure 220, such that current dispersion efficiency can be improved.

However, the present disclosure is not limited thereto, and other implementations are also possible. For example, the second contact electrode 240 can also be formed of a plurality of units.

The first insulating layer 250 can partially cover an upper surface of the light emitting structure 220 and the second contact electrode 240. The first insulating layer 250 can cover side surfaces of the plurality of holes 220h, and include opening parts partially exposing the first conductive type semiconductor layer 221 disposed on lower surfaces of the holes 220h. Therefore, the opening parts can be positioned to correspond to positions of the plurality of holes 220h. In addition, the first insulating layer 250 can include opening parts exposing portions of the second contact electrode 240. Further, the first insulating layer 250 can further cover at least a portion of a side surface of the light emitting structure 220.

The first contact electrode 230 can partially cover the light emitting structure 220, and ohmic-contact the first conductive type semiconductor layer 221 through the holes 220h and the opening parts of the first insulating layer 250 that are disposed at portions corresponding to the holes 220h. In some implementations, the first contact electrode 230 can also be formed to cover side surfaces of the light emitting structure 220.

The second insulating layer 260 can partially cover the first contact electrode 230, and can include a first opening part 260a partially exposing the first contact electrode 230 and a second opening part 260b partially exposing the second contact electrode 240. Each of the first and second opening parts 260a and 260b can be formed in plural. In some implementations, the opening parts 260a and 260b can be positioned to be closer toward opposing side surfaces.

The stress buffering layer 265 can be disposed on the second insulating layer 260.

The first bulk electrode 271 and the second bulk electrode 273 can be disposed on the light emitting structure 220, and be electrically connected to the first contact electrode 230 and the second contact electrode 240, respectively. The insulation support 280 is disposed on the light emitting structure 220, and at least partially covers side surfaces of the bulk electrodes 271 and 273. In addition, the first and second pad electrodes 291 and 293 can be disposed on the first and second bulk electrodes 271 and 273, respectively. Since a description for the insulation support 280 and the first and second pad electrodes 291 and 293 is substantially the same as the description provided with reference to FIGS. 19 and 20, a detailed description for the insulation support 280 and the first and second pad electrodes 291 and 293 will be omitted.

The wavelength converting unit 295 can be disposed on a lower surface of the light emitting structure 220. The light emitting device that can implement various colors of light by changing a wavelength of the light emitted from the light emitting structure 220 by the wavelength converting unit 210 can be provided. In addition, the wavelength converting unit 210 can be formed not only on the lower surface of the light emitting structure 220, but also extended to side surfaces of the light emitting structure 220, and can be further extended to side surfaces of the insulation support 280.

The wavelength converting unit 295 can include a material that can convert a wavelength of the light. For example, the wavelength converting unit 295 can be provided in a form in which phosphors are dispersed in a carrier, be provided in a single crystalline phosphor sheet form, or be provided in a form in which it includes a quantum dot material. However, the present disclosure is not limited thereto, and other implementations are also possible.

The light emitting device includes the wavelength converting unit 295, thereby making it possible to provide a chip scale package that can emit white light.

FIG. 25 to FIG. 39 are plan views and cross-sectional views for describing exemplary light emitting devices and exemplary methods of manufacturing the same according to some embodiments of the present disclosure. In the respective drawings, (a) and (b) included in the same drawing indicate a plan view and a cross-sectional view, respectively, and (b) in each drawing illustrates a cross section taken along line V-V' of (a). In the following description, light emitting devices and methods of manufacturing the same according to various exemplary embodiments of the present disclosure will be described with reference to FIG. 25(a) to FIG. 39(b). A detailed description for configurations similar to the configurations described in the exemplary embodiments of FIGS. 1 to 14(b) will be contracted or omitted, and configurations different from the configurations described in the exemplary embodiments of FIGS. 1 to 14(b) will be described in detail. In addition, in exemplary embodiments to be described below, even in the case of describing a method of manufacturing a light emitting device based on a single light emitting device, configurations and features described in the above exemplary embodiments can also be applied to the case of forming a plurality of light emitting devices.

Figure 25A:
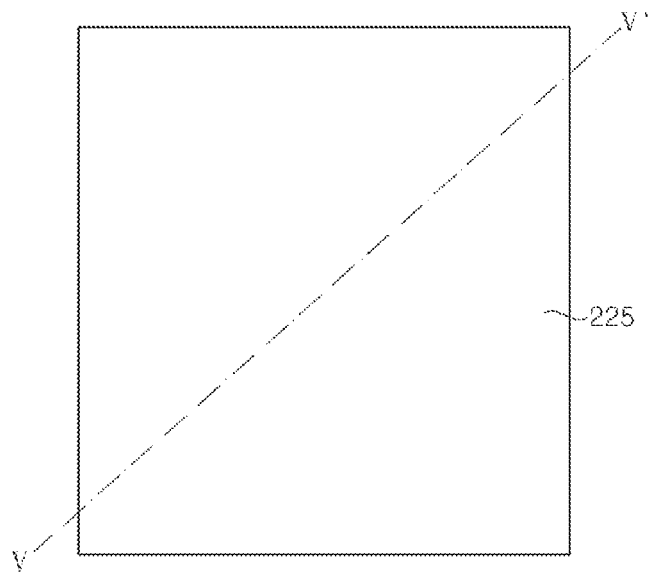
FIG. 25(a) to FIG. 40(b) are plan views and cross-sectional views for describing exemplary light emitting devices according to some embodiments.
Figure 25B:
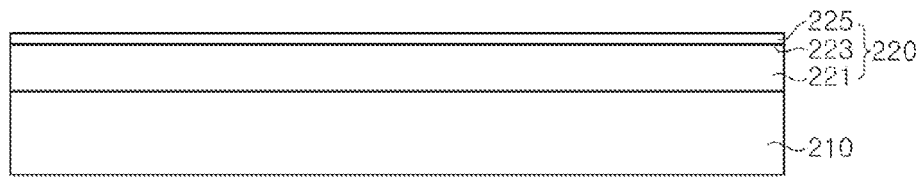

Referring to FIGS. 25(a) and 25(b), a light emitting structure 220 including a first conductive type semiconductor layer 221, an active layer 223, and a second conductive type semiconductor layer 225 is formed on a growth substrate 210.

The growth substrate 210 is not limited as long as the light emitting structure 220 can be grown over the growth substrate 210. For example, the growth substrate 210 can be or include a sapphire substrate, a silicon carbide substrate, a silicon substrate, a gallium nitride substrate, or an aluminum nitride substrate, or the like. The light emitting structure 220 can be grown using a method such as metal organic chemical vapor deposition (MOCVD), hydride vapor phase epitaxy (HVPE), or molecular beam epitaxy (MBE), or the like.

In addition, although the growth substrate 210 and the light emitting structure 220 corresponding to the single device have been illustrated in FIGS. 25(a) and 25(b), the present exemplary embodiment can be substantially similarly applied to the case of using a wafer having the light emitting structure 220 grown on the growth substrate 210.

Figure 26A:
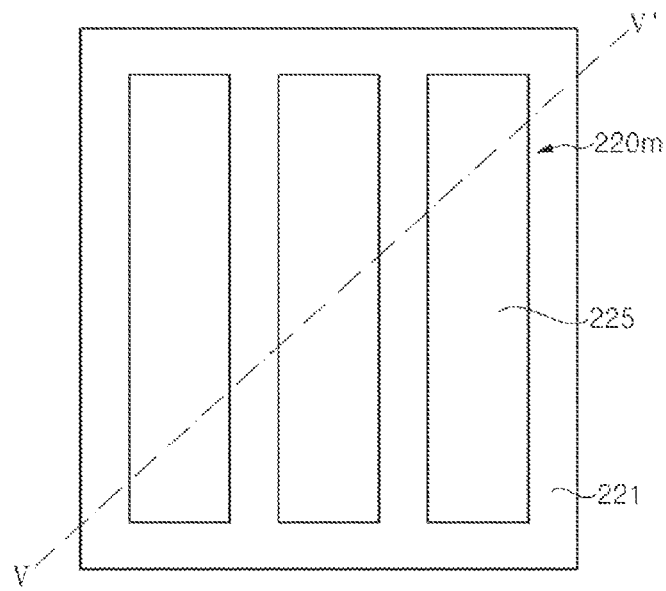
Figure 26B:
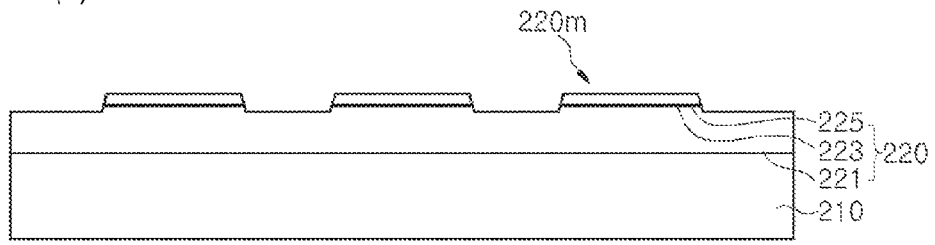

Then, referring to FIGS. 26(a) and 26(b), the light emitting structure 220 is patterned to form at least one mesa 220m.

The mesa 220m can be formed by partially removing the second conductive type semiconductor layer 225 and the active layer 223 by photolithography and etching processes. The mesa 220m is formed, such that the first conductive type semiconductor layer 221 can be partially exposed in a peripheral region of the mesa 220m. The mesa 220m does not have a limited form, but can have a form in which it is extended in substantially the same direction, as illustrated in FIG. 26(a). In some implementations, the mesas 220m can be formed in plural. In this case, the plurality of mesas 220m can be spaced apart from each other.

Figure 27A:
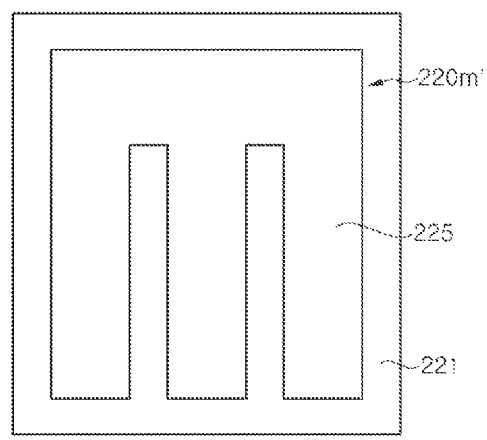
Figure 27B:
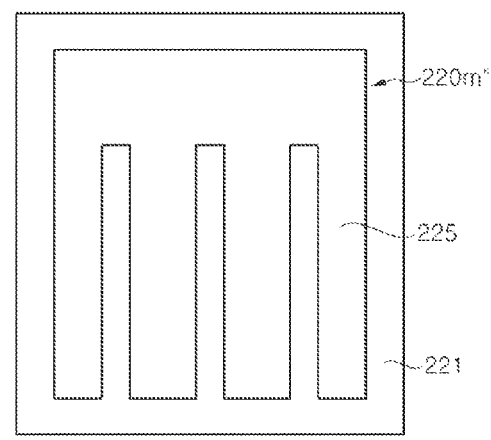

However, the present disclosure is not limited thereto, and other implementations are also possible. For example, as illustrated in FIGS. 27(a) and 27(b), the mesa 220m can also have a form in which it is integrally formed and includes portions depressed from one side surface thereof. For example, as illustrated in FIG. 27(a), a mesa 220m' can have a form in which portions thereof adjacent to one side surface of the growth substrate 110 are connected to each other and spaced regions are formed in portions thereof adjacent to the other side surface of the growth substrate 110 positioned to be opposite to one side surface. The first conductive type semiconductor layer 221 can be partially exposed through the spaced regions. The number of spaced regions can be plural. For example, FIG. 27(a) show two spaced regions and FIG. 27(b) show three spaced regions. In some implementations, more than three spaced regions can be formed. In some implementations, the mesa 220m can also have a form in which it includes a plurality of grooves partially exposing the first conductive type semiconductor layer 221. In this case, the light emitting structure 220 having a form similar to those of the exemplary embodiment of FIGS. 8A to 9B can be provided.

Figure 28A:
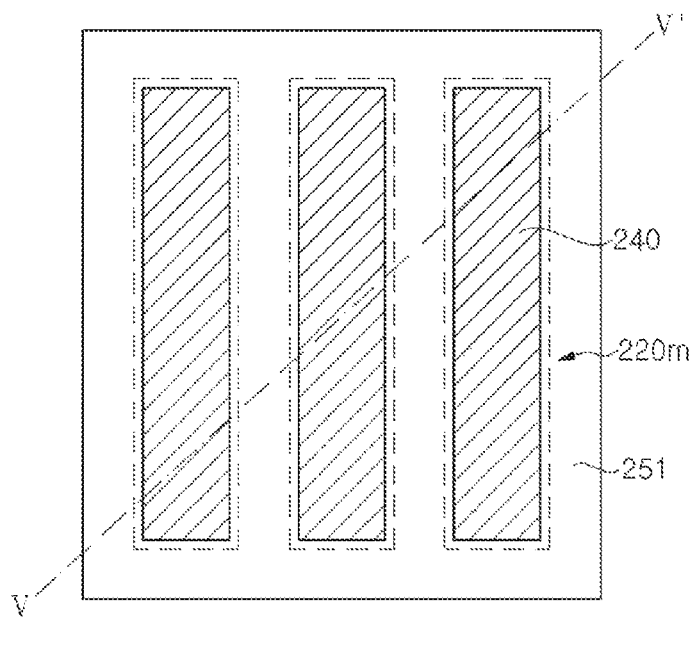
Figure 28B:
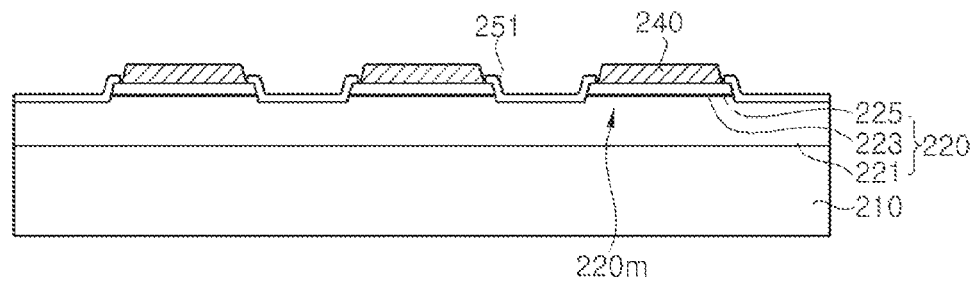

Next, referring to FIGS. 28(a) and 28(b), second contact electrodes 240 are formed on the second conductive type semiconductor layer 225, for example, at least portions of upper surfaces of the mesas 220m. Further, preliminary first insulating layers 251 can be further formed on the light emitting structure 220.

The second contact electrode 240 can include at least one of a metal or a conductive oxide, as described above. The second contact electrodes 240 can be formed to be disposed on at least portions of the upper surfaces of the mesas 220m through suitable depositing and patterning methods.

The preliminary first insulating layers 251 can be formed on the light emitting structure 220, and be formed to at least partially cover the upper surface of the light emitting structure 220 except for regions in which the second contact electrodes 240 are formed. The preliminary first insulating layers 251 can cover exposed regions of the first conductive type semiconductor layer 221. Further, the preliminary first insulating layers 251 can further cover side surfaces of the mesas 220m. Further, the preliminary first insulating layers 251 can partially cover upper surfaces of the mesas 220m. The preliminary first insulating layers 251 can contact the second contact electrodes 240 or be spaced apart from the second contact electrodes 240. In the case in which the preliminary first insluting layers 251 are spaced apart from the second contact electrodes 240, the second conductive type semiconductor layer 225 is partially exposed between the preliminary first insluting layers 251 and the second contact electrodes 240. The preliminary first insluting layer 251 can include $SiO_2$, $SiN_x$, or $MgF_2$, and the like. Further, the preliminary first insulating layer 251 can include multiple layers, and include a distributed Bragg reflector in which materials having different refractive indices are alternately stacked.

Meanwhile, the preliminary first insulating layer 251 can be formed before the second contact electrode 240 is formed, be formed after the second contact electrode 240 is formed, or be formed during a period in which the second contact electrode 240 is formed. For example, in the case in which the second contact electrode 240 includes a conductive oxide layer and a reflecting layer disposed on the conductive oxide layer and including a metal, the preliminary first insulating layer 251 can be formed after the conductive oxide layer is formed on the second conductive type semiconductor layer 225 and before the reflecting layer is formed. In this case, the conductive oxide layer ohmic-contacts the second conductive type semiconductor layer 225, and the preliminary first insulating layer 251 can be formed at a thickness of about 1000 Å. In another exemplary embodiment, the preliminary first insulating layer 251 can be formed before the second contact electrode 240 is formed. In this case, the second contact electrode 240 can form an ohmic-contact with the second conductive type semiconductor layer 225, and include a reflecting layer made of a metal material. In these exemplary embodiments, the preliminary first insulating layer 251 is formed before the reflecting layer including the metal material is formed, thereby making it possible to prevent a decrease in light reflectivity and an increase in a resistance of the reflecting layer due to diffusion of materials between the reflecting layer and the light emitting structure 220. In addition, a problem such as an electric short-circuit that can be generated due to the metal material remaining in other portions in which the second contact electrodes 240 are not formed in a process of forming the reflecting layer including the metal material can be prevented.

Figure 29A:
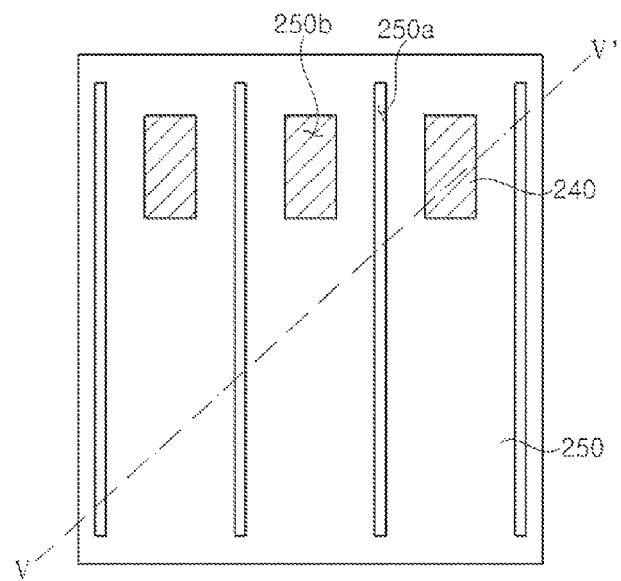
Figure 29B:
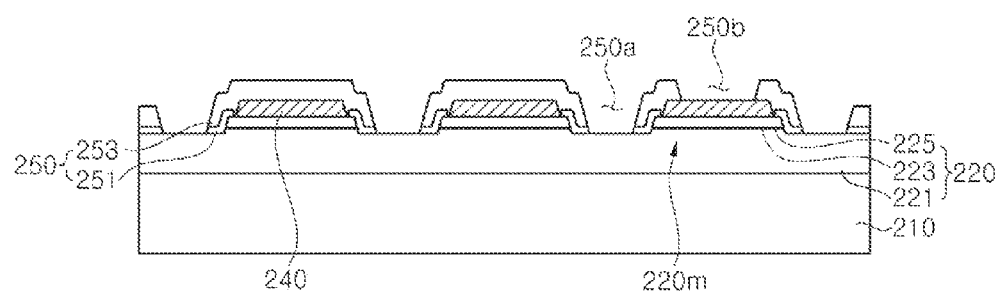

Then, referring to FIGS. 29(a) and 29(b), a first insulating layer 250 is formed on the light emitting structure 220. The first insulating layers 250 partially cover the first conductive type semiconductor layer 221, the mesas 220m, and the second contact electrodes 240. In addition, the first insulating layer 250 can include first opening parts 250a partially exposing the first conductive type semiconductor layer 221 and second opening parts 250b partially exposing the second contact electrodes 240.

The first insulating layer 250 can include the preliminary first insulating layer 251 described with reference to FIGS. 28(a) and 28(b) and a main first insulating layer 253. The main first insulating layer 253 can be formed through a suitable deposition method such as plasma enhanced chemical vapor deposition (PECVD), or E-beam evaporation, or the like. Here, after the main first insulating layer 253 is formed to generally cover the first conductive type semiconductor layer 221, the mesas 220m, and the second contact electrodes 240, the first and second opening parts 250a and 250b are formed through a patterning process, thereby making it possible to provide the first insulating layer 250 as illustrated. The patterning process can include a photolithography process, or a lift-off process. The main first insulting layer 253 can include $SiO_2$, $SiN_x$, or $MgF_2$, and the like. Further, the main first insulating layer 253 can include multiple layers, and include a distributed Bragg reflector in which materials having different refractive indices are alternately stacked. In addition, the main first insulating layer 253 can have a thickness greater than that of the preliminary first insulating layer 251.

The number of first opening parts 250a can be at least one. For example, the first opening parts 250a can be formed on the mesas 220m, respectively. In some implementations, the first opening part 250a can be formed at a position adjacent to one side surface of the growth substrate 210. The second opening parts 250b can have a shape in which they are extended along a direction in which the mesas 220m are extended. In some implementations, the second opening parts 250b can be formed adjacent to long side surfaces of the mesas 220m. However, positions, sizes, and the numbers of the first and second opening parts 250a and 250b are not limited thereto, and other implementations are also possible, but can be variously modified depending on positions at which bulk electrodes 271 and 273 to be described below are formed, or the like.

Meanwhile, although the case in which the second contact electrodes 240 are formed after the mesas 220m are formed has been described, the mesas 220m can be formed after the second contact electrodes 240 are formed.

Figure 30A:
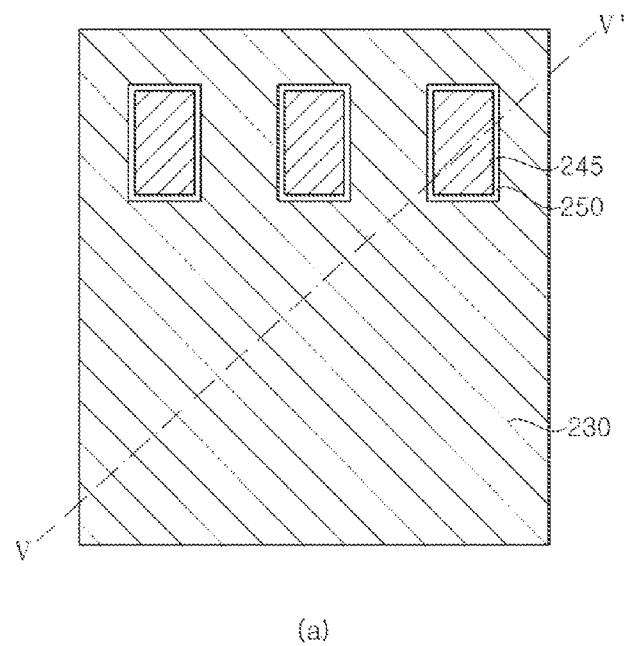
Figure 30B:
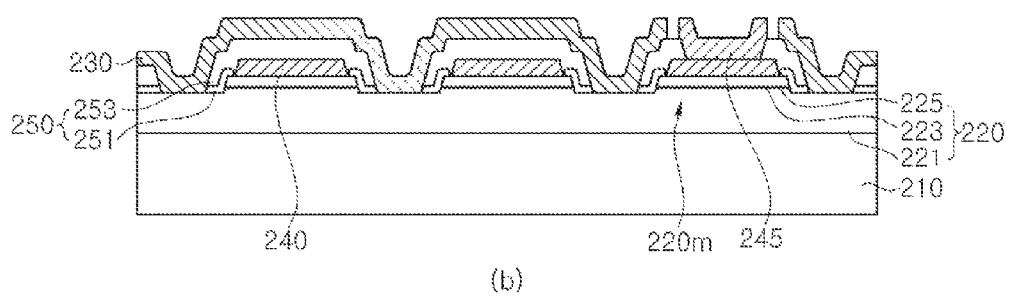

Next, referring to FIGS. 30(a) and 30(b), a first contact electrode 230 is formed on the first insulating layer 250. The first contact electrode 230 can ohmic-contact the first conductive type semiconductor layer 221 exposed through the first opening parts 250a. Further, a connecting electrode 245 electrically contacting the second contact electrode 240 through the second opening part 250b can be further formed.

The first contact electrode 230 and the connecting electrode 245 can be formed through the known depositing and patterning method, and be simultaneously formed or be formed through separate processes. The first contact electrode 230 and the connecting electrode 245 can be formed of or include the same material and in a multilayer structure or be formed of different materials and/or in a multilayer structure. The first contact electrode 230 and the connecting electrode 245 are spaced apart from each other, such that the first and second contact electrodes 230 and 240 are electrically insulated from each other.

For example, the first contact electrode 230, or the connecting electrode 245, or the both can include a multilayer structure. The multilayer structure can have a stack structure including first adhering layer (ohmic contact layer), reflecting layer, barrier layer, oxidation preventing layer, and second adhering layer. The first adhering layer can contact the first conductive type semiconductor layer 221, the second contact electrode 240, or the both, and include Ni, Ti, or Cr, or the like. The reflecting layer can include a metal having high reflectivity, for example, Al, or Ag, or the like. The barrier layer can prevent mutual diffusion of a metal of the reflecting layer, be formed of a single layer of Cr, Co, Ni, Pt, or TiN, or be formed of multiple layers of Cr, Co, Ni, Pt, or TiN together with Ti, Mo, or W, for example, can have a plural layer structure of Cr/Ti. The oxidation preventing layer can prevent oxidation of other layers positioned therebelow, and include a metal material having strong resistance to oxidation. The oxidation preventing layer can include, for example, Au, Pt, or Ag, or the like. The second adhering layer can be adopted in order to improve adhesion between a second insulating layer 260 and the first conductive type semiconductor layer 221 (or between the second insulating layer 260 and the connecting electrode 245), and can include, for example, Ti, Ni, or Cr, or the like. However, the present disclosure is not limited thereto, and other implementations are also possible.

In some implementations, the connecting electrode 245 can also be omitted. As illustrated in FIGS. 30(a) and 30(b), in the case in which the connecting electrode 245 is omitted, the second contact electrode 240 is exposed through the second opening part 250b. Therefore, in this case, a second bulk electrode 173 can directly contact the second contact electrode 240.

Figure 31A:
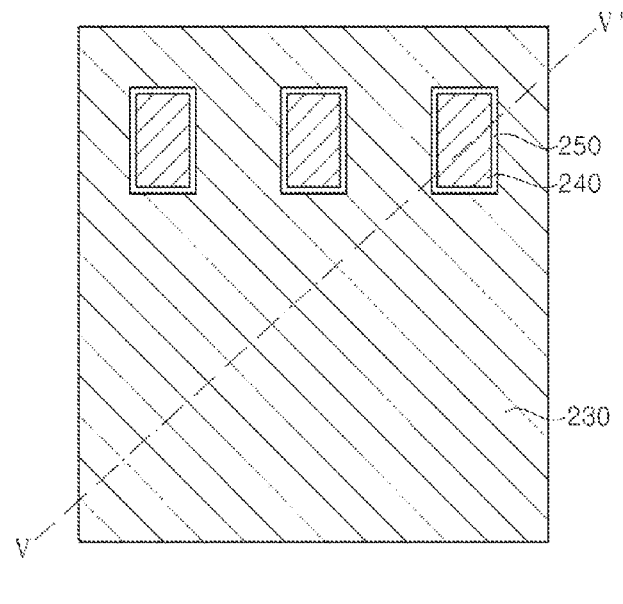
Figure 31B:
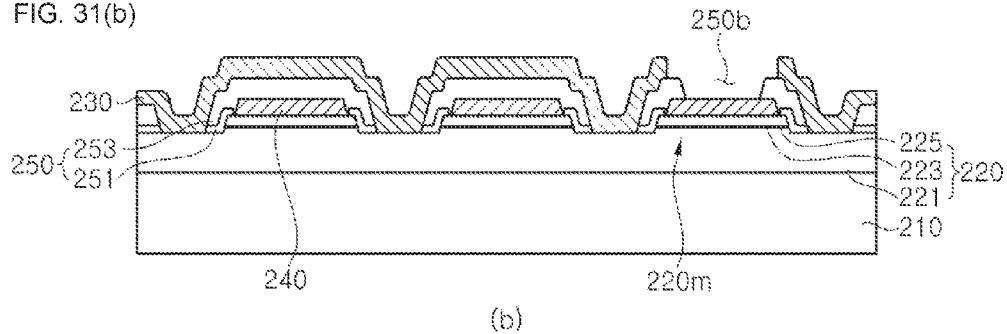
Figure 32A:
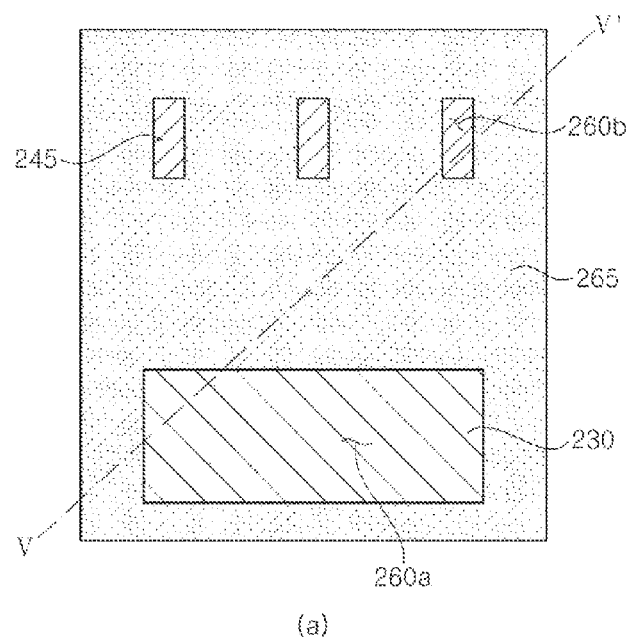
Figure 32B:
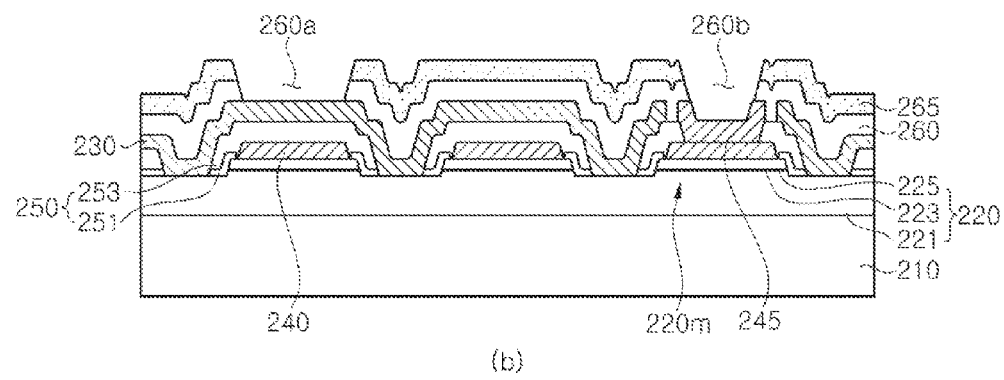

Then, referring to FIGS. 31(a) and 31(b), a second insulating layer 260 partially covering the first contact electrode 230 and the connecting electrode 245 is formed. The second insulating layer 260 can include third and fourth opening parts 260a and 260b each exposing the first contact electrode 230 and the connecting electrode 245. Further, a stress buffering layer 265 can be further formed on the second insulating layer 260.

The second insulating layer 260 can be formed through the known deposition method such as plasma enhanced chemical vapor deposition (PECVD), or E-beam evaporation, or the like. Here, after the second insulating layer 260 is formed to generally cover the first contact electrode 230 and the connecting electrode 245, the third and fourth opening parts 260a and 260b are formed in the second insulating layer 260 through a patterning process, such that the second insulating layer 260 as illustrated can be provided. The patterning process can include a photolithography process, or a lift-off process. The second insluting layer 260 can include $SiO_2$, $SiN_x$, or $MgF_2$, and the like. Further, the second insulating layer 260 can include multiple layers, and include a distributed Bragg reflector in which materials having different refractive indices are alternately stacked. The uppermost layer of the second insulating layer 260 can be formed of or include $SiN_x$. The uppermost layer of the second insulating layer 260 is made of or includes $SiN_x$, thereby making it possible to more effectively prevent moisture from permeating into the light emitting structure 220. In addition, the second insulating layer 260 can have a thickness thinner than that of the first insulating layer 250, and can have a thickness of about 0.8 μm in order to secure an insulation withstand voltage. However, the present disclosure is not limited thereto, and other implementations are also possible.

The third and fourth opening parts 260a and 260b expose the first contact electrode 230 and the connecting electrode 245, respectively, thereby making it possible to provide paths through which bulk electrodes 171 and 173 can be electrically connected to the first contact electrode 230 and the second contact electrode 240.

The stress buffering layer 265 can be formed through a method such as a depositing method, a spin coating method, or the like, and be patterned together with the second insulating layer 260. Therefore, the stress buffering layer 265 can include opening parts formed at positions corresponding to those of the third and fourth opening parts 260a and 260b.

Referring to FIG. 33(a) to FIG. 34(b), a first bulk electrode 271, a second bulk electrode 273, and a lower insulation support 283 are formed on the second insulating layer 260.

Figure 33A:
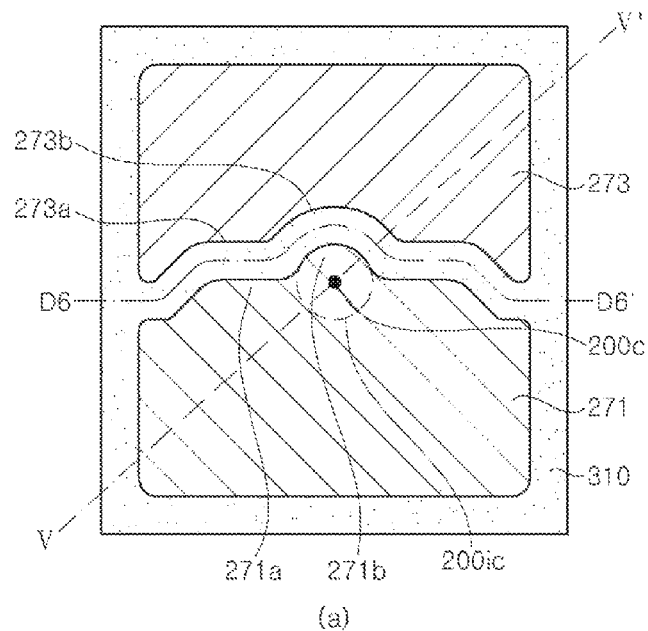
Figure 33B:
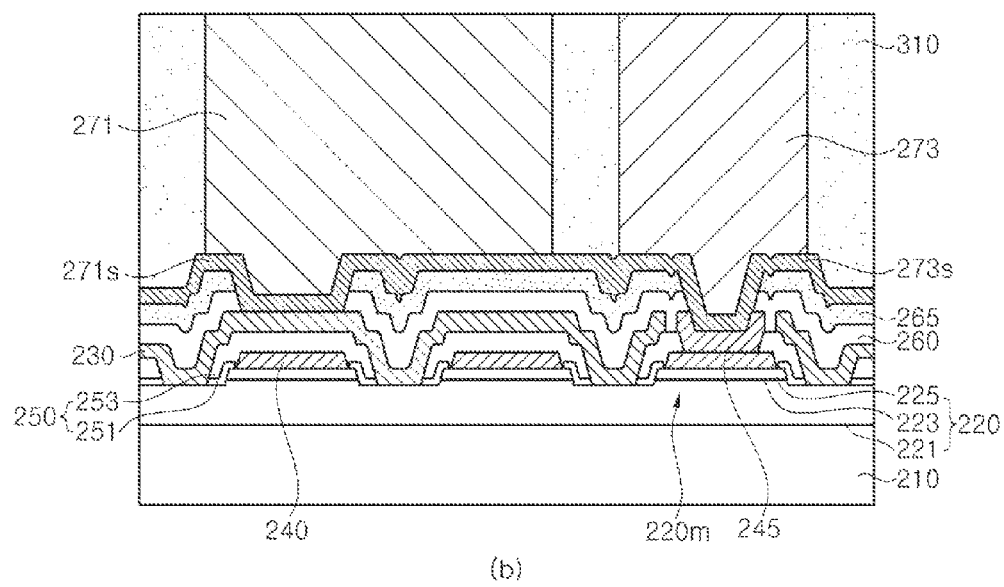

Referring to FIGS. 33(a) and 33(b), regions in which first and second bulk electrodes 271 and 273 are formed are defined using a mold 310 for forming bulk electrodes, such that the first and second bulk electrodes 271 and 273 can be formed. The mold 310 for forming bulk electrodes can be or include a mold that can be patterned, and can include, for example, photosensitive polyimide, SU-8, a photo-resist for plating, or a dry film.

The first and second bulk electrodes 271 and 273 can be formed using a plating method, a depositing method, a dotting method, or a screen printing method, or the like. Forming the first and second bulk electrodes 271 and 273 can include forming first and second metal layers 271s and 273s. The first and second metal layers 271s and 273s can be positioned below the first and second bulk electrodes 271 and 273, respectively, to contact the first contact electrode 230, the connecting electrode 245, the insulating layers 250 and 260, and the stress buffering layer 265. The first and second metal layers 271s and 273s can be changed depending on a method of forming the bulk electrodes 271 and 273.

Figure 34A:
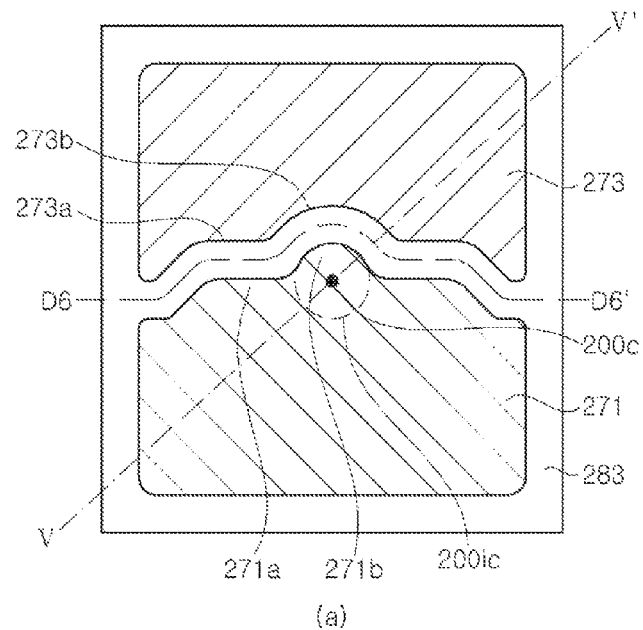
Figure 34B:
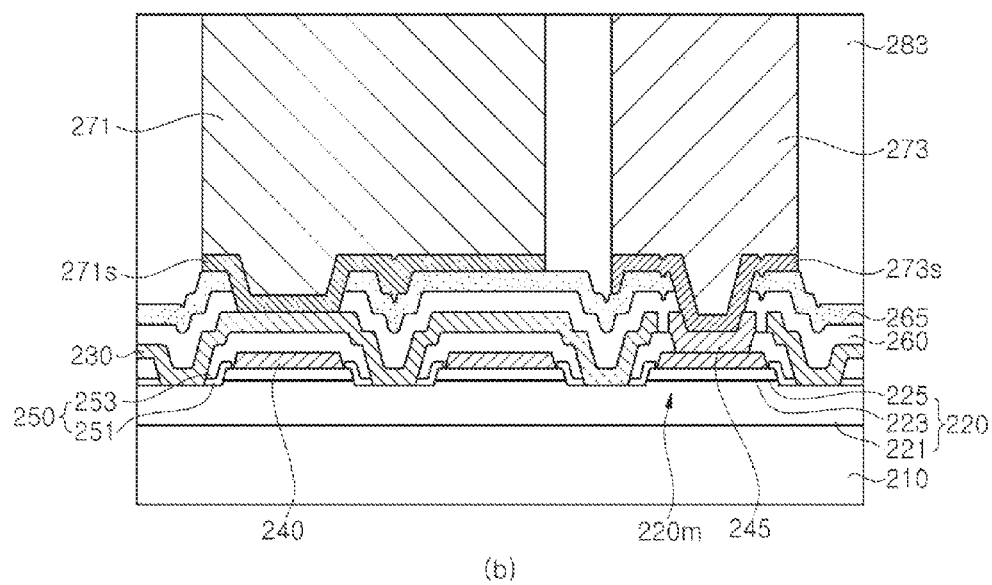

Referring to FIGS. 34(a) and 34(b), the mold 310 for forming bulk electrodes is removed, and a lower insulation support 283 at least partially covering side surfaces of the first and second bulk electrodes 271 and 273 is formed. The lower insulation support 283 can be formed and provided by performing the available techniques such as a screen printing method or a spin coating method on a material such as an epoxy molding compound (EMC) or a Si resin.

The method of manufacturing a light emitting device according to the present exemplary embodiment can further include planarizing upper surfaces of the first and second bulk electrodes 271 and 273 and the lower insulation support 283 after forming the lower insulation support 283. Therefore, the upper surfaces of the first and second bulk electrodes 271 and 273 can be formed to be substantially flush with the lower insulation support 283. The planarizing of the first and second bulk electrodes 271 and 273 and the lower insulation support 283 can include using at least one of a grinding method, a lapping method, a chemical mechanical polishing (CMP) method, or a wet etching.

Next, a process of forming the first and second bulk electrodes 271 and 273 and the lower insulation support 283 will be described in more detail. In the case in which the first and second bulk electrodes 271 and 273 are formed using plating, the first and second metal layers 271s and 273s are formed over entire surfaces of the stress buffering layer 265, the third opening part 260a, and the fourth opening part 260b by a method such as a sputtering method. The first and second metal layers 271s and 273s can include Ti, Cu, Au, or Cr, or the like, and serve as an under bump metallization (UMB) layer or a seed metal. For example, the first and second metal layers 271s and 273s can have a stack structure including Ti/Cu. Then, a mask is formed on the first and second metal layers 271s and 273s. Here, the mask can be the mold 310 for forming bulk electrodes. The mold 310 for forming bulk electrodes masks a portion corresponding to a region in which the lower insulation support 283 is formed and opens regions in which the first and second bulk electrodes 271 and 273 are formed. Next, the first and second bulk electrodes 271 and 273 are formed in the opened regions of the mask through a plating process. Here, the first and second bulk electrodes 271 and 273 can be formed using the first and second metal layers 271s and 273s as seeds, respectively. Then, the mold 310 for forming bulk electrodes and portions of the first and second bulk electrodes 271 and 273 positioned below the mold 310 for forming bulk electrodes are removed through an etching process, such that the first and second bulk electrodes 271 and 273 can be provided. Therefore, the first and second metal layers 271s and 273s can remain below the first and second bulk electrodes 271 and 273, respectively.

The case in which the first and second bulk electrodes 271 and 273 are formed using the screen printing method will be described. A UBM layer is formed on at least portions of the stress buffering layer 265, the third opening part 260a, and the fourth opening part 260b through a depositing and patterning method such as a sputtering method or a depositing and lift-off method. The UBM layer can be formed on regions in which the first and second bulk electrodes 271 and 273 are to be formed, and can include a (Ti or TiW) layer and a single layer including Cu, Ni, or Au or a combination layer thereof. For example, the UBM layer can have a stack structure of Ti/Cu. The UBM layer can correspond to the first and second metal layers 271s and 273s. Then, a mask is formed. The mask masks a portion corresponding to a region in which the lower insulation support 283 is formed and opens regions in which the first and second bulk electrodes 271 and 273 are formed. Then, a material such as an Ag paste, an Au paste, or a Cu paste is formed in the open regions through a screen printing process and is hardened. Next, the mask is removed through an etching process, such that the first and second bulk electrodes 271 and 273 can be provided.

The first bulk electrode 271 includes a first protrusion part 271s protruding from a side surface of the first bulk electrode 271 facing the second bulk electrode 273, and a second protrusion part 271b further protruding from the first protrusion part 271a toward the second bulk electrode 273. The second bulk electrode 273 includes a first concave part 273a depressed from a side surface of the second bulk electrode 273 facing the first bulk electrode 271, and a second concave part 273b depressed from the first concave part 273a. Therefore, the horizontal cross-sectional area of the first bulk electrode 271 can be greater than that of the second bulk electrode 273.

In addition, the protrusion parts 271a and 271b are formed to be engaged with the concave parts 273a and 273b, respectively. The first protrusion part 271a can be positioned to correspond to a portion depressed by the first concave part 273a, and the second protrusion part 271b can be positioned to correspond to a portion depressed by the second concave part 273b. Therefore, a spaced distance between side surfaces of the first and second bulk electrodes 271 and 273 facing each other can be maintained to be substantially constant. Further, the second protrusion part 271b can have a width smaller than that of the first protrusion part 271a.

The second protrusion part 271b can have various shapes, and can be formed of or include at least a portion of a polygon, a circle, or an ellipse having an inscribed circle 200ic whose center is located at a central portion 200c of the light emitting device and diameter is about 50 μm or more to 150 μm or less. For example, as illustrated, the second protrusion part 271b can have a shape including an arc corresponding to the inscribed circle 200ic whose center is located at the central portion 200c of the light emitting device. The first and second concave parts 273a and 273b can have shapes corresponding to those of the first and second protrusion parts 271a and 271b.

A virtual line D6-D6' extended along a spaced region of a portion at which the first and second bulk electrodes 271 and 273 face each other can have one or more bending portions. Although the virtual line D6-D6' having the one or more bending portions can be derived from shapes and layouts of the protrusion parts 271a and 271b and the concave parts 273a and 273b, the present disclosure is not limited thereto, and other implementations are also possible. A starting point and an ending point of the virtual line D6-D6' can be disposed on the same line.

Meanwhile, the protrusion parts 271a and 271b of the first bulk electrode 271 can overlap with the central portion 200c of the light emitting device in the vertical direction. In the present exemplary embodiment, the second protrusion part 271b is shaped to have at least a portion of the polygon, the circle, or the ellipse having the inscribed circle 200ic of which the origin or center is located at the central portion 200c of the light emitting device. In this case, the center of the inscribed circle 200icis positioned to be overlapped with the central portion 200c of the light emitting device in the vertical direction. Therefore, generation of a crack in the insulation support 280 and damage to the insulation support 280 in a process of manufacturing the light emitting device can be prevented, thereby improving a manufacturing yield of the light emitting device. This will be described below in more detail. In addition, the protrusion parts 271a and 271b are overlapped with the central portion 200c of the light emitting device in the vertical direction, thereby making it possible to effectively prevent the crack and the damage of the insulation support 280. Therefore, strength of the light emitting device against external impact can be improved, and strength against a warpage momentum due to stress, or the like, applied from the outside can be further improved. For example, a peripheral region of the central portion 200c of the light emitting device in the vertical direction is covered with the first bulk electrode 271, thereby making it possible to more effectively improve mechanical stability of the light emitting device.

Figure 35A:
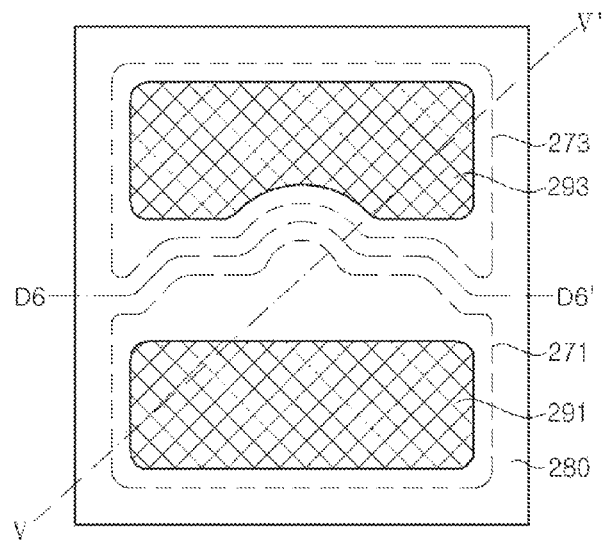
Figure 35B:
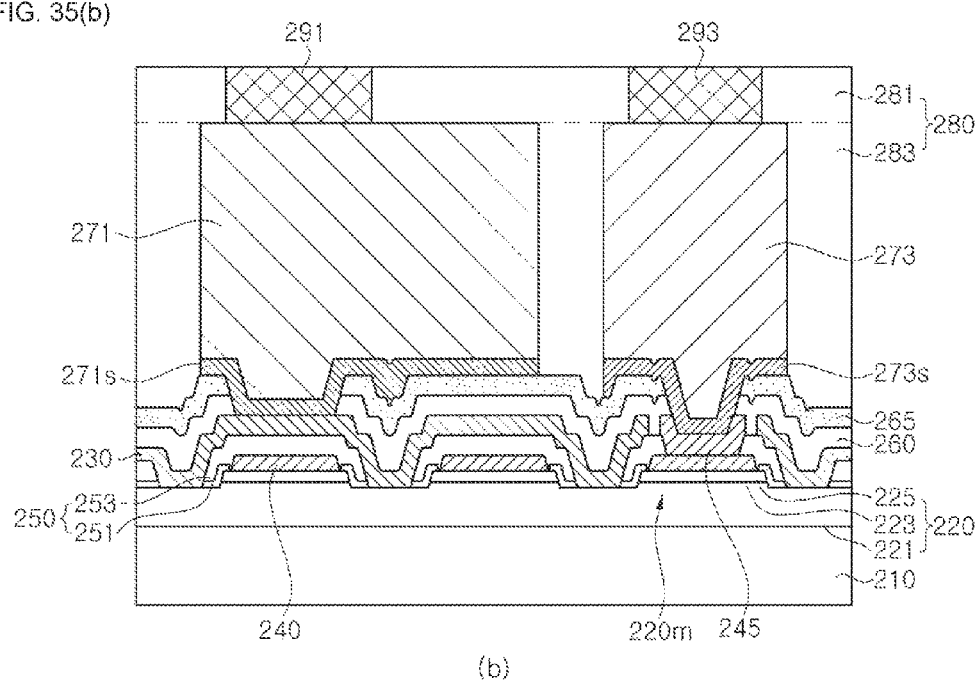

Then, referring to FIGS. 35(a) and 35(b), a first pad electrode 291, a second pad electrode 293, and an upper insulation support 281 can be further formed on the lower insulation support 283 and the bulk electrodes 271 and 273.

The first and second pad electrodes 291 and 293 can be formed on the first and second bulk electrodes 271 and 273, respectively, through depositing and patterning processes. The upper insulation support 281 can enclose side surfaces of the first and second pad electrodes 291 and 293. The upper insulation support 281 is formed, such that the insulation support 280 including the upper insulation support 281 and the lower insulation support 283 can be provided. The upper insulation support 281 can be formed of or include the same material as that of the lower insulation support 283 or be made of or include a material different from that of the lower insulation support 283.

Figure 36:
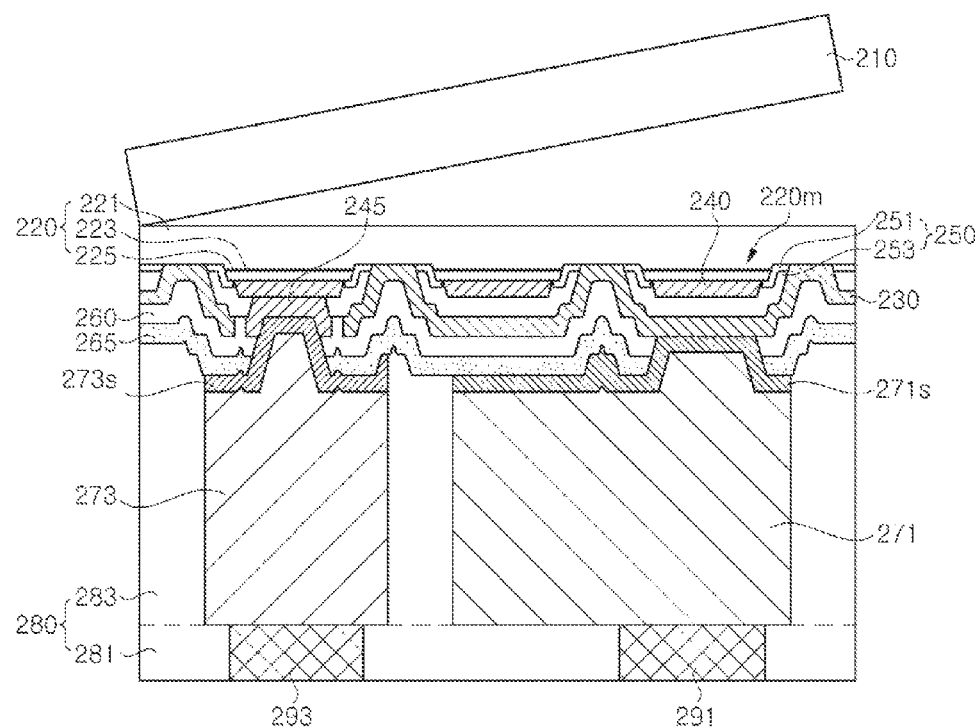

Next, referring to FIG. 36, the growth substrate 210 can be separated from the light emitting structure 220. The growth substrate 210 can be separated and removed from the first conductive type semiconductor layer 221 using at least one of a laser lift-off method, a chemical lift-off method, a thermal lift-off method, or a stress lift-off method. After the growth substrate 210 is separated, a surface of the first conductive type semiconductor layer 221 exposed by separating the growth substrate 210 can be partially removed through at least one of a dry etching method, a wet etching method, a physical method, a chemical method, or a physicochemical method.

Figure 37A:
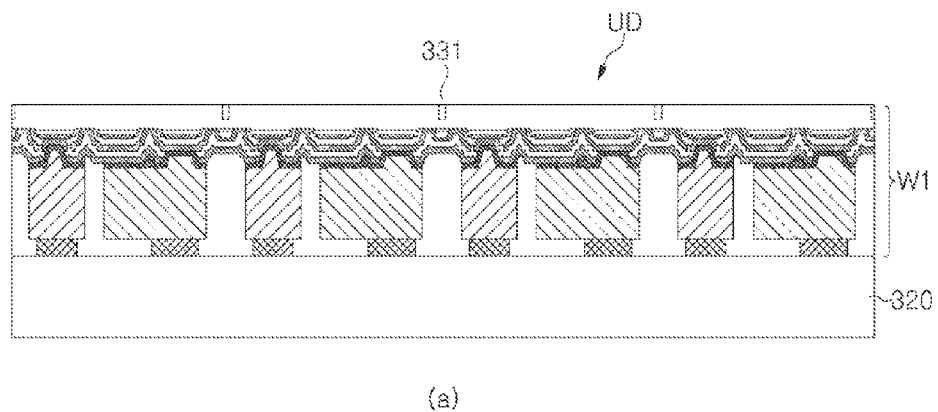
Figure 37B:
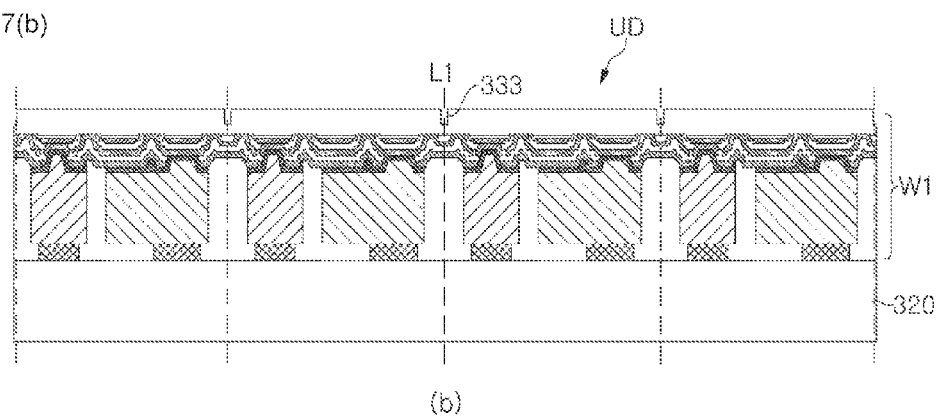

Meanwhile, a temporary substrate (not illustrated) can be bonded to an opposite side of the growth substrate 210 before the growth substrate 210 is removed. In a process of separating the growth substrate 210, the temporary substrate serves to support the light emitting device. Therefore, generation of a defect in the light emitting device due to stress and strain generated in the process of separating the growth substrate 210 can be suppressed. For example, in the case in which the growth substrate is separated into a large area in a wafer unit in order to manufacture a plurality of light emitting devices, it is likely that a crack or damage will be generated in the light emitting structure 220, or the like, in the process of separating the growth substrate 210 to cause a defect in the light emitting device. The temporary substrate can prevent, for example, the defect of the light emitting device in this case. For example, as illustrated in FIGS. 37(a) and 37(b), in the case of manufacturing a plurality of light emitting devices, a temporary substrate 320 can be used.

In the case of manufacturing the plurality of light emitting devices in a wafer unit, portions between unit device regions can be partially removed after the growth substrate 210 is separated. As illustrated in FIG. 37(a), in the case of manufacturing the plurality of light emitting devices, a wafer W1 from which the growth substrate 210 is separated can be disposed on the temporary substrate 320. Here, the wafer W1 can include a plurality of unit devices UD, and a boundary L1 between the plurality of unit devices UD can be defined as a separation region 331. As illustrated in FIG. 37(b), the separation region 331 is partially removed, such that a separation groove 333 can be formed between the plurality of unit devices UD. The separation groove 333 can be formed by at least partially removing the first conductive type semiconductor layer 221 through a method such as a dry etching method. Before the wafer W1 is separated into unit light emitting devices, the separation groove 333 in which the first conductive type semiconductor layer 221 is partially removed is formed, thereby making it possible to prevent generation of chipping or a crack in the light emitting structure 220 in a process of separating the wafer W1 into the unit light emitting devices. However, a process of forming the separation groove 333 can also be omitted.

Figure 38:
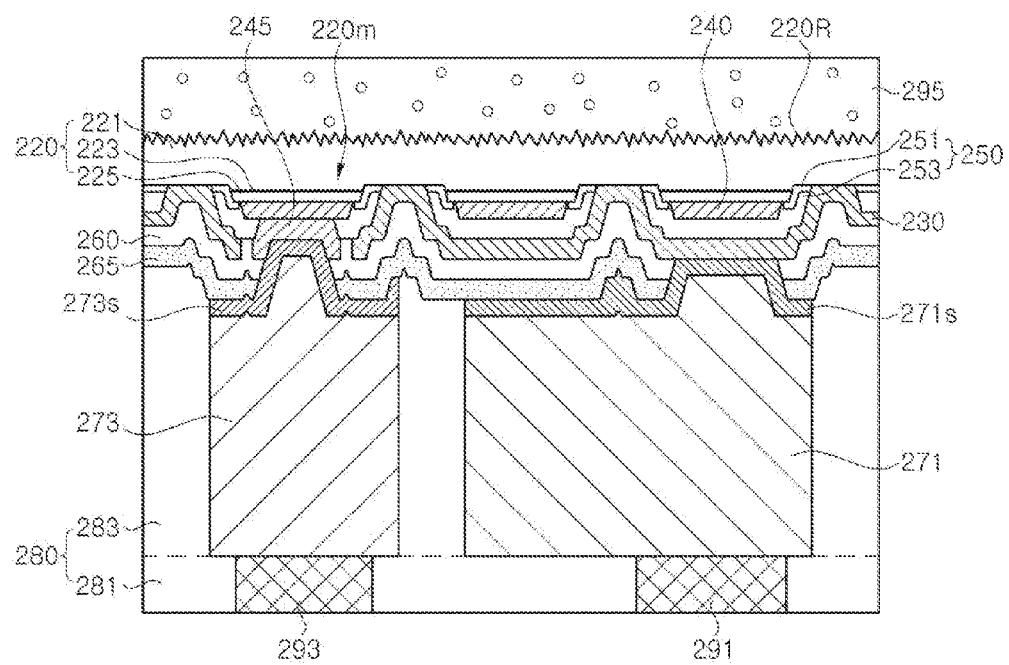

Then, referring to FIG. 38, a wavelength converting unit 295 can be formed on the light emitting structure 220. In addition, before the wavelength converting unit 295 is formed, a rough surface 220R can be further formed by increasing a roughness of a surface of the light emitting structure 220. Therefore, the light emitting device as illustrated in FIG. 38 can be provided.

The wavelength converting unit 295 can include a material that can convert a wavelength of the light. For example, the wavelength converting unit 295 can be provided in a form in which phosphors are dispersed in a carrier, be provided in a single crystalline phosphor sheet form, or be provided in a form in which it includes a quantum dot material. However, the present disclosure is not limited thereto, and other implementations are also possible. The light emitting device according to the present exemplary embodiment includes the wavelength converting unit 295, thereby making it possible to provide a chip scale package that can emit white light. The wavelength converting unit 295 can not only be formed on the upper surface of the light emitting structure 220, but can also be extended to side surfaces of the light emitting structure 220, and can be further extended to side surfaces of the insulation support 280. The wavelength converting unit 295 can be formed through applying and hardening methods, a spray method, or other known methods.

The rough surface 220R can be formed by at least one of a wet etching method, a dry etching method, or an electrochemical etching method, and can be formed using, for example, a photo-electrochemical (PEC) etching method, an etching method using an etching solution including KOH or NaOH, or the like. Therefore, the light emitting structure 220 can include protrusion parts, concave parts, or the both formed on a surface of the first conductive type semiconductor layer 221 and having a scale of μm to nm. Light extracting efficiency of light emitted by the light emitting structure 220 can be improved by the rough surface 220R.

Meanwhile, after the wavelength converting unit 295 is formed, a passivation layer (not illustrate) at least partially covering a surface of the light emitting device can be further formed.

Figure 39A:
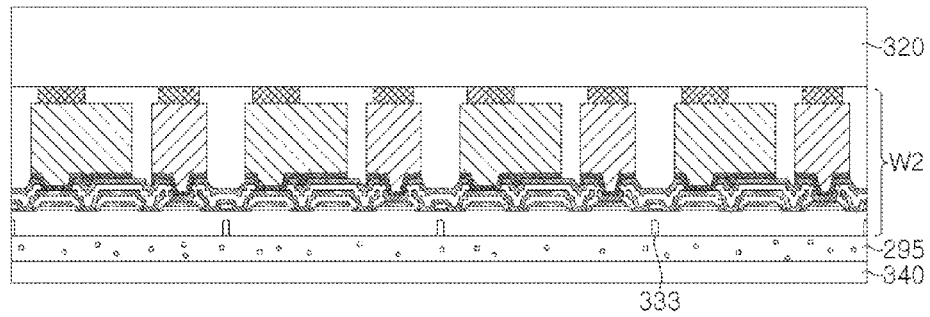
Figure 39B:
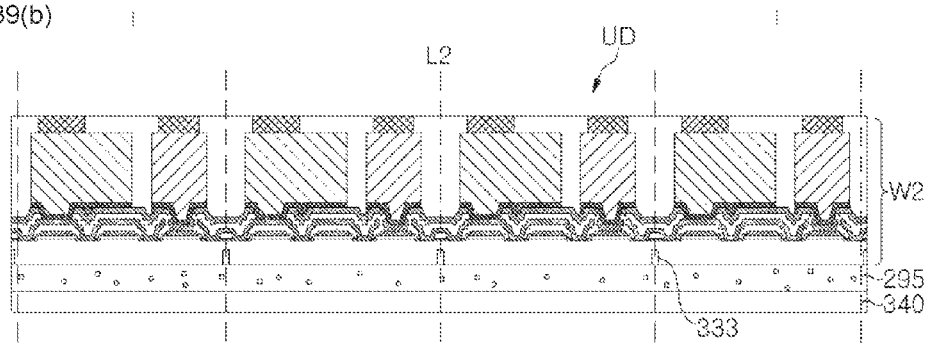
Figure 39C:
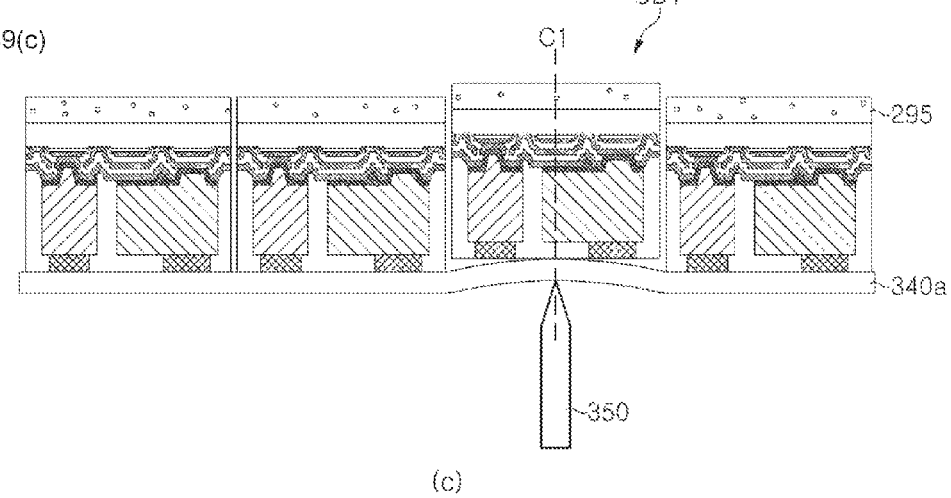

Meanwhile, the light emitting device illustrated in FIG. 38 can be manufactured from a wafer W2 including a plurality of unit devices UD. Referring to FIGS. 39(a) to 39(c), as illustrated in FIG. 39(*a*), the wafer W2 including the plurality of unit devices UD bonded to a temporary substrate 320 can be prepared. The wafer W2 can be disposed on a first support 340 for a separation process. The first support 340 can include a dicing tape. Then, referring to FIG. 39(*b*), the temporary substrate 320 is separated from the wafer W2, and the wafer W2 is diced along a separation line L2. The separation line L2 corresponds to a boundary between the plurality of unit devices UD. Next, the plurality of unit devices UD separated in the plural can be picked up and be transferred from the first support 340 to a second support 340*a* in order to perform the next process. The second support 340*a* can also include a dicing tape. Here, as illustrated in FIG. 39(*c*), in the case in which the second support 340*a* is the dicing tape, picking up one unit device UD1 can include pushing the one unit device UD1 upwardly using an ejector pin 350 below the dicing tape (the second support 340*a*).

Figure 40A:
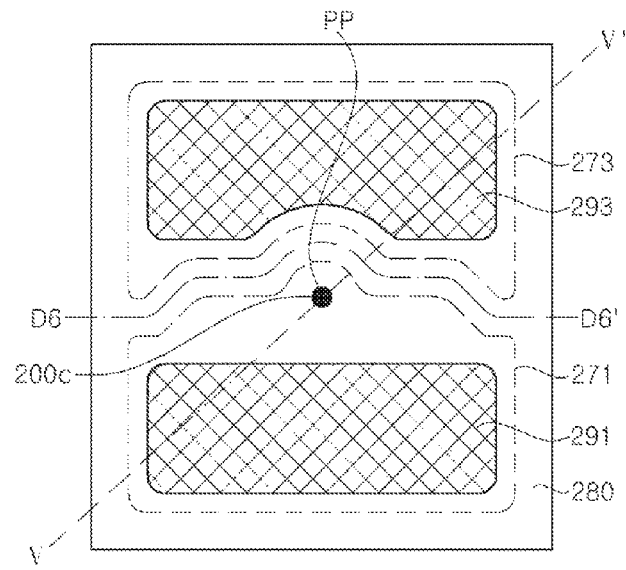
Figure 40B:
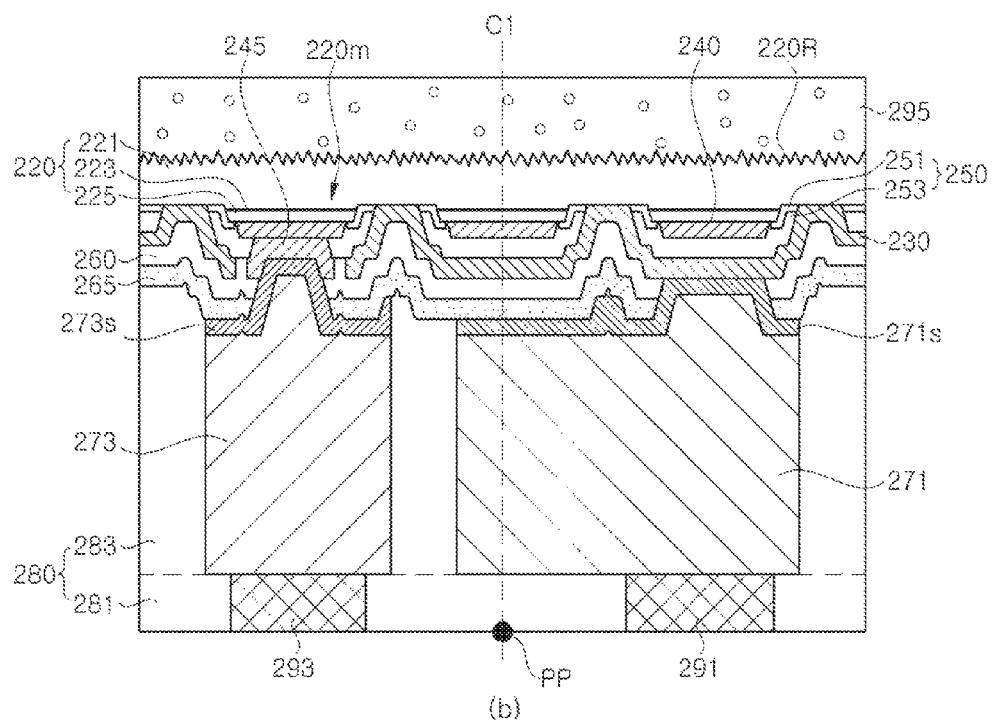

In this process, the ejector pin 350 applies impact to a portion of a lower portion of the light emitting device. As illustrated in FIG. 39© and FIGS. 40(*a*) and 40(*b*), stress can be propagated from a portion PP to which impact is applied by a pin point of the ejector pin 350 along a vertical direction C1. Therefore, the stress can be concentrated on regions overlapped with the portion PP to which the impact is applied by the pin point of the ejector pin 350 in the vertical direction C1. Here, the portion PP to which the impact is applied by the pin point can substantially coincide with the central portion 200*c* of the light emitting device. In the case in which the insulation support 280 is disposed at a portion overlapped with the central portion 200*c* of the light emitting device in the vertical direction C1, particularly in the case in which a portion of the insulation support 280 disposed between the first and second bulk electrodes 271 and 273 is overlapped with the central portion 200*c* of the light emitting device in the vertical direction C1, a crack is easily generated in the insulation support 280, such that a defect can be generated in the manufactured light emitting device. According to the present exemplary embodiment, as illustrated in FIGS. 40(*a*) and 40(*b*), the first bulk electrode 271, for example, the protrusion parts 271*a* and 271*b* can be disposed at the portion overlapped with the central portion 200*c* (substantially corresponding to the portion PP to which the impact is applied by the pin point) of the light emitting device in the vertical direction C1, thereby making it possible to effectively prevent a defect of the insulation support 280 by the ejector pin 350. In addition, in the case in which the second protrusion part 271*b* is formed of the polygon, the circle, or the ellipse having the inscribed circle 200*ic* of which the origin is the central portion 200*c* of the light emitting device and the diameter is about 50 μm or more, stress generated due to impact by the ejector pin 350 is absorbed and relaxed, thereby making it possible to more effectively prevent generation of a defect due to the stress applied to the insulation support 280.

In addition, according to the present exemplary embodiment, a light emitting device having excellent mechanical stability and high heat radiation efficiency can be provided.

According to various embodiments of the present disclosure, the growth substrate is separated, such that the light efficiency and the heat radiation efficiency of the light emitting device can be improved. In addition, the light emitting device according to the present disclosure includes a support member on which pads are formed while substituting for a secondary substrate in a wafer level, thereby making it possible to secure structural stability without the growth substrate and the secondary substrate. Further, the light emitting device according to the present disclosure can prevent diffusion of a metallic element in the solder paste, such that it can be directly mounted on the printed circuit board using the solder paste. In addition, with a method of manufacturing the light emitting device according to the present disclosure, the light emitting device having the above-mentioned effects can be manufactured.

In addition, the light emitting device including the first and second bulk electrodes each having the protrusion part and the concave part is provided. Therefore, the generation of the delamination phenomenon between the bulk electrodes and the insulation support can be suppressed, and the mechanical stability of the insulation support is improved, thereby making it possible to improve the reliability of the light emitting device. In addition, the light emitting device having improved heat radiation efficiency by forming the bulk electrodes so as to have different horizontal cross-sectional areas is provided.

Further, the protrusion part of the first bulk electrode is disposed at the position overlapped with the central portion of the light emitting device in the vertical direction, such that the mechanical stability of the light emitting device can be improved, and the generation of the defect or damage in the insulation support in the process of manufacturing the light emitting device is effectively prevented, such that the manufacturing yield of the light emitting device can be improved. FIG. 36 is an exploded perspective view of an exemplary lighting apparatus to which a light emitting device according to some embodiments of the present disclosure is applied.

Figure 41:
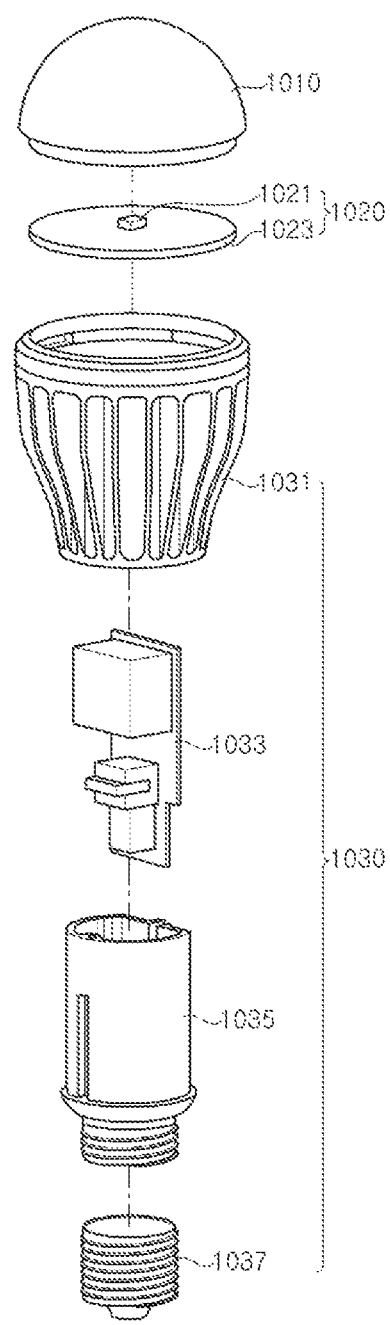
FIG. 41 shows an exploded perspective view of an exemplary lighting apparatus to which a light emitting device according to some embodiments of the present disclosure is applied.

Referring to FIG. 41, the lighting apparatus according to this embodiment includes a diffusive cover 1010, a light emitting diode module 1020, and a body 1030. The body 1030 can receive the light emitting diode module 1020 and the diffusive cover 1010 can be disposed on the body 1030 to cover an upper side of the light emitting diode module 1020.

The body 1030 can have any shape so long as the body can supply electric power to the light emitting diode module 1020 while receiving and supporting the light emitting diode module 1020. For example, as shown in the drawing, the body 1030 can include a body case 1031, a power supply 1033, a power supply case 1035, and a power source connection section 1037.

The power supply 1033 is received in the power supply case 1035 to be electrically connected to the light emitting diode module 1020, and can include at least one IC chip. The IC chip can regulate, change or control electric power supplied to the light emitting diode module 1020. The power supply case 1035 can receive and support the power supply 1033. The power supply case 1035 having the power supply 1033 secured therein can be disposed within the body case 1031. The power source connection section 1037 is disposed at a lower end of the power supply case 1035 and coupled thereto. Accordingly, the power source connection section 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 can be disposed at an upper portion of the body case 1031 and electrically connected to the power supply 1033.

As the substrate 1023, any substrate capable of supporting the light emitting diode 1021 can be used without limitation. For example, the substrate 1023 can include a printed circuit board having interconnects formed thereon. The substrate 1023 can have a shape corresponding to a securing portion formed at the upper portion of the body case 1031 so as to be stably secured to the body case 1031. The light emitting diode 1021 can include at least one of the light emitting diodes and the light emitting devices according to the embodiments described above.

The diffusive cover 1010 is disposed on the light emitting diode 1021 and can be secured to the body case 1031 to cover the light emitting diode 1021. The diffusive cover 1010 can be formed of or include a light-transmitting material, and light orientation of the lighting apparatus can be adjusted through regulation of the shape and optical transmissivity of the diffusive cover 1010. As such, the diffusive cover 1010 can be modified in various shapes depending on usage and applications of the lighting apparatus.

Figure 42:
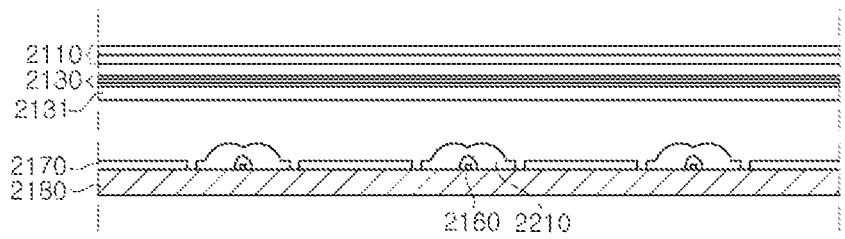
FIG. 42 shows a sectional view of an exemplary display device to which a light emitting device according to some embodiments of the present disclosure is applied.

FIG. 42 is a sectional view of an exemplary display device to which a light emitting device according to some embodiments of the present disclosure is applied.

The display device according to this embodiment includes a display panel 2110, a backlight unit supplying light to the display panel 2110, and a panel guide supporting a lower edge of the display panel 2110.

The display panel 2110 is not particularly limited and can be, for example, a liquid crystal panel including a liquid crystal layer. Gate driving PCBs can be further disposed at the edge of the display panel 2110 to supply driving signals to a gate line. Here, the gate driving PCBs 2112 and 2113 can be formed on a thin film transistor substrate instead of being formed on separate PCBs.

The backlight unit includes a light source module, which includes at least one substrate and a plurality of light emitting diodes 2160. The backlight unit can further include a bottom cover 2180, a reflective sheet 2170, a diffusive plate 2131, and optical sheets 2130.

The bottom cover 2180 can be open at an upper side thereof to receive the substrate, the light emitting diodes 2160, the reflective sheet 2170, the diffusive plate 2131, and the optical sheets 2130. In addition, the bottom cover 2180 can be coupled to the panel guide The substrate can be disposed under the reflective sheet 2170 to be surrounded by the reflective sheet 2170. However, it should be understood that other implementations are also possible. When a reflective material is coated onto a surface thereof, the substrate can be disposed on the reflective sheet 2170. Further, in this embodiment, a plurality of substrates can be arranged parallel to one other. However, it should be understood that other implementations are also possible and the light source module can include a single substrate.

The light emitting diodes 2160 can include at least one of the light emitting diodes and the light emitting devices according to the embodiments described above. The light emitting diodes 2160 can be regularly arranged in a predetermined pattern on the substrate. In addition, a lens 2210 is disposed on each of the light emitting diodes 2160 to improve uniformity of light emitted from the plurality of light emitting diodes 2160.

The diffusive plate 2131 and the optical sheets 2130 are disposed on the light emitting devices 2160. Light emitted from the light emitting devices 2160 can be supplied in the form of sheet light to the display panel 2110 through the diffusive plate 2131 and the optical sheets 2130.

In this way, the light emitting diodes according to the embodiments of the present disclosure can be applied to direct type displays like the display according to this embodiment.

Figure 43:
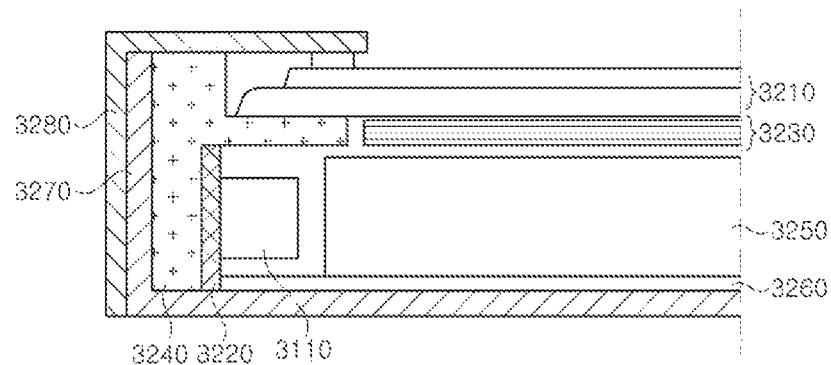
FIG. 43 shows a sectional view of an exemplary display device to which a light emitting device according to some embodiments of the present disclosure is applied.

FIG. 43 is a sectional view of an exemplary display device to which a light emitting device according to some embodiments of the present disclosure is applied.

The display device according to this embodiment includes a display panel on which an image is displayed, and a backlight unit disposed at a rear side of the display panel 3210 and emitting light thereto. Further, the display device includes a frame 240 supporting the display panel 3210 and receiving the backlight unit, and covers 3240 and 3280 surrounding the display panel 3210.

The display panel 3210 is not particularly limited and can be or include, for example, a liquid crystal panel including a liquid crystal layer. A gate driving PCB can be further disposed at an edge of the display panel 3210 to supply driving signals to a gate line. Here, the gate driving PCB can be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 can be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment can further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto can be used without limitation. For example, the substrate 3220 can include a printed circuit board.

The light emitting diodes 3110 can include at least one of the light emitting diodes and the light emitting devices according to the embodiments of the present disclosure described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the embodiments can be applied to edge type displays like the display according to this embodiment.

Figure 44:
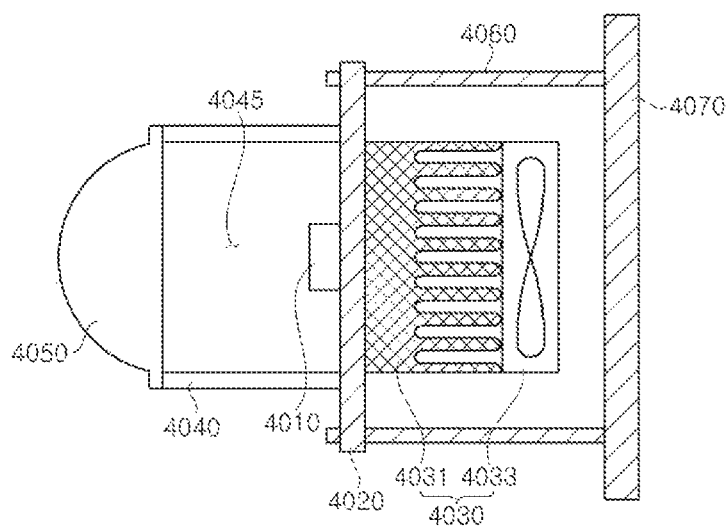
FIG. 44 shows a sectional view of an exemplary headlight to which a light emitting device according to some embodiments of the present disclosure is applied.

FIG. 44 is a sectional view of an exemplary headlight to which a light emitting device according to some embodiments of the present disclosure is applied.

Referring to FIG. 44, the headlight includes a lamp body 4070, a substrate 4020, a light emitting diode 4010, and a cover lens 4050. The headlight can further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode 4010 can be used without limitation. For example, the substrate 4020 can be or include a substrate having a conductive pattern, such as a printed circuit board. The light emitting diode 4010 is disposed on the substrate 4020 and can be supported and secured by the substrate 4020. In addition, the light emitting diode 4010 can be electrically connected to an external power source through the conductive pattern of the substrate 4020. Further, the light emitting diode 4010 can include at least one of the light emitting diodes and the light emitting devices according to the embodiments of the present disclosure described above.

The cover lens 4050 is disposed on a path of light emitted from the light emitting diode 4010. For example, as shown in the drawing, the cover lens 4050 can be spaced apart from the light emitting diode 4010 by the connection member 4040 and can be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 can be formed of or include a light reflective material or coated therewith. On the other hand, the heat dissipation unit 4030 can include heat dissipation fins 4031 and/or a heat dissipation fan 4033, and dissipates heat generated upon operation of the light emitting diode 4010.

In this way, the light emitting diodes according to the embodiments of the present disclosure can be applied to headlights, particularly, headlights for vehicles, like the display device according to this embodiment.

Although various exemplary embodiments of the present disclosure have been described hereinabove, the present disclosure is not limited to the respective exemplary embodiments and features described above. Modifications through combination and substitution of technical features described in the exemplary embodiments are included in the scope of the present disclosure, and various modifications and alterations can be made without departing from the spirit of the present disclosure as defined in the claims.

What is claimed is:

1. A light emitting device comprising:
a light emitting structure including a first conductive type semiconductor layer, a second conductive type semiconductor layer, and an active layer disposed between the first conductive type semiconductor layer and the second conductive type semiconductor layer;
first and second contact electrodes disposed over the light emitting structure, the first and second contact electrodes being in ohmic-contact with the first and second conductive type semiconductor layers, respectively;
an insulating layer insulating the first and second contact electrodes from each other and at least partially covering the first and second contact electrodes; and
first and second electrodes disposed over the light emitting structure, the first and second electrodes electrically connected to the first and second contact electrodes, respectively,
wherein each of the first and second electrodes has a boundary such that a portion of the boundary of the first electrode faces a portion of the boundary of the second electrode; and the portion of the boundary of the first electrode or the portion of the boundary of the second electrode comprises a curved shape along the boundary,
wherein the light emitting device further comprises an insulation support disposed under the first and second electrodes to provide coupling regions for the first electrode and the second electrode, and
wherein the insulation support has a portion with a curved shape corresponding to the curved shape of the at least one of the first electrode or the second electrode.

2. A light emitting device comprising:
a light emitting structure including a first conductive type semiconductor layer, a second conductive type semiconductor layer, and an active layer disposed between the first conductive type semiconductor layer and the second conductive type semiconductor layer;
first and second contact electrodes disposed over the light emitting structure, the first and second contact electrodes being in ohmic-contact with the first and second conductive type semiconductor layers, respectively;
an insulating layer insulating the first and second contact electrodes from each other and at least partially covering the first and second contact electrodes; and
first and second electrodes disposed over the light emitting structure, the first and second electrodes electrically connected to the first and second contact electrodes, respectively,
wherein each of the first and second electrodes has a boundary such that a portion of the boundary of the first electrode faces a portion of the boundary of the second electrode; and the portion of the boundary of the first electrode or the portion of the boundary of the second electrode comprises a curved shape along the boundary, and
wherein the curved shape includes a convex part having a width increasing in a protrusion direction.

3. The light emitting device of claim 2, wherein the insulating layer includes multiple layers.

4. A light emitting device comprising:
a light emitting structure including a first conductive type semiconductor layer, a second conductive type semiconductor layer, and an active layer disposed between the first conductive type semiconductor layer and the second conductive type semiconductor layer;
first and second contact electrodes disposed over the light emitting structure, the first and second contact electrodes being in ohmic-contact with the first and second conductive type semiconductor layers, respectively;
an insulating layer insulating the first and second contact electrodes from each other and at least partially covering the first and second contact electrodes; and
first and second electrodes disposed over the light emitting structure, the first and second electrodes electrically connected to the first and second contact electrodes, respectively,
wherein each of the first and second electrodes has a boundary such that a portion of the boundary of the first electrode faces a portion of the boundary of the second electrode; and the portion of the boundary of the first electrode or the portion of the boundary of the second electrode comprises a curved shape along the boundary, and
wherein the first electrode and the second electrode are spaced apart from each other by a distance ranging from 30 to 300 μm.

5. The light emitting device of claim 4, wherein a remaining portion of the boundary of the first electrode or the second electrode has a curvature pattern different from the curved shape.

6. The light emitting device of claim 5, wherein the curvature pattern has a reverse trapezodial sawtooth pattern, triangular sawtooth pattern, a trapezodial sawtooth pattern, or a rectangular sawtooth pattern.

7. The light emitting device of claim 4, further comprising an insulation support disposed under the first and second electrodes to provide coupling regions for the first electrode and the second electrode.

8. The light emitting device of claim 4, wherein the insulating layer includes multiple layers.

9. A light emitting device comprising:
a light emitting structure including a first conductive type semiconductor layer, a second conductive type semiconductor layer, and an active layer disposed between the first conductive type semiconductor layer and the second conductive type semiconductor layer;
first and second contact electrodes disposed over the light emitting structure, the first and second contact electrodes being in ohmic-contact with the first and second conductive type semiconductor layers, respectively;
an insulating layer insulating the first and second contact electrodes from each other and at least partially covering the first and second contact electrodes; and
first and second electrodes disposed over the light emitting structure, the first and second electrodes electrically connected to the first and second contact electrodes, respectively,
wherein each of the first and second electrodes has a boundary such that a portion of the boundary of the first electrode faces a portion of the boundary of the second electrode; and the portion of the boundary of the first electrode or the portion of the boundary of the second electrode comprises a curved shape along the boundary, and
wherein the insulating layer includes a distributed Bragg reflector.

10. The light emitting device of claim 9, wherein the insulating layer includes multiple layers.

11. A light emitting device comprising:
a first conductive type semiconductor layer;
a mesa structure formed over the first conductive type semiconductor layer and including an active layer and a second conductive type semiconductor layer;
a first contact electrode formed over the first conductive type semiconductor layer to make electrical contact with the first conductive type semiconductor layer;
a second contact electrode formed over the mesa structure to make electrical contact with the second conductive type semiconductor layer;
a first insulation layer formed to cover the first contact electrode and the second contact electrode and having openings that expose the first contact electrode and the second contact electrode;
a pad formed over the first insulation layer to electrically contact with the first contact electrode and the second electrode through the openings;
an insulation support formed over the pad;
a first electrode formed in the insulation support and having an edge with a first pattern and a second pattern that have different shapes from each other; and
a second electrode formed in the insulation support and adjacent to the first electrode, and
wherein the insulation support has an edge with a third pattern and a fourth pattern that correspond to the first pattern and the second pattern, respectively.

12. The light emitting device of claim 11, wherein the second electrode has an edge with a fifth pattern and sixth pattern that correspond to the first pattern and the second pattern, respectively.

13. The light emitting device of claim 11, wherein a portion of the edge of the first electrode that is adjacent to the second electrode comprises an arrangement of alternately arranged convex part and concave part.

14. The light emitting device of claim 13, wherein the convex part of the portion of the edge of the first electrode has a width increasing in a protrusion direction.

15. The light emitting device of claim 13, wherein the convex part of the portion of the edge of the first electrode occupies at least a quarter or more of an entire area of the first electrode and the second electrode.

16. The light emitting device of claim 11, wherein the first pattern comprises a sawtooth shape.

17. The light emitting device of claim 11, wherein the second pattern comprises a curved shape.

18. The light emitting device of claim 11, wherein a portion of the edge with the second pattern is disposed on the first insulation layer.

19. The light emitting device of claim 11, wherein the first insulation layer includes multiple layers.

20. The light emitting device of claim 11, wherein the first insulation layer includes a distributed Bragg reflector.

* * * * *